US008592861B2

(12) United States Patent
Akimoto et al.

(10) Patent No.: US 8,592,861 B2
(45) Date of Patent: Nov. 26, 2013

(54) DISPLAY DEVICE AND MANUFACTURING METHOD OF THE DISPLAY DEVICE

(75) Inventors: Kengo Akimoto, Kanagawa (JP); Hisashi Ohtani, Tochigi (JP); Misako Hirosue, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/537,408

(22) Filed: Jun. 29, 2012

(65) Prior Publication Data

US 2012/0261671 A1 Oct. 18, 2012

Related U.S. Application Data

(60) Continuation of application No. 13/010,362, filed on Jan. 20, 2011, now Pat. No. 8,212,284, and a division of application No. 11/395,221, filed on Apr. 3, 2006, now Pat. No. 7,888,702.

(30) Foreign Application Priority Data

Apr. 15, 2005 (JP) .................................. 2005-117723

(51) Int. Cl.
*H01L 29/66* (2006.01)
(52) U.S. Cl.
USPC ...... 257/140; 257/72; 257/E29.273; 257/443; 257/762; 438/149; 438/150; 438/151; 438/197; 438/694
(58) Field of Classification Search
USPC .......................................................... 257/140
See application file for complete search history.

(56) References Cited

U.S. PATENT DOCUMENTS

| 5,097,311 | A | 3/1992 | Iwase et al. |
| 5,200,846 | A | 4/1993 | Hiroki et al. |
| 5,218,464 | A | 6/1993 | Hiroki et al. |

(Continued)

FOREIGN PATENT DOCUMENTS

| CN | 1573846 | 2/2005 |
| CN | 1577028 | 2/2005 |

(Continued)

OTHER PUBLICATIONS

Chinese Office Action (Application No. 2006/10126389) dated May 8, 2009 with English translation.

(Continued)

*Primary Examiner* — N Drew Richards
*Assistant Examiner* — Ankush Singal
(74) *Attorney, Agent, or Firm* — Nixon Peabody LLP; Jeffrey L. Costellia

(57) ABSTRACT

It is an object of the present invention to provide a technique to manufacture a highly reliable display device at a low cost with high yield. A display device according to the present invention includes a semiconductor layer including an impurity region of one conductivity type; a gate insulating layer, a gate electrode layer, and a wiring layer in contact with the impurity region of one conductivity type, which are provided over the semiconductor layer; a conductive layer which is formed over the gate insulating layer and in contact with the wiring layer; a first electrode layer in contact with the conductive layer; an electroluminescent layer provided over the first electrode layer; and a second electrode layer, where the wiring layer is electrically connected to the first electrode layer with the conductive layer interposed therebetween.

21 Claims, 25 Drawing Sheets

(56) References Cited

U.S. PATENT DOCUMENTS

| | | | |
|---|---|---|---|
| 5,289,030 A | 2/1994 | Yamazaki et al. | |
| 5,308,998 A | 5/1994 | Yamazaki et al. | |
| 5,468,987 A | 11/1995 | Yamazaki et al. | |
| 5,474,945 A | 12/1995 | Yamazaki et al. | |
| 5,485,019 A | 1/1996 | Yamazaki et al. | |
| 5,495,121 A | 2/1996 | Yamazaki et al. | |
| 5,521,107 A | 5/1996 | Yamazaki et al. | |
| 5,532,956 A | 7/1996 | Watanabe | |
| 5,545,571 A | 8/1996 | Yamazaki et al. | |
| 5,640,067 A | 6/1997 | Yamauchi et al. | |
| 5,650,338 A | 7/1997 | Yamazaki et al. | |
| 5,716,871 A | 2/1998 | Yamazaki et al. | |
| 5,821,559 A | 10/1998 | Yamazaki et al. | |
| 5,849,611 A | 12/1998 | Yamazaki et al. | |
| 5,854,494 A | 12/1998 | Yamazaki et al. | |
| 5,879,969 A | 3/1999 | Yamazaki et al. | |
| 5,894,151 A | 4/1999 | Yamazaki et al. | |
| 5,897,328 A | 4/1999 | Yamauchi et al. | |
| 5,899,709 A | 5/1999 | Yamazaki et al. | |
| 5,913,112 A | 6/1999 | Yamazaki et al. | |
| 5,917,225 A | 6/1999 | Yamazaki et al. | |
| RE36,314 E | 9/1999 | Yamazaki et al. | |
| 5,962,870 A | 10/1999 | Yamazaki et al. | |
| 6,013,928 A | 1/2000 | Yamazaki et al. | |
| 6,028,333 A | 2/2000 | Yamazaki et al. | |
| 6,147,375 A | 11/2000 | Yamazaki et al. | |
| 6,160,272 A | 12/2000 | Arai et al. | |
| 6,323,528 B1 | 11/2001 | Yamazaki et al. | |
| 6,326,642 B1 | 12/2001 | Yamazaki et al. | |
| 6,331,723 B1 | 12/2001 | Yamazaki et al. | |
| 6,380,687 B1 | 4/2002 | Yamazaki | |
| 6,448,580 B1 | 9/2002 | Arai et al. | |
| 6,476,447 B1 | 11/2002 | Yamazaki et al. | |
| 6,555,969 B2 | 4/2003 | Yamazaki | |
| 6,566,711 B1 | 5/2003 | Yamazaki et al. | |
| 6,624,450 B1 | 9/2003 | Yamazaki et al. | |
| 6,639,244 B1 | 10/2003 | Yamazaki et al. | |
| 6,709,907 B1 | 3/2004 | Yamazaki et al. | |
| 6,770,978 B2 * | 8/2004 | Izumi et al. | 257/762 |
| 6,771,328 B2 * | 8/2004 | Park et al. | 349/42 |
| 6,778,231 B1 | 8/2004 | Yamazaki et al. | |
| 6,781,162 B2 * | 8/2004 | Yamazaki et al. | 257/184 |
| 6,803,600 B2 | 10/2004 | Yamazaki et al. | |
| 6,822,261 B2 | 11/2004 | Yamazaki et al. | |
| 6,853,083 B1 | 2/2005 | Yamauchi et al. | |
| 6,943,371 B2 | 9/2005 | Chen et al. | |
| 6,953,713 B2 | 10/2005 | Yamazaki et al. | |
| 6,977,392 B2 | 12/2005 | Yamazaki et al. | |
| 6,992,435 B2 | 1/2006 | Yamauchi et al. | |
| 6,995,050 B2 | 2/2006 | Chen et al. | |
| 7,038,303 B2 | 5/2006 | Muranaka | |
| 7,112,462 B2 | 9/2006 | Arai et al. | |
| 7,148,542 B2 | 12/2006 | Yamazaki et al. | |
| 7,169,710 B2 | 1/2007 | Yamazaki et al. | |
| 7,211,826 B2 | 5/2007 | Park et al | |
| 7,223,996 B2 | 5/2007 | Yamazaki et al. | |
| 7,224,118 B2 | 5/2007 | Yamazaki et al. | |
| 7,226,819 B2 * | 6/2007 | Maekawa et al. | 438/149 |
| 7,256,422 B2 | 8/2007 | Yamazaki | |
| 7,259,429 B2 * | 8/2007 | Yamazaki | 257/356 |
| 7,271,535 B2 | 9/2007 | Kobayashi | |
| 7,411,344 B2 | 8/2008 | Yamazaki et al. | |
| 7,420,628 B1 | 9/2008 | Hiroki et al. | |
| 7,456,427 B2 | 11/2008 | Yamazaki et al. | |
| 7,479,939 B1 | 1/2009 | Hiroki et al. | |
| 7,507,609 B2 * | 3/2009 | Koo et al. | 438/149 |
| 7,511,709 B2 | 3/2009 | Koyama et al. | |
| 7,569,408 B1 | 8/2009 | Yamazaki et al. | |
| 7,622,863 B2 | 11/2009 | Seo et al. | |
| 7,646,441 B2 | 1/2010 | Hiroki et al. | |
| 7,649,227 B2 | 1/2010 | Yamazaki et al. | |
| 7,671,827 B2 | 3/2010 | Hiroki et al. | |
| 7,691,685 B2 * | 4/2010 | Maekawa et al. | 438/149 |
| 7,701,523 B2 | 4/2010 | Hiroki et al. | |
| 7,821,011 B2 | 10/2010 | Yamazaki et al. | |
| 7,884,369 B2 | 2/2011 | Yamazaki et al. | |
| 7,948,569 B2 | 5/2011 | Hiroki et al. | |
| 8,377,762 B2 * | 2/2013 | Eguchi et al. | 438/155 |
| 2001/0010566 A1 | 8/2001 | Izumi et al. | |
| 2001/0017683 A1 | 8/2001 | Hiroki et al. | |
| 2001/0055841 A1 | 12/2001 | Yamazaki et al. | |
| 2002/0017687 A1 | 2/2002 | Yamazaki et al. | |
| 2002/0190329 A1 | 12/2002 | Arai et al. | |
| 2003/0054653 A1 * | 3/2003 | Yamazaki et al. | 438/694 |
| 2003/0082874 A1 | 5/2003 | Lane et al. | |
| 2003/0116765 A1 | 6/2003 | Koo et al. | |
| 2003/0137325 A1 * | 7/2003 | Yamazaki et al. | 327/80 |
| 2003/0148561 A1 | 8/2003 | Nakajima | |
| 2004/0056591 A1 | 3/2004 | Koo et al. | |
| 2004/0160167 A1 * | 8/2004 | Arai et al. | 313/500 |
| 2004/0178724 A1 | 9/2004 | Karasawa et al. | |
| 2004/0183083 A1 | 9/2004 | Koo | |
| 2004/0185604 A1 | 9/2004 | Park et al. | |
| 2004/0232424 A1 | 11/2004 | Hotta et al. | |
| 2004/0246432 A1 * | 12/2004 | Tsuchiya et al. | 349/187 |
| 2005/0007329 A1 | 1/2005 | Hiroki et al. | |
| 2005/0012105 A1 * | 1/2005 | Yamazaki et al. | 257/79 |
| 2005/0012887 A1 | 1/2005 | Koyama et al. | |
| 2005/0014319 A1 * | 1/2005 | Yamazaki et al. | 438/197 |
| 2005/0072977 A1 | 4/2005 | Saito et al. | |
| 2005/0073247 A1 | 4/2005 | Yamazaki et al. | |
| 2005/0121677 A1 | 6/2005 | Kim et al. | |
| 2005/0140871 A1 * | 6/2005 | Hwang | 349/114 |
| 2005/0163938 A1 * | 7/2005 | Yamazaki et al. | 427/554 |
| 2005/0164423 A1 * | 7/2005 | Maekawa et al. | 438/66 |
| 2005/0181610 A1 | 8/2005 | Sasagawa et al. | |
| 2006/0027804 A1 * | 2/2006 | Yamazaki et al. | 257/59 |
| 2006/0027830 A1 | 2/2006 | Kumaki et al. | |
| 2006/0043510 A1 | 3/2006 | Yamazaki et al. | |
| 2006/0060860 A1 | 3/2006 | Yamazaki et al. | |
| 2006/0091397 A1 | 5/2006 | Akimoto | |
| 2006/0118790 A1 | 6/2006 | Park et al. | |
| 2006/0214575 A1 | 9/2006 | Kajiyama et al. | |
| 2007/0077848 A1 * | 4/2007 | Koo et al. | 445/24 |
| 2007/0090358 A1 * | 4/2007 | Kanno et al. | 257/59 |
| 2007/0114542 A1 | 5/2007 | Yamazaki et al. | |
| 2007/0139571 A1 * | 6/2007 | Kimura | 349/43 |
| 2007/0141236 A1 | 6/2007 | Takasu et al. | |
| 2007/0212828 A1 * | 9/2007 | Yamazaki et al. | 438/158 |
| 2007/0218674 A1 * | 9/2007 | Maekawa et al. | 438/597 |
| 2007/0252266 A1 | 11/2007 | Koo et al. | |
| 2008/0012076 A1 * | 1/2008 | Yamazaki et al. | 257/347 |
| 2008/0164474 A1 | 7/2008 | Yamazaki et al. | |
| 2009/0160753 A1 | 6/2009 | Koyama et al. | |

FOREIGN PATENT DOCUMENTS

| | | |
|---|---|---|
| EP | 0 499 979 A2 | 8/1992 |
| EP | 0 502 749 A2 | 9/1992 |
| JP | 06-053509 | 2/1994 |
| JP | 06-244200 | 9/1994 |
| JP | 10-254383 | 9/1998 |
| JP | 2002-057162 | 2/2002 |
| JP | 2002-134756 | 5/2002 |
| JP | 2002-182244 | 6/2002 |
| JP | 2002-359246 | 12/2002 |
| JP | 2004-363540 | 12/2004 |
| JP | 2006-250985 | 9/2006 |

OTHER PUBLICATIONS

Chinese Office Action for Chinese Patent Application No. 200610126389.X; CN8651, dated Nov. 7, 2008 with English Translation.

Chinese Office Action (Application No. 200910225062.1; CN08651D1) Dated May 5, 2011.

* cited by examiner

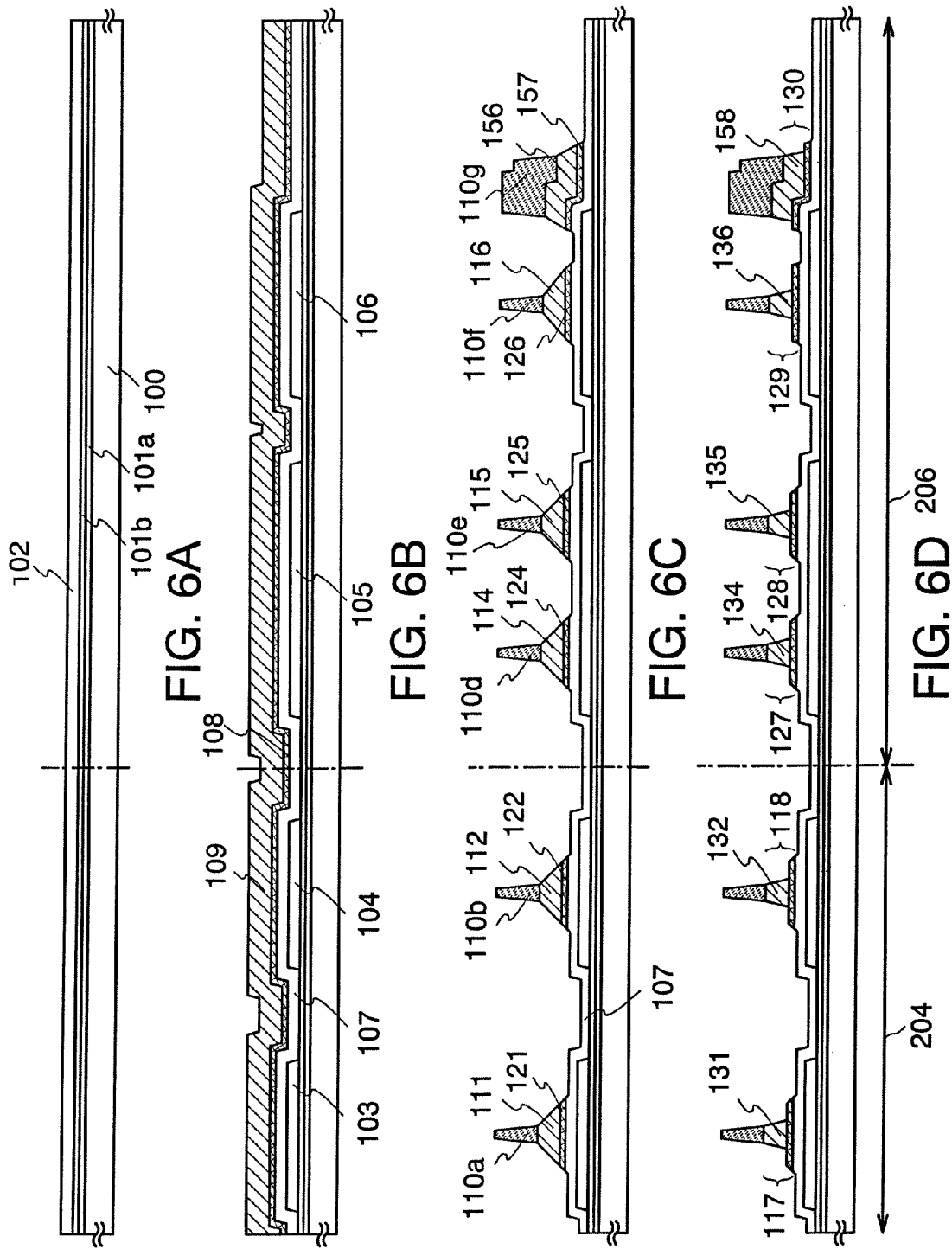

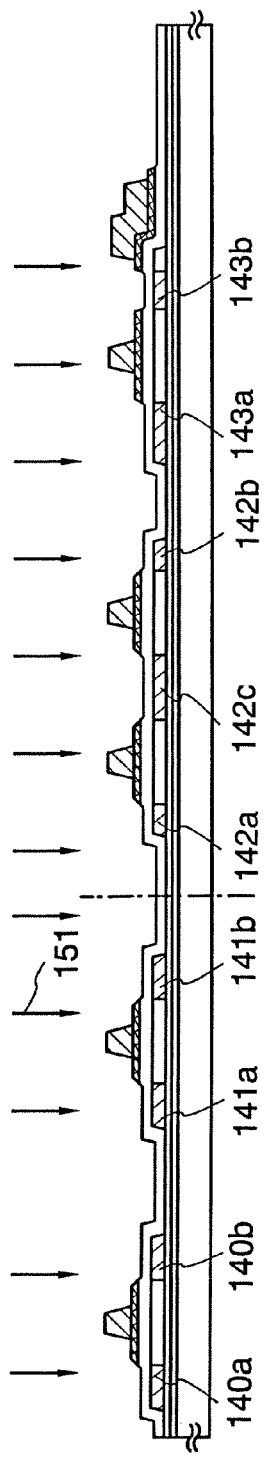
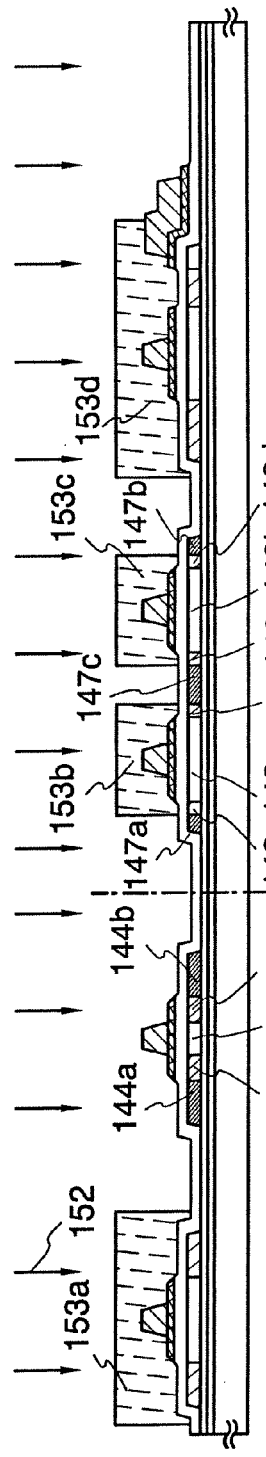
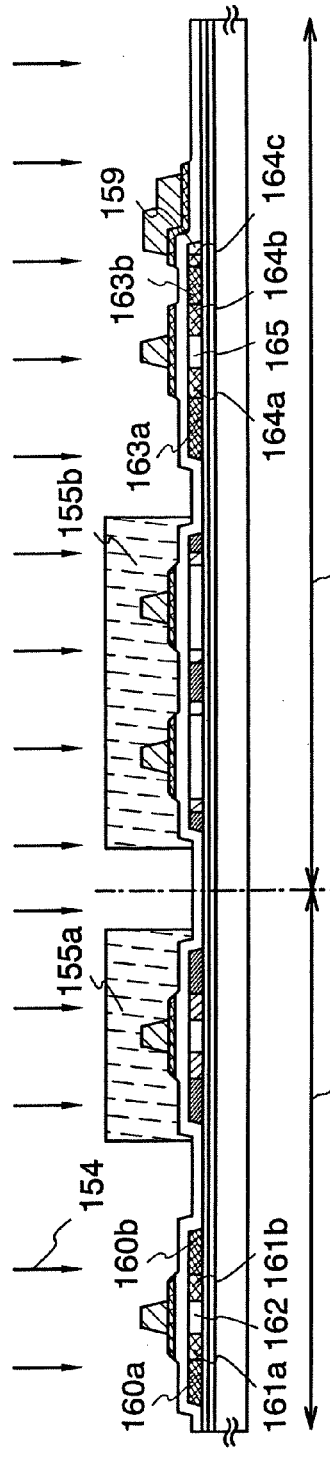

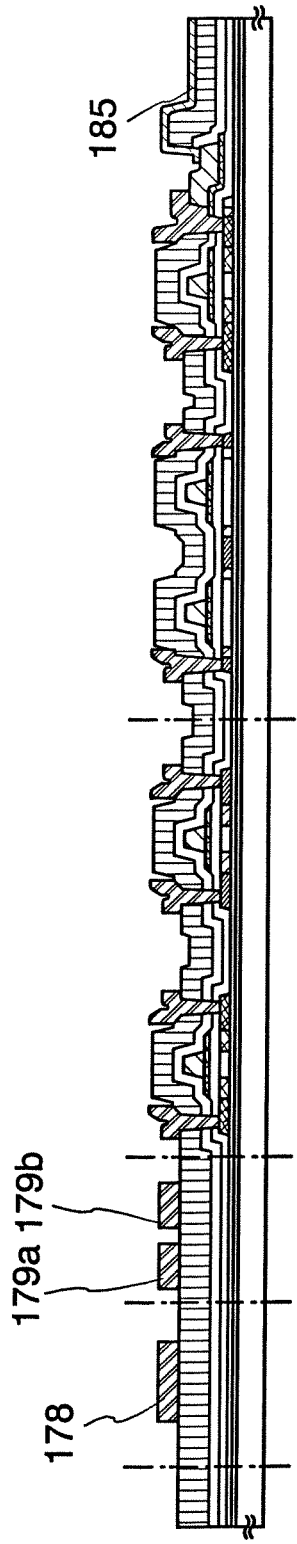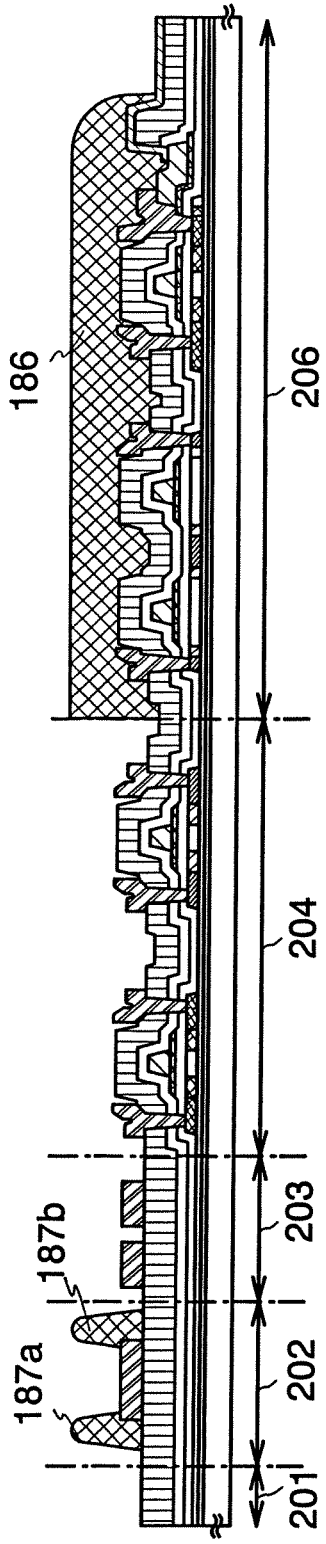

DISPLAY DEVICE AND MANUFACTURING METHOD OF THE DISPLAY DEVICE

BACKGROUND OF THE INVENTION

1. Field of the Invention

The present invention relates to a display device and a method for manufacturing the display device.

2. Description of the Related Art

In recent years, a liquid crystal display device and an electro luminescence display device, in which a thin film transistor (hereinafter also referred to as a TFT) is integrated over a glass substrate, have been developed. In each of these display devices, a thin film transistor is formed over a glass substrate by using a technique for forming a thin film, and a liquid crystal element or a light-emitting element (an electro luminescence element, hereinafter also referred to as an EL element) is formed as a display element over various circuits composed of the thin film transistors.

A TFT and a display element are electrically connected to each other by stacking a pixel electrode of the display element and a wiring connected to a source region or a drain region of the TFT (see, for example, Japanese Patent Application Laid-Open No.: 2002-57162).

SUMMARY OF THE INVENTION

It is an object of the present invention to provide a technique for manufacturing a display device having high reliability and excellent electric characteristics with high yield without complicating steps and apparatuses.

In a display device of the present invention, a wiring layer (a source electrode layer or a drain electrode layer) that is in contact with an impurity region of one conductivity type of a thin film transistor (a source region or a drain region) and a first electrode layer of a light-emitting element are electrically connected to each other with a conductive layer, which is formed by using the same material and through the same step as a gate electrode layer, interposed therebetween. The wiring layer (the source electrode layer or the drain electrode layer) is connected to the impurity region of one conductivity type of a semiconductor layer (the source region or the drain region) and the conductive layer in an opening formed in an insulating layer which is provided over the semiconductor layer and the gate electrode layer. Since the first electrode layer formed over the insulating layer is also in contact with the conductive layer in the opening, the wiring layer (the source electrode layer or the drain electrode layer) and the first electrode layer are electrically connected to each other in the opening with the conductive layer interposed therebetween.

In addition, the first electrode layer of a light-emitting element has a light-transmitting property, and is formed by using indium oxide containing tungsten oxide, indium zinc oxide containing tungsten oxide, indium oxide containing titanium oxide, or indium tin oxide containing titanium oxide. Accordingly, in the display device of the present invention, light from the light-emitting element passes through the first electrode layer and is emitted outside.

Display devices which can use the present invention includes a light-emitting display device, in which a light-emitting element and a TFT are connected, where the light-emitting element includes an organic/inorganic material that shows light-emission called electroluminescence or a medium containing a mixture of the organic/inorganic material and an inorganic material interposed between electrodes.

According to one aspect of the present invention, a display device includes a semiconductor layer including an impurity region of one conductivity type; a gate insulating layer, a gate electrode layer, and a wiring layer in contact with the impurity region of one conductivity type, which are provided over the semiconductor layer; a conductive layer which is provided over the gate insulating layer and in contact with the wiring layer; a first electrode layer in contact with the conductive layer; an electroluminescent layer provided over the first electrode layer; and a second electrode layer, where the wiring layer is electrically connected to the first electrode layer with the conductive layer interposed therebetween.

According to another aspect of the present invention, a display device includes a semiconductor layer including an impurity region of one conductivity type; a gate insulating layer and a gate electrode layer which are provided over the semiconductor layer; an insulating layer having an opening over the semiconductor layer, the gate insulating layer and the gate electrode layer; a wiring layer in contact with the impurity region of one conductivity type; a conductive layer which is provided over the gate insulating layer and in contact with the wiring layer; a first electrode layer in contact with the conductive layer; an electroluminescent layer provided over the first electrode layer; and a second electrode layer; where the wiring layer is electrically connected to the first electrode layer in the opening with the conductive layer interposed therebetween.

According to another aspect of the present invention, a display device includes a semiconductor layer including an impurity region of one conductivity type; a gate insulating layer, a gate electrode layer, and a wiring layer in contact with the impurity region of one conductivity type which are provided over the semiconductor layer; a conductive layer which is provided over the semiconductor layer and the gate insulating layer and in contact with the wiring layer; a first electrode layer in contact with the conductive layer; an electroluminescent layer provided over the first electrode layer; and a second electrode layer, where the wiring layer is electrically connected to the first electrode layer with the conductive layer interposed therebetween.

According to another aspect of the present invention, a display device includes a semiconductor layer including an impurity region of one conductivity type; a gate insulating layer and a gate electrode layer which are provided over the semiconductor layer; an insulating layer having an opening over the semiconductor layer, the gate insulating layer and the gate electrode layer; a wiring layer in contact with the impurity region of one conductivity type; a conductive layer which is provided over the semiconductor layer an the gate insulating layer and in contact with the wiring layer; a first electrode layer in contact with the conductive layer; an electroluminescent layer provided over the first electrode layer; and a second electrode layer, where the wiring layer is electrically connected to the first electrode layer in the opening with the conductive layer interposed therebetween.

According to one aspect of the present invention, a method for manufacturing a display device includes the steps of forming a semiconductor layer; forming a gate insulating layer over the semiconductor layer; forming a gate electrode layer and a conductive layer over the gate insulating layer; forming an impurity region of one conductivity type in the semiconductor layer; forming a wiring layer in contact with the impurity region of one conductivity type and the conductive layer; forming a first electrode layer in contact with the conductive layer; forming an electroluminescent layer over the first electrode layer; and forming a second electrode layer over the electroluminescent layer; where the wiring layer is electrically connected to the first electrode layer with the conductive layer interposed therebetween.

According to another aspect of the present invention, a method for manufacturing a display device includes the steps of forming a semiconductor layer; forming a gate insulating layer over the semiconductor layer; forming a gate electrode layer and a conductive layer over the gate insulating layer; forming an impurity region of one conductivity type in the semiconductor layer; forming an insulating layer over the semiconductor layer, the gate insulating layer, and the gate electrode layer; forming an opening that reaches the impurity region of one conductivity type and the conductive layer in the insulating layer; forming a wiring layer in contact with the impurity region of one conductivity type and the conductive layer in the opening; forming a first electrode layer in contact with the conductive layer in the opening; forming an electroluminescent layer over the first electrode layer; and forming a second electrode layer over the electroluminescent layer; where the wiring layer is electrically connected to the first electrode layer with the conductive layer interposed therebetween.

According to another aspect of the present invention, a method for manufacturing a display device includes the steps of forming a semiconductor layer; forming a gate insulating layer over the semiconductor layer; forming a conductive film over the gate insulating layer; processing the conductive film to form a gate electrode layer and a conductive layer; forming an impurity region of one conductivity type in the semiconductor layer; forming a wiring layer in contact with the impurity region of one conductivity type and the conductive layer; forming a first electrode layer in contact with the conductive layer; forming an electroluminescent layer over the first electrode layer; and forming a second electrode layer over the electroluminescent layer; where the wiring layer is electrically connected to the first electrode layer with the conductive layer interposed therebetween.

According to another aspect of the present invention, a method for manufacturing a display device includes the steps of forming a semiconductor layer; forming a gate insulating layer over the semiconductor layer; forming a conductive film over the gate insulating layer; processing the conductive film to form a gate electrode layer and a conductive layer; forming an impurity region of one conductivity type in the semiconductor layer; forming an insulating layer over the semiconductor layer, the gate insulating layer, and the gate electrode layer; forming an opening that reaches the impurity region of one conductivity type and the conductive layer in the insulating layer; forming a wiring layer in contact with the impurity region of one conductivity type and the conductive layer in the opening; forming a first electrode layer in contact with the conductive layer in the opening; forming an electroluminescent layer over the first electrode layer; and forming a second electrode layer over the electroluminescent layer; where the wiring layer is electrically connected to the first electrode layer with the conductive layer interposed therebetween.

By using the present invention, a highly reliable display device can be manufactured. Therefore, a high-definition and high-quality display device can be manufactured with high yield.

These and other objects, features and advantages of the present invention will become more apparent upon reading of the following detailed description along with the accompanied drawings.

BRIEF DESCRIPTION OF THE DRAWINGS

In the accompanying drawings:
FIGS. 6A to 6D are views showing a manufacturing method of a display device according to the present invention;
FIGS. 7A to 7C are views showing a manufacturing method of the display device according to the present invention;
FIGS. 9A and 9B are views showing a manufacturing method of the display device according to the present invention.

DETAILED DESCRIPTION OF THE INVENTION

Figure 1:
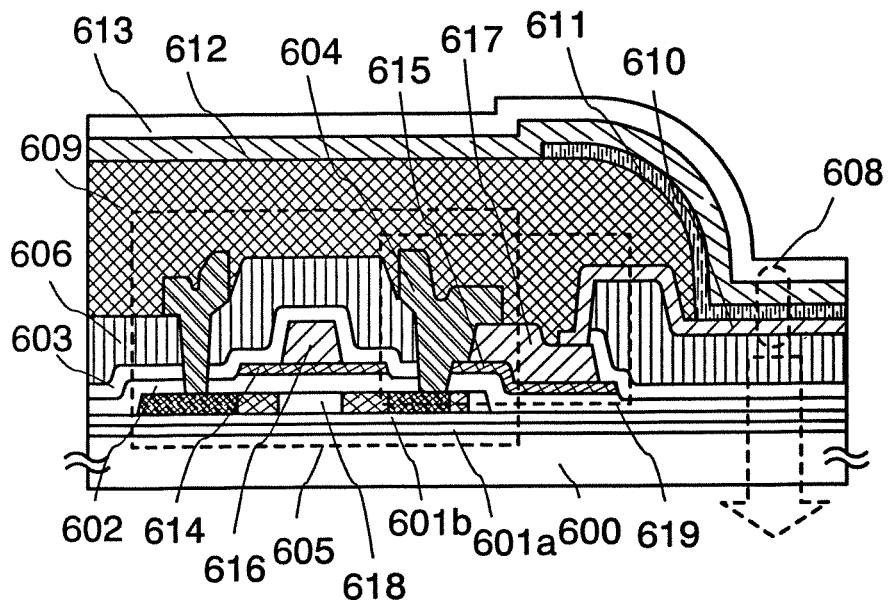
FIG. 1 is a view showing a display device according to the present invention.

Embodiment Modes of the present invention will be described in detail with reference to the accompanying drawings. It is to be noted that the present invention is not limited to a description that will be described below, and it is to be easily understood by those skilled in the art that modes and details thereof can be modified in various ways without departing from the spirit and the scope of the invention. Therefore, the present invention should not be interpreted as being limited to the description of the embodiment modes to be given below. Further, in the structure of the present invention, the same reference numerals are used for the same portions or portions having the same functions in different drawings, and an explanation thereof will not be repeated.

Embodiment Mode 1

A display device in the present embodiment mode will be described with reference to FIGS. 1 and 2.

As shown in FIG. 1, a display device in the present embodiment mode is a bottom-emission display device in which light is extracted through a substrate having a thin film transistor.

In the display device in FIG. 1, over a substrate 600, base films 601a and 601b, a thin film transistor 605, a gate insulating layer 602, insulating layers 603 and 606, an insulating layer 609 functioning as a partition wall, a first electrode layer 610, an electroluminescent layer 611, a second electrode layer 612, and a protective film 613 are provided. The thin film transistor 605 includes a semiconductor layer 618, which has impurity regions of one conductivity type functioning as a source region and a drain region, the gate insulating layer 602, a first gate electrode layer 614 and a second gate electrode layer 616 which form a stacked structure of two layers, and a source electrode layer and a drain electrode layer 604, which are wiring layers. The source electrode layer or the drain electrode layer 604, which is a wiring layer, is in contact with and electrically connected to the impurity region of one conductivity type of the semiconductor layer 618, a first conductive layer 615, and a second conductive layer 617. The first conductive layer 615 and the second conductive layer 617 are manufactured by using the same material and through the same step as the first gate electrode layer 614 and the second gate electrode layer 616, respectively. Since the second conductive layer 617 is in contact with and electrically connected to the first electrode layer 610, the semiconductor layer 618 and the source electrode layer or the drain electrode layer 604 are electrically connected to the first electrode layer 610 with the first conductive layer 615 and the second conductive layer 617 interposed therebetween. In addition, in the display device of FIG. 1, the impurity region of the semiconductor layer 618, the source electrode layer or the drain electrode layer 604, the first conductive layer 615, the second conductive layer 617, and the first electrode layer 610 are electrically connected to each other in an opening 619 provided in the gate insulating layer 602, and the insulating layers 603 and 606.

In the display device of the present embodiment mode, a reflective electrode layer having reflectivity is used for the second electrode layer 612, and light emitted from a light-emitting element 608 is reflected. Therefore, light is emitted from a side of the first electrode layer 610 having a light-transmitting property in a direction indicated by an arrow. When an electrode layer having a light-transmitting property is used for the second electrode layer 612, light emitted from the light-emitting element 608 passes through both of the first electrode layer 610 and the second electrode layer 612 and is emitted from both sides. In the present specification, a light-transmitting property means a property to transmit light at least of a wavelength region of visible light.

In the present invention, the first electrode layer 610 that is a light-transmitting electrode layer may be specifically formed by using a transparent conductive film formed of a light-transmitting conductive material, and indium oxide containing tungsten oxide, indium zinc oxide containing tungsten oxide, indium oxide containing titanium oxide, indium tin oxide containing titanium oxide, and the like can be used. Indium tin oxide (ITO), indium zinc oxide (IZO), indium tin oxide doped with silicon oxide (ITSO), and the like can also be used as a matter of course.

An example of a composition ratio in each light-transmitting conductive material is described. In indium oxide containing tungsten oxide, the composition ratio of tungsten oxide may be 1.0 wt % and indium oxide may be 99.0 wt %. In indium zinc oxide containing tungsten oxide, tungsten oxide may be 1.0 wt %, zinc oxide may be 0.5 wt %, and indium oxide may be 98.5 wt %. In indium oxide containing titanium oxide, titanium oxide may be 1.0 to 5.0 wt % and indium oxide may be 99.0 to 95.0 wt %. In indium tin oxide (ITO), tin oxide may be 10.0 wt % and indium oxide may be 90.0 wt %. In indium zinc oxide (IZO), zinc oxide may be 10.7 wt % and indium oxide may be 89.3 wt %. Further, in indium tin oxide containing titanium oxide, titanium oxide may be 5.0 wt %, tin oxide may be 10.0 wt %, and indium oxide may be 85.0 wt %. The composition ratios as described above are just examples, and a composition ratio may be set appropriately.

In addition, even in a case of a non-light-transmitting material such as a metal film is used, when the thickness is made thin (preferably, about 5 to 30 nm) so as to be able to transmit light, light can be emitted from the first electrode layer 610. As a metal thin film that can be used for the first electrode layer 610, a conductive film formed of titanium, tungsten, nickel, gold, platinum, silver, aluminum, magnesium, calcium, lithium, or an alloy thereof can be given.

The first electrode layer 610 can be formed by an evaporation method, a sputtering method, a CVD method, a printing method, a droplet-discharge method, or the like. In the present embodiment mode, the first electrode layer 610 is manufactured by using indium zinc oxide containing tungsten oxide by sputtering. In the present embodiment mode, indium zinc oxide containing tungsten oxide doped with less than 1.7 wt % of zinc oxide is used as a target, and Argon (Ar) and oxygen ($O_2$) doped with water ($H_2O$) are used as a deposition gas. Either dry etching, or wet etching may be used for processing a shape of the first electrode layer 610, and in the present embodiment mode, an indium zinc oxide film containing tungsten oxide that is formed is processed into a desired shape by etching using organic weak acid. In addition, the first electrode layer 610 also functions as an etching stopper when the insulating layer 609 functioning as a partition wall is formed.

The source electrode layer and the drain electrode layer 604 can be formed by depositing a conductive film by a PVD method, a CVD method, an evaporation method, or the like, and then, etching the conductive film into desired shapes. Further, a conductive layer can be selectively formed in a predetermined position by a droplet-discharge method, a printing method, an electroplating method, or the like. Moreover, a reflow method or a damascene method may also be used. As a material for the source electrode layer and the drain electrode layer 604, a metal such as Ag, Au, Cu, Ni, Pt, Pd, Ir, Rh, W, Al, Ta, Mo, Cd, Zn, Fe, Ti, Zr, or Ba, or an alloy of these metals or the metal and Si or Ge, or nitride of the metal can be used. A stacked, structure thereof may also be employed. In the present embodiment mode, titanium (Ti) is formed to be 100 nm thick, an alloy of aluminum and silicon (Al—Si) is formed to be 700 nm thick, and titanium (Ti) is formed to be 200 nm thick, and then, the stacked film is processed into a desired shape. Accordingly, the source electrode layer or the drain electrode layer 604 in the present embodiment mode has a stacked structure of a titanium film, an alloy film of aluminum and silicon, and a titanium film in this order.

The base films 601a and 601b, the gate insulating layer 602, the insulating layers 603, 606, and 609, and the protective film 613 can be formed by using a material selected from silicon oxide, silicone nitride, silicon oxynitride, silicon nitride oxide, aluminum nitride (AlN), aluminum oxynitride (AlON), aluminum nitride oxide (AlNO) containing more nitrogen than oxygen, aluminium oxide, diamond like carbon (DLC), nitrogen-containing carbon (CN) film, PSG (phosphorus glass), BPSG (boron phosphorus glass), an alumina film, polysilazane, and other substance containing an inorganic insulating material. In addition, a siloxane resin may also be used. The siloxane resin is a resin including a Si—O—Si bond. Siloxane has a skeleton structure formed of a bond of silicon (Si) and oxygen (O). As a substituent, an organic group containing at least hydrogen (for example, an alkyl group or aromatic hydrocarbon) or a fluoro group may be used. Further, a photosensitive or non-photosensitive organic insulating material such as polyimide, acrylic, polyamide, polyimide amide, resist, benzocyclobutene, or a Low-k material having a low dielectric constant may also be used. As a manufacturing method, an evaporation method, a sputtering method, a CVD method, a coating method, a dip method, a printing method (screen printing or offset printing), a droplet-discharge method, or the like can be used. In a case of a droplet-discharge method, a material solution can be saved.

In the present embodiment mode, the substrate 600 is a glass substrate, the base film 601a is a silicon nitride oxide film, the base film 601b is a silicon oxynitride film, the gate insulating layer 602 is a silicon oxynitride film, the insulating layer 603 is a silicon nitride oxide film, the insulating layer 606 is a silicon oxide film, the insulating layer 609 functioning as a partition wall is polyimide, and the protective film 613 is a silicon nitride oxide film.

In the display device of the present invention, the source electrode layer or the drain electrode layer 604 of the thin film transistor and the first electrode layer 610 of the light-emitting element, which is a pixel electrode layer, are not directly stacked to be electrically connected, but the source electrode layer or the drain electrode layer 604 and the first electrode layer 610 are electrically connected to each other with the first conductive layer 615 and the second conductive layer 617 interposed therebetween. In such a structure, materials by which the source electrode layer or the drain electrode layer and the first electrode layer are not easily electrically connected to each other when the both electrode layers are directly in contact with each other (conductivity in the both electrode layers is low and an electric contact is not easily made) or materials by which deterioration such as electric erosion is caused when the both electrode layers are in contact with each other can also be used since a conductive layer is interposed between the both electrode layers. Therefore, a range of a choice for materials that can be used for the source electrode layer or the drain electrode layer and the first electrode layer can be wide.

Resistance of the source electrode layer or the drain electrode layer that is used as a wiring is required to be lowered so that an electric signal or power is supplied. Further, the first electrode layer that is used as a pixel electrode is required to have a light-transmitting property so that light emitted from the light-emitting element is transmitted. The source electrode layer or the drain electrode layer and the first electrode layer are each required to have the property as described above. In the structure of the present invention, a problem, which arises when the source electrode layer or the drain electrode layer and the first electrode layer are stacked, is not required to be concerned, and thus, a material having a property that is required for each of the source electrode layer or the drain electrode layer and the first electrode layer can be arbitrarily selected.

In addition, since the source electrode layer or the drain electrode layer 604 and the first electrode layer 610 are electrically connected to each other with the second conductive layer 617 interposed therebetween, disconnection is not concerned and contact resistance is lowered. As a result, contact resistance of the source electrode layer or the drain electrode layer 604 and the first electrode layer 610 is also lowered. In addition to the above advantageous effect, the first conductive layer 615 and the second conductive layer 617, which have a function of electrically connecting the source electrode layer or the drain electrode layer that is electrically connected to the source region or the drain region of the semiconductor layer and the first electrode layer, are formed by using the same material and through the same step as the first gate electrode layer 614 and the second gate electrode layer 616, respectively. Further, an opening that reaches the first conductive layer 615 and the second conductive layer 617 is formed in the insulating layer at the same time as a step of forming an opening that reaches the source region or the drain region of the semiconductor layer, and thus, manufacturing steps are not increased. A layout of a structure of a display device can be more freely designed without complicated steps. Therefore, a more highly-reliable display device can be manufactured.

Figure 18A:
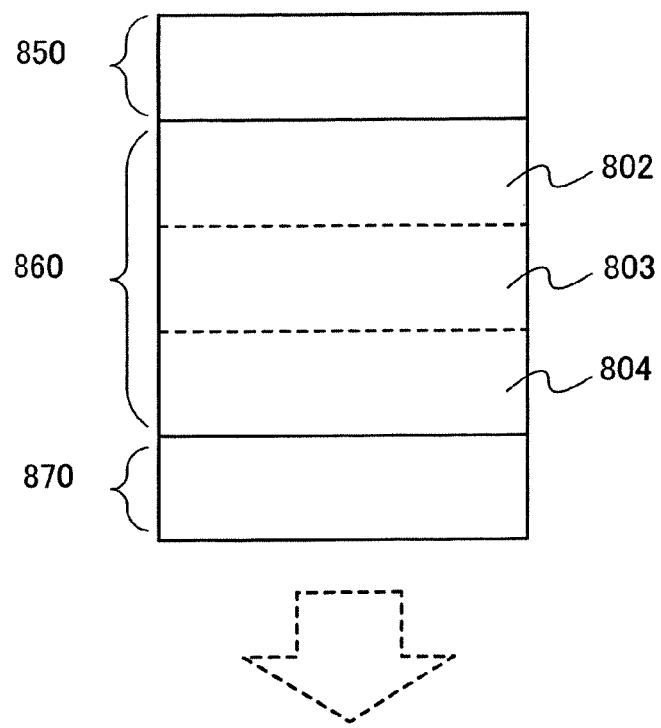
FIGS. 18A and 18B are views showing structures of light-emitting elements which can be applied to the present invention.
Figure 18B:
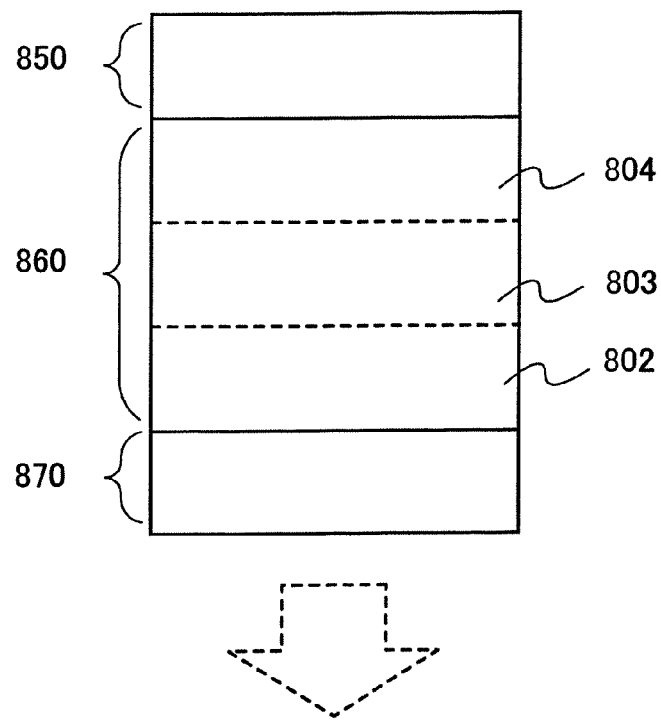

A structure of the light-emitting element 608 which can be employed in the present embodiment mode will be described in detail with reference to FIGS. 18A and 18B. In FIGS. 18A and 18B, a first electrode layer 870 corresponds to the first electrode layer 610 in FIG. 1, an electroluminescent layer 860 corresponds to the electroluminescent layer 611 in FIG. 1, and a second electrode layer 850 corresponds to the second electrode layer 612. in FIG. 1

FIGS. 18A and 18B show element structures of the light-emitting elements, in which the electroluminescent layer 860 formed by mixing an organic compound and an inorganic compound is interposed between the first electrode layer 870 and the second electrode layer 850. As shown in the drawings, the electroluminescent layer 860 is formed of a first layer 804, a second layer 803, and a third layer 802, and in particular, the first layer 804 and the third layer 802 have remarkable features.

The first layer 804 is a layer which has a function of transporting holes to the second layer 803, and includes at least a first organic compound and a first inorganic compound having an electron-accepting property with respect to the first organic compound. What is important is that the first organic compound and the first inorganic compound are not only simply mixed, but the first inorganic compound has an electron-accepting property with respect to the first organic compound. This structure generates a lot of hole-carriers in the first organic compound, which originally has almost no inherent carriers, and a highly excellent hole-injecting property and hole-transporting property can be obtained.

Therefore, as for the first layer 804, not only advantageous effect that is considered to be obtained by mixing an inorganic compound (such as improvement in heat resistance) but also excellent conductivity (in particular, a hole-injecting property and a hole-transporting property in the first layer 804) can be obtained. This excellent conductivity is advantageous effect that cannot be obtained in a conventional hole-transporting layer in which an organic compound and an inorganic compound that do not electronically interact with each other are simply mixed. This advantageous effect can make a drive voltage lower than conventionally. In addition, since the first layer 804 can be made thicker without causing increase in a drive voltage, short circuit of the element due to a dust and the like can be suppressed.

It is preferable to use a hole-transporting organic compound as the first organic compound since hole-carriers are generated in the first organic compound as described above. Examples of the hole-transporting organic compound include, but are not limited to, phthalocyanine (abbreviation: $H_2Pc$), copper phthalocyanine (abbreviation: CuPc), vanadyl phthalocyanine (abbreviation: VOPc), 4,4',4"-tris(N,N-diphenylamino)triphenylamine (abbreviation: TDATA), 4,4', 4"-tris[N-(3-methylphenyl)-N-phenylamino]triphenylamine (abbreviation: MTDATA), 1,3,5-tris[N,N-di(m-tolyl)amino] benzene (abbreviation: m-MTDAB), N,N'-diphenyl-N,N'-bis (3-methylphenyl)-1,1'-biphenyl-4,4'-diamine (abbreviation: TPD), 4,4'-bis[N-(1-naphthyl)-N-phenylamino]biphenyl (abbreviation: NPB), 4,4'-bis(N-[4-di(m-tolyl)amino]phenyl-N-phenylamino)bipheny (abbreviation: DNTPD), 4,4', 4"-tris(N-carbazolyl)triphenylamine (abbreviation: TCTA), and the like. In addition, among the compounds mentioned above, aromatic amine compounds as typified by TDATA, MTDATA, m-MTDAB, TPD, NPB, DNTPD, and TCATA can easily generate hole-carriers, and are a suitable group of compounds for the first organic compound.

On the other hand, the first inorganic compound may be any material as long as the material can easily accept electrons from the first organic compound, and various kinds of metal oxide and metal nitride can be used. Transition metal oxide having a transition metal that belongs to any of Groups 4 to of the periodic table is preferable since an electron-accepting property is easily provided. Specifically, titanium oxide, zirconium oxide, vanadium oxide, molybdenum oxide, tungsten oxide, rhenium oxide, ruthenium oxide, zinc oxide, and the like can be used. In addition, of the metal oxide mentioned above, many kinds of transition metal oxide having a transition metal that belongs to any of Groups 4 to 8 have a higher electron-accepting property, which are a preferable group of compounds. In particular, vanadium oxide, molybdenum oxide, tungsten oxide, and rhenium oxide are preferable since they can be easily used and be formed by vacuum evaporation.

It is to be noted that the first layer 804 may be formed by stacking a plurality of layers each including a combination of the organic compound and the inorganic compound as described above, or may further include another organic or inorganic compound.

Next, the third layer 802 will be described. The third layer 802 is a layer which has a function of transporting electrons to the second layer 803, and includes at least a third organic compound and a third inorganic compound having an electron-donating property with respect to the third organic compound. What is important is that the third organic compound and the third inorganic compound are not only simply mixed but also the third inorganic compound has an electron-donating property with respect to the third organic compound. This structure generates a lot of electron-carriers in the third organic compound which has originally almost no inherent carriers, and a highly excellent electron-injecting and electron-transporting property can be obtained.

Therefore, as for the third layer 802, not only advantageous effect that is considered to be obtained by mixing an inorganic compound (such as improvement in heat resistance) but also excellent conductivity (in particular, an electron-injecting property and a electron-transporting property in the third layer 802) can also be obtained. This excellent conductivity is advantageous effect that cannot be obtained in a conventional electron-transporting layer in which an organic compound and an inorganic compound that do not electronically interact with each other are simply mixed. This advantageous effect can make a drive voltage lower than conventionally. In addition, since the second layer 802 can be made thicker without causing increase in a drive voltage, short circuit of the element due to a dust and the like can be suppressed.

It is preferable to use an electron-transporting organic compound as the third organic compound since electron-carriers are generated in the third organic compound as described above. Examples of the hole-transporting organic compound include, but are not limited to, tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), bis(2-methyl-8-quinolinolato)(4-phenylphenolato)aluminum (abbreviation: BAlq), bis[2-(2'-hydroxyphenyl)benzoxazolato]zinc (abbreviation: $Zn(BOX)_2$), bis(2-(2'-hydroxyphenyl)benzothiazolato)zinc (abbreviation: $Zn(BTZ)_2$), bathophenanthroline (abbreviation: BPhen), bathocuproin (abbreviation: BCP), 2-(4-biphenylyl)-5-(4-tert-butylphenyl)-1,3,4-oxadiazole (abbreviation: PBD), 1,3-bis[5-(4-tert-butylphenyl)-1,3,4-oxadiazol-2-yl]benzene (abbreviation: OXD-7), 2,2',2"-(1,3,5-benzenetriyl)-tris(1-phenyl-1H-benzimidazol e) (abbreviation: TPBI), 3-(4-biphenylyl)-4-phenyl-5-(4-tert-butylphenyl)-1,2,4-tris zole (abbreviation: TAZ), 3-(4-biphenylyl)-4-(4-ethylphenyl)-5-(4-tert-butylphenyl)-1,2,4-triazole (abbreviation: p-EtTAZ), and the like. In addition, among the compounds mentioned above, chelate metal complexes having a chelate ligand including an aromatic ring as typified by $Alq_3$, $Almq_3$, $BeBq_2$, BAlq, $Zn(BOX)_2$, and $Zn(BTZ)_2$, organic compounds having a phenanthroline skeleton as typified by BPhen and BCP, and organic compounds having an oxadiazole skeleton as typified by PBD and OXD-7 can easily generate electron-carriers, and are suitable groups of compounds for the third organic compound.

On the other hand, the third inorganic compound may be any material as long as the material can easily donate electrons to the third organic compound, and various kinds of metal oxide and metal nitride can be used. Alkali metal oxide, alkaline-earth metal oxide, rare-earth metal oxide, alkali metal nitride, alkaline-earth metal nitride, and rare-earth metal nitride are preferable since an electron-donating property is easily provided. Specifically, lithium oxide, strontium oxide, barium oxide, erbium oxide, lithium nitride, magnesium nitride, calcium nitride, yttrium nitride, lanthanum nitride, and the like can be used. In particular, lithium oxide, barium oxide, lithium nitride, magnesium nitride, and calcium nitride are preferable since they can be easily used for vacuum-evaporation.

It is to be noted that the third layer 802 may be formed by stacking a plurality of layers each including a combination of the organic compound and the inorganic compound as described above, or may further include another organic compound or inorganic compound.

Next, the second layer 803 will be described. The second layer 803 is a layer which has a function of emitting light, and includes a second organic compound that has a light-emitting property. A second inorganic compound may also be included. The second layer 803 can be formed by using various light-emitting organic compounds and inorganic compounds. However, since it is believed to be hard to apply a current to the second layer 803 as compared with the first layer 804 or the third layer 802, the thickness of the second layer 803 is preferably about 10 to 100 nm.

The second organic compound is not particularly limited as long as it is a light-emitting organic compound, and examples of the second organic compound include 9,10-di(2-naphthyl) anthracene (abbreviation: DNA), 9,10-di(2-naphthyl)-2-tert-butylanthracene (abbreviation: t-BuDNA), 4,4'-bis(2,2-diphenylvinyl) biphenyl (abbreviation: DPVBi), coumarin 30, coumarin 6, coumarin 545, coumarin 545T, perylene, rubrene, periflanthene, 2,5,8,11-tetra(tert-butyl)perylene (abbreviation: TBP), 9,10-diphenylanthracene (abbreviation: DPA), 5,12-diphenylanthracene, 4-(dicyanomethylene)-2-methyl-[p-(dimethylamino)styryl]-4H-pyran (abbreviation: DCM1), 4-(dicyanomethylene)-2-methyl-6-[2-(julolidine-9-yl)ethenyl]-4H-pyran (abbreviation: DCM2), 4-(dicyanomethylene)-2,6-bis[p-(dimethylamino)styryl]-4H-pyran (abbreviation: BisDCM), and the like. In addition, it is also possible to use a compound capable of emitting phosphorescence such as bis[2-(4',6'-difluorophenyl)pyridinato-N,$C^{2'}$] iridium(picolinate) (abbreviation: FIrpic), bis{2-[3',5'-bis (trifluoromethyl)phenyl]pyridinato-N,$C^{2'}$}iridium (picolinate) (abbreviation: Ir($CF_3$ppy)$_2$(pic)), tris(2-phenylpyridinato-N,$C^{2'}$)iridium (abbreviation: Ir(ppy)$_3$), bis (2-phenylpyridinato-N,$C^{2'}$)iridium(acetylacetonate) (abbreviation: Ir(pPY)$_2$(acac)), bis[2-(2'-thienyl)pyridinato-N,$C^{3'}$]iridium(acetylacetonate) (abbreviation: Ir(thp)$_2$ (acac)), bis(2-phenylquinolinato-N,$C^{2'}$)iridium(acetylacetonate) (abbreviation: Ir(pq)$_2$(acac)), or bis[2-(2'-benzothienyl) pyridinato-N,$C^{3'}$]iridium(acetylacetonate) (abbreviation: Ir(btp)$_2$(acac)).

Further, a triplet excitation light-emitting material containing a metal complex or the like may be used for the second layer 803 in addition to a singlet excitation light-emitting material. For example, among pixels emitting red, green, and blue light, a pixel emitting red light whose luminance is reduced by half in a relatively short time is formed by using a triplet excitation light-emitting material and the other pixels are formed by using a singlet excitation light-emitting material. A triplet excitation light-emitting material has a feature of favorable light-emitting efficiency and less power consumption to obtain the same luminance. In other words, when a triplet excitation light-emitting material is used for a red pixel, only small amount of current needs to be applied to a light-emitting element, and thus, reliability can be improved. A pixel emitting red light and a pixel emitting green light may be formed by using a triplet excitation light-emitting material and a pixel emitting blue light may be formed by using a singlet excitation light-emitting material to achieve low power consumption as well. Low power consumption can be further achieved by forming a light-emitting element emitting green light that has high visibility for human eyes by using a triplet excitation light-emitting material.

The second layer 803 may include not only the second organic compound as described above, which produces light-emission, but also another organic compound may/also be added thereto. Examples of organic compounds that can be added include, but are not limited to, TDATA, MTDATA, m-MTDAB, TPD, NPB, DNTPD, TCTA, Alq$_3$, Almq$_3$, BeBq$_2$, BAlq, Zn(BOX)$_2$, Zn(BTZ)$_2$, BPhen, BCP, PBD, OXD-7, TPBI, TAZ, p-EtTAZ, DNA, t-BuDNA, and DPVBi, which are mentioned above, and further, 4,4'-bis(N-carbazolyl)biphenyl (abbreviation: CBP), 1,3,5-tris[4-(N-carbazolyl]phenyl]benzene (abbreviation: TCPB), and the like. It is preferable that the organic compound, which is added in addition to the second organic compound, has larger excitation energy than that of the second organic compound and be added by the larger amount than the second organic compound in order to make the second organic compound emit light efficiently (which makes it possible to prevent concentration quenching of the second organic compound). Alternatively, as another function, the added organic compound may emit light along with the second organic compound (which makes it possible to emit white light).

The second layer 803 may have a structure to perform color display by providing each pixel with a light-emitting layer having a different emission wavelength range. Typically, a light-emitting layer corresponding to each color of R (red), G (green), or B (blue) is formed. Also in this case, color purity can be improved and a pixel portion can be prevented from having a mirror surface (reflection) by providing the light-emission side of the pixel with a filter which transmits light of an emission wavelength range of the light. By providing a filter, a circularly polarizing plate or the like that has been conventionally required can be omitted, and further, the loss of light emitted from the light-emitting layer can be eliminated. Moreover, change in a color tone, which occurs when a pixel portion (display screen) is obliquely seen, can be reduced.

A high-molecular organic light-emitting material or a low-molecular organic light-emitting material can be used for a material of the second layer 803. A high-molecular organic light-emitting material is physically stronger as compared with a low-molecular material and is superior in durability of the element. In addition, a high-molecular organic light-emitting material can be formed by coating; therefore, the element can be relatively easily manufactured.

The emission color is determined depending on a material forming the light-emitting layer; therefore, a light-emitting element which exhibits desired light-emission can be formed by selecting an appropriate material for the light-emitting layer. As a high-molecular electroluminescent material which can be used for forming a light-emitting layer, a polyparaphenylene-vinylene-based material, a polyparaphenylene-based material, a polythiophene-based material, or a polyfluorene-based material can be used.

As the polyparaphenylene-vinylene-based material, derivative of poly(paraphenylenevinylene) [PPV] such as poly(2,5-dialkoxy-1,4-phenylenevinylene) [RO-PPV]; poly (2-(2'-ethyl-hexoxy)-5-methoxy-1,4-phenylenevinylene) [MEH-PPV]; or poly(2-(dialkoxyphenyl)-1,4-phenylenevinylene) [ROPh-PPV] can be given. As the polyparaphenylene-based material, a derivative of polyparaphenylene [PPP] such as poly(2,5-dialkoxy-1,4-phenylene) [RO-PPP]; or poly(2,5-dihexoxy-1,4-phenylene) can be given. As the polythiophene-based material, a derivative of polythiophene [PT] such as poly(3-alkylthiophene) [PAT]; poly(3-hexylthiophen) [PHT]; poly(3-cyclohexylthiophen) [PCHT]; poly (3-cyclohexyl-4-methylthiophene) [PCHMT]; poly(3,4-dicyclohexylthiophene) [PDCHT]; poly[3-(4-octylphenyl)-thiophene] [POPT]; or poly[3-(4-octylphenyl)-2, 2bithiophene] [PTOPT] can be given. As the polyfluorene-based material, a derivative of polyfluorene [PF] such as poly(9,9-dialkylfluorene) [PDAF] or poly(9,9-dioctylfluorene) [PDOF] can be given.

The second inorganic compound may be any inorganic compound as long as light-emission of the second organic compound is not easily quenched by the inorganic compound, and various kinds of metal oxide and metal nitride can be used. In particular, metal oxide having a metal that belongs to Group 13 or 14 of the periodic table is preferable since light-emission of the second organic compound is not easily quenched, and specifically, aluminum oxide, gallium oxide, silicon oxide, and germanium oxide are preferable. However, the second inorganic compound is not limited thereto.

It is to be noted that the second layer 803 may be formed by stacking a plurality of layers each including a combination of the organic compound and the inorganic compound as described above, or may further include another organic compound or inorganic compound. A layer structure of the light-emitting layer can be changed, and an electrode layer for injecting electrons may be provided or a light-emitting material may be dispersed, instead of providing no specific electron-injecting region or light-emitting region. Such a change can be permitted unless it departs from the spirit of the present invention.

A light-emitting element formed by using the above described materials emits light by being forwardly biased. A pixel of a display device, which is formed by using a light-emitting element, can be driven by a simple matrix mode or an active matrix mode. In any case, each pixel emits light by applying a forward bias thereto at a specific timing; however, the pixel is in a non-emitting state for a certain period. Reliability of a light-emitting element can be improved by applying a reverse bias in the non-emitting time. In a light-emitting element, there is a deterioration mode in which emission intensity is decreased under specific driving conditions or a deterioration mode in which a non-light-emitting region is enlarged in the pixel and luminance is apparently decreased. However, progression of deterioration can be slowed down by alternating current driving where bias is applied forwardly and reversely, and thus, reliability of a light-emitting device can be improved. Additionally, either digital driving or analog driving can be applied.

A color filter (colored layer) may be formed over a sealing substrate. The color filter (colored layer) can be formed by an evaporation method or a droplet-discharge method. With the use of the color filter (colored layer), high-definition display can be performed. This is because a broad peak can be modified to be sharp in an emission spectrum of each of R, G, and B by the color filter (colored layer).

Full color display can be performed by forming a material emitting light of a single color and combining with a color filter or a color conversion layer. The color filter (colored layer) or the color conversion layer is formed over, for example, a second substrate (a sealing substrate) and may be attached to a substrate.

Obviously, display of a single color emission may also be performed. For example, an area color type display device may be manufactured by using single color emission. The area color type is suitable for a passive matrix display portion, and can mainly display characters and symbols.

Materials of the first electrode layer 870 and the second electrode layer 850 are required to be selected considering the work function. The first electrode layer 870 and the second electrode layer 850 can be either an anode or a cathode depending on the pixel structure. In a case where conductivity of a driving thin film transistor is a p-channel type, the first electrode layer 870 may serve as an anode and the second electrode layer 850 may serve as a cathode as shown in FIG. 18A. In a case where conductivity of the driving thin film transistor is an n-channel type, the first electrode layer 870 may serve as a cathode and the second electrode layer 850 may serve as an anode as shown in FIG. 18B. Materials that can be used for the first electrode layer 870 or the second electrode layer 850 will be described. It is preferable to use a material having a higher work function (specifically, a material having a work function of 4.5 eV or higher) for one electrode layer which serve as an anode, and a material having a lower work function (specifically, a material having a work function of 3.5 eV or lower) for the other electrode layer which serves as a cathode. However, since the first layer 804 is superior in a hole-injecting property and a hole-transporting property and the third layer 802 is superior in an electron-injecting property and an electron transporting property, both of the first electrode layer 870 and the second electrode layer 850 are scarcely restricted by a work function, and various materials can be used.

The light-emitting elements in FIGS. 18A and 18B have a structure in which light is extracted from the first electrode layer 870, and thus, the second electrode layer 850 is not always required to have a light-transmitting property. The second electrode layer 850 may be formed of a film mainly including an element selected from Ti, TiN, $TiSi_xN_y$, Ni, W, $WSi_x$, $WN_x$, $WSi_xN_y$, NbN, Cr, Pt, Zn, Sn, In, Ta, Al, Cu, Au, Ag, Mg, Ca, Li and Mo, or an alloy material or a compound material containing the element as its main component, or a stacked film thereof to have a total thickness in a range of 100 to 800 nm.

The second electrode layer 850 can be formed by an evaporation method, a sputtering method, a CVD method, a printing method, a droplet-discharge method, or the like.

In addition, when the second electrode layer 850 is formed by using a light-transmitting conductive material similarly to the material used for the first electrode layer 870, light is also extracted from the second electrode layer 850, and a dual emission structure can be obtained, in which light emitted from the light-emitting element is emitted from both of the first electrode layer 870 and the second electrode layer 850.

It is to be noted that the light-emitting element according to the present invention has variations by changing types of the first electrode layer 870 and the second electrode layer 850.

FIG. 18B shows a case where the third layer 802, the second layer 803, and the first layer 804 are provided in this order from the first electrode layer 870 side in the electroluminescent layer 860.

As described above, in the light-emitting element according to the present invention, the layer interposed between the first electrode layer 870 and the second electrode layer 850 is formed of the electroluminescent layer 860, in which an organic compound and an inorganic compound are combined. The light-emitting element is an organic-inorganic composite light-emitting element provided with layers (that is, the first layer 804 and the third layer 802) that provide functions called a high carrier-injecting property and carrier-transporting property by mixing an organic compound and an inorganic compound, where the functions are not obtainable from only either one of the organic compound or the inorganic compound. Further, the first layer 804 and the third layer 802 are particularly required to be layers in which an organic compound and an inorganic compound are combined when provided on the first electrode layer 870 side, and may contain only organic compounds or inorganic compounds when provided on the second electrode layer 850 side.

Further, various methods can be used as a method for forming the electroluminescent layer 860, which is a layer in which an organic compound and an inorganic compound are mixed. For example, the methods include a co-evaporation method of evaporating both an organic compound and an inorganic compound by resistance heating. In addition, for co-evaporation, an inorganic compound may be evaporated by an electron beam (EB) while evaporating an organic compound by resistance heating. Further, the methods also include a method of sputtering an inorganic compound while evaporating an organic compound by resistance heating to deposit the both at the same time. In addition, deposition may also be performed by a wet process.

Similarly, for the first electrode layer 870 and the second electrode layer 850, evaporation by resistance heating, EB evaporation, sputtering, a wet process, and the like can be used.

In the display device shown in FIG. 1, the gate electrode layer has a stacked structure of the first gate electrode layer 614 and the second electrode layer 615 each having a taper shape. As will be described in detail in Embodiment Mode 5, the semiconductor layer 618 has a following structure by making the use of the gate electrode layer in which a shape of the first electrode layer 614 is different from a shape of the second electrode layer 616; namely, in the semiconductor layer 618, a channel forming region is formed in a region which overlaps with the second gate electrode layer 616; low-concentration impurity regions are formed in regions on both sides of the channel forming region, which overlap only with the first gate electrode layer 614; and high-concentration regions are formed in regions on both sides of the low-concentration impurity regions, which do not overlap with the first gate electrode layer 614 and the second gate electrode layer 616. Similarly to the first gate electrode layer 614 and the second gate electrode layer 616, the first conductive layer 615 and the second conductive layer 617, which are interposed between the source electrode or the drain electrode layer 604 and the first electrode layer 610 to electrically connect the both electrode layers, have also a stacked structure with a taper shape. This is because the first conductive layer 615 and the second conductive layer 617 are formed by the same material and through the same step as the first electrode layer 614 and the second electrode layer 616, respectively. In the display device shown in FIG. 1, a part of the first conductive layer 615 and the second conductive layer 617 is formed over the semiconductor layer. Therefore, as the impurity regions are formed in a self-alignment manner in the semiconductor layer 618 by the shapes of the first gate electrode layer 614 and the second electrode layer 616, an impurity region is not formed in a region of the semiconductor layer 618, which overlaps with the second conductive layer 617, and a low-concentration impurity region is formed in a region of the semiconductor layer 618, which overlaps only with the first conductive layer 615.

Figure 2:
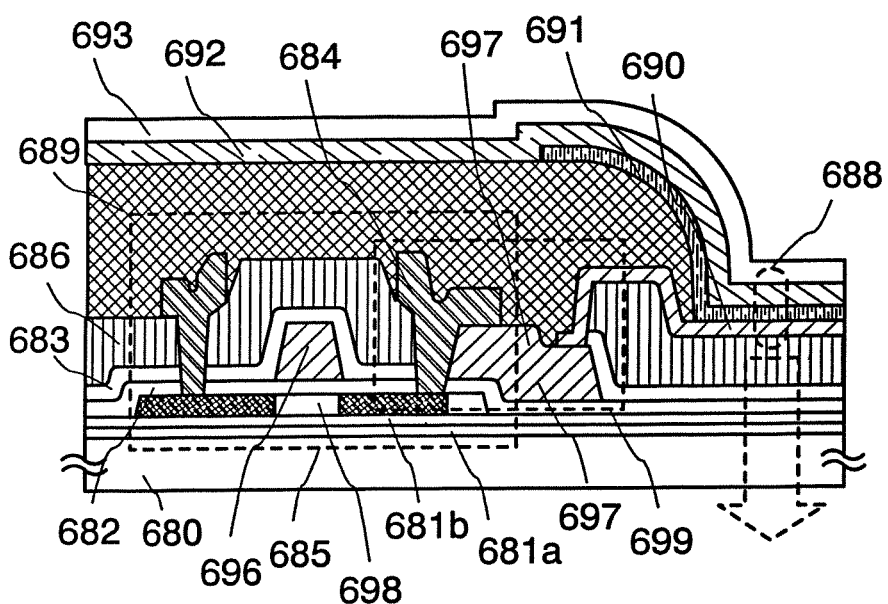
FIG. 2 is a view showing a display device according to the present invention.

FIG. 2 shows an example in which, in the display device of FIG. 1, a gate electrode layer has a single layer structure and impurity regions of the semiconductor layer formed in a self-alignment manner are only a source region and a drain region with a channel formation region interposed therebetween. Therefore, a conductive layer 695, which electrically connects the impurity region of a semiconductor layer 698 and a source electrode layer or a drain electrode layer 684 to a first electrode layer 690, has a single layer structure. In addition, similarly to the display device of FIG. 1, impurities are not added into a region of the semiconductor layer 698, which overlaps with the conductive layer 697, and an impurity region is not formed.

In a display device of FIG. 2, over a substrate 680, base films 681a and 681b, a thin film transistor 685, a gate insulating layer 682, insulating layers 683 and 686, an insulating layer 689 functioning as a partition wall, the first electrode layer 690, an electroluminescent layer 691, a second electrode layer 692, and a protective film 693 are provided. The thin film transistor 685 includes the semiconductor layer 698, which has the impurity regions functioning as a source region and a drain region, the gate insulating layer 682, a gate electrode layer 696 having a single layer structure, and the source electrode layer or the drain electrode layer 684. The source electrode layer or the drain electrode layer 684 is in contact with and electrically connected to the impurity region of the semiconductor layer 698 and the conductive layer 697. The conductive layer 697 is manufactured by using the same material and through the same step as the gate electrode layer 696. Since the conductive layer 697 is in contact with and electrically connected to the first electrode layer 690, the semiconductor layer 698 and the source electrode layer or the drain electrode layer 684 are electrically connected to the first electrode layer 690 with the conductive layer 697 interposed therebetween. In addition, in the display device of FIG. 2, the impurity region of the semiconductor layer 698, the source electrode layer or the drain electrode layer 684, the conductive layer 697, and the first electrode layer 690 are electrically connected to each other in an opening 699 provided in the gate insulating layer 682, and the insulating layers 683 and 686.

A light-emitting element 688 has the same structure as the light-emitting element 608 in FIG. 1, and light is emitted from the first electrode layer 690 having a light-transmitting property. Other components of the display device in FIG. 2 can be formed by using the same material as the display device in FIG. 1.

As described above, in accordance with the present invention, a highly reliable display device can be manufactured. Therefore, a high-definition and high-image quality display device can be manufactured with high yield.

Embodiment Mode 2

A display device in the present embodiment mode will be described with reference to FIG. 3.

Figure 3:
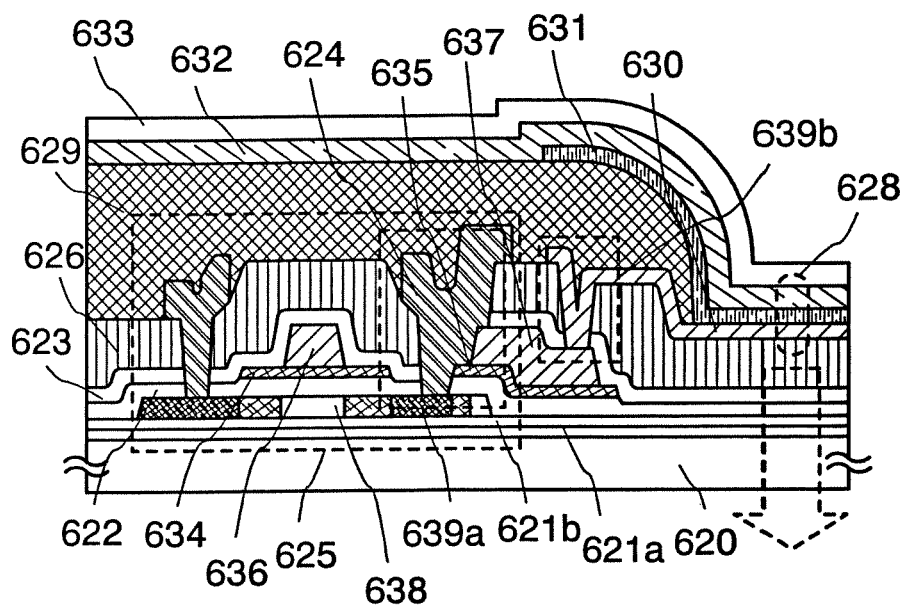
FIG. 3 is a view showing a display device according to the present invention.

As shown in FIG. 3, a display device of the present embodiment mode is a bottom emission display device in which light from a light-emitting element 628 is extracted through a substrate having a thin film transistor. The present embodiment mode describes an example in which a structure of a source electrode layer or a drain electrode layer of a thin film transistor, a first conductive layer, a second conductive layer, and a first electrode layer is different from the one of Embodiment Mode 1. Therefore, explanations of the same portions or portions having the same functions will be omitted.

In a display device of FIG. 3, over a substrate 620, base films 621a and 621b, a thin film transistor 625, a gate insulating layer 622, insulating layers 623 and 626, an insulating layer 629 functioning as a partition wall, a first electrode layer 630, an electroluminescent layer 631, a second electrode layer 632, and a protective film 633 are provided. The thin film transistor 625 includes a semiconductor layer 638, which has impurity regions functioning as a source region and a drain region, the gate insulating layer 622, a first gate electrode layer 634 and a second gate electrode layer 636, which form a stacked structure of two layers, and a source electrode layer and a drain electrode layer 624. The source electrode layer or the drain electrode layer 624 is in contact with and electrically connected to the impurity region of the semiconductor layer 638, a first conductive layer 635, and a second conductive layer 637. The first conductive layer 635 and the second conductive layer 637 are manufactured by using the same material and through the same step as the first gate electrode layer 634 and the second gate electrode layer 636, respectively. Since the second conductive layer 637 is in contact with and electrically connected to the first electrode layer 630, the semiconductor layer 638 and the source electrode layer or the drain electrode layer 624 are electrically connected to the first electrode layer 630 with the first conductive layer 635 and the second conductive layer 637 interposed therebetween. In addition, similarly to the display device in FIG. 1, impurities are not added into a region of the semiconductor layer 638, which overlaps with the second conductive layer 637, and an impurity region is not formed, whereas a low-concentration impurity region is formed in a region of the semiconductor layer 638, which overlaps only with the first conductive layer 635.

In the display device of Embodiment Mode 1, the semiconductor layer, the source electrode layer or the drain electrode layer, the conductive layer, and the first electrode layer are formed in one opening provided in the insulating layer. However, in the present embodiment mode, two openings are provided in the insulating layer. In the display device of FIG. 3, the impurity region of the semiconductor layer 638, the source electrode layer or the drain electrode layer 624, the first conductive layer 635, and the second conductive layer 637 are electrically connected to each other in an opening 639a provided in the gate insulating layer 622 and the insulating layers 623 and 626. Further, the first conductive layer 635, the second conductive layer 637, and the first electrode layer 630 are electrically connected to each other in an opening 639b provided in the insulating layers 623 and 626. As described here, a structure may also be employed, in which the source electrode layer or the drain electrode layer and the first electrode layer are connected to the first conductive layer and the second conductive layer in different openings.

In a display device according to the present invention, the source electrode layer or the drain electrode layer 624 of the thin film transistor and the first electrode layer 630 of the light-emitting element, which is a pixel electrode layer, are not directly stacked to be electrically connected, but the source electrode layer or the drain electrode layer 624 and the first electrode layer 630 are electrically connected to each other with the first conductive layer 635 and the second conductive layer 637 interposed therebetween. In such a structure, materials by which the source electrode layer or the drain electrode layer and the first electrode layer are not easily electrically connected to each other when the both electrode layers are directly in contact with each other (conductivity in the both electrode layers is low and an electric contact is not easily made) or materials by which deterioration such as electric erosion is caused when the both electrode layers are in contact with each other can also be used since a conductive layer is interposed between the both electrode layers. Therefore, a range of a choice for materials that can be used for the source electrode layer or the drain electrode layer and the first electrode layer can be wide.

Resistance of the source electrode layer or the drain electrode layer that is used as a wiring is required to be lowered so that an electric signal or power is supplied. Further, the first electrode layer that is used as a pixel electrode is required to have a light-transmitting property so that light emitted from the light-emitting element is transmitted. The source electrode layer or the drain electrode layer and the first electrode layer are each required to have the property as described above. In the structure of the present invention, a problem, which arises when the source electrode layer or the drain electrode layer and the first electrode layer are stacked, is not required to be concerned, and thus, a material having a property that is required for each of the source electrode layer or the drain electrode layer and the first electrode layer can be arbitrarily selected.

In addition, since the source electrode layer or the drain electrode layer 624 and the first electrode layer 630 are electrically connected to each other on the second conductive layer 637, disconnection is not concerned and contact resistance is lowered. As a result, contact resistance of the source electrode layer or the drain electrode layer 624 and the first electrode layer 630 is also lowered. In addition to the above advantageous effect, the first conductive layer 635 and the second conductive layer 637, which have a function of electrically connecting the source electrode layer or the drain electrode layer that is electrically connected to the source region or the drain region of the semiconductor layer and the first electrode layer 630, are formed by using the same material and through the same step as the first gate electrode layer 634 and the second gate electrode layer 636, respectively. Further, an opening that reaches the first conductive layer 635 and the second conductive layer 637 is formed in the insulating layers at the same time as a step of forming an opening that reaches the source region or the drain region of the semiconductor layer, and thus, manufacturing steps are not increased. A layout of a structure of a display device can be more freely designed without complicated steps. Therefore, a more highly-reliable display device can be manufactured with high yield.

Embodiment Mode 3

A display device in the present embodiment mode will be described with reference to FIG. 4.

Figure 4:
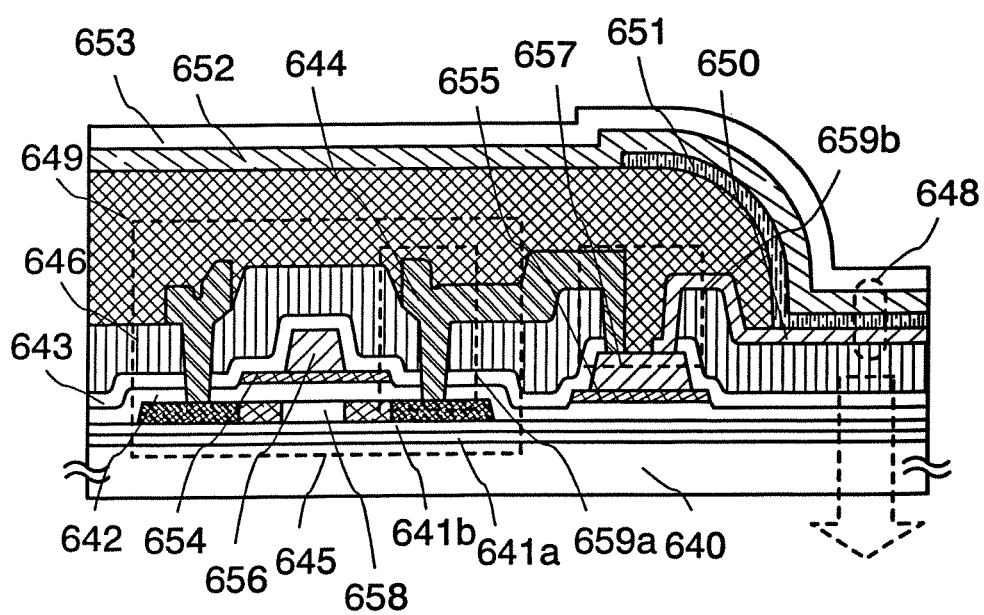
FIG. 4 is a view showing a display device according to the present invention.

As shown in FIG. 4, a display device of the present embodiment mode is a bottom emission display device in which light from a light-emitting element 648 is extracted through a substrate having a thin film transistor. The present embodiment mode describes an example in which a structure of a source electrode layer or a drain electrode layer of a thin film transistor, a first conductive layer, a second conductive layer, and a first electrode layer is different from the one of Embodiment Mode 1. Therefore, explanations of the same portions or portions having the same functions will be omitted.

In a display device of FIG. 4, over a substrate 640, base films 641a and 641b, a thin film transistor 645, a gate insulating layer 642, insulating layers 643 and 646, an insulating layer 649 functioning as a partition wall, a first electrode layer 650, an electroluminescent layer 651, a second electrode layer 652, and a protective film 653 are provided. The thin film transistor 645 includes a semiconductor layer 658, which has impurity regions functioning as a source region and a drain region, the gate insulating layer 642, a first gate electrode layer 654 and a second gate electrode layer 656, which form a stacked structure of two layers, and a source electrode layer and a drain electrode layer 644. The source electrode layer or the drain electrode layer 644 is in contact with the impurity region of the semiconductor layer 658 and a second conductive layer 657. Thus, the source electrode layer or the drain electrode layer 644, the impurity region of the semiconductor layer 658, a first conductive layer 655, and the second conductive layer 657 are electrically connected to each other. The first conductive layer 655 and the second conductive layer 657 are manufactured by using the same material and through the same step as the first gate electrode layer 654 and the second gate electrode layer 656, respectively. Since the second conductive layer 657 is in contact with and electrically connected to the first electrode layer 650, the semiconductor layer 658 and the source electrode layer or the drain electrode layer 644 are electrically connected to the first electrode layer 650 with the first conductive layer 655 and the second conductive layer 657 interposed therebetween. In addition, different from the display device in FIG. 1, since the first conductive layer 655 and the second conductive layer 657 are not formed over the semiconductor layer 658, the first conductive layer 655 and the second conductive layer 657 do not serve as masks when impurity elements are added to the semiconductor layer. Therefore, in the display device of the present embodiment mode in FIG. 4, a channel formation region, low-concentration impurity regions, and high-concentration impurity regions are formed in a self-alignment manner by the first gate electrode layer 654 and the second gate electrode layer 656.

Also in the present embodiment mode, two openings are provided in the insulating layer similarly to the display device of Embodiment Mode 2 in FIG. 3. In the display device of Embodiment Mode 2 in FIG. 3, the impurity region of the semiconductor layer 638, the source electrode layer or the drain electrode layer 624, the first conductive layer 635, and the second conductive layer 637 are electrically connected to each other in the opening 639*a*, and the second conductive layer 637 and the first electrode layer 630 are electrically connected to each other in the opening 639*b*. In the present embodiment mode, the impurity region of the semiconductor layer 658 and the source electrode layer or the drain electrode layer 644 are connected to each other in an opening 659*a* provided in the gate insulating layer 642 and the insulating layers 643 and layer 646, whereas the second conductive layer 657 is connected to the source electrode layer or the drain electrode layer 644 and the first electrode layer 650 in an opening 659*b* provided in the insulating layers 643 and 646.

The impurity region of the semiconductor layer 658 and the source electrode layer or the drain electrode layer 644 are electrically connected to the first electrode layer 650 with the first conductive layer 655 and the second conductive layer 657 interposed therebetween. As described here, the source electrode layer or the drain electrode layer connected to the impurity region of the semiconductor layer may be led out over the insulating layer 646 to be connected to the first conductive layer 655 and the second conductive layer 657 in another opening 659*b* in which a stack of the first conductive layer 655 and the second conductive layer 657 is exposed. Then, the first conductive layer 655 and the second conductive layer 657 may be connected to the first electrode layer 655 in the opening 659*b*.

In the display device according to the present invention, the source electrode layer or the drain electrode layer 644 of the thin film transistor and the first electrode layer 650 of the light-emitting element, which is a pixel electrode layer, are not directly stacked to be electrically connected, but the source electrode layer or the drain electrode layer 644 and the first electrode layer 650 are electrically connected to each other with the first conductive layer 655 and the second conductive layer 657 interposed therebetween. In such a structure, materials by which the source electrode layer or the drain electrode layer and the first electrode layer are not easily electrically connected to each other when the both electrode layers are directly in contact with each other (conductivity in the both electrode layers is low and an electric contact is not easily made) or materials by which deterioration such as electric erosion is caused when the both electrode layers are in contact with each other can also be used since conductive layers are interposed between the both electrode layers. Therefore, a range of a choice for materials that can be used for the source electrode layer or the drain electrode layer and the first electrode layer can be wide.

Resistance of the source electrode layer or the drain electrode layer that is used as a wiring is required to be lowered so that an electric signal or power is supplied. Further, the first electrode layer that is used as a pixel electrode is required to have a light-transmitting property so that light emitted from the light-emitting element is transmitted. The source electrode layer or the drain electrode layer and the first electrode layer are each required to have the property as described above. In the structure of the present invention, a problem, which arises when the source electrode layer or the drain electrode layer and the first electrode layer are stacked, is not required to be concerned, and thus, a material having a property that is required for each of the source electrode layer or the drain electrode layer and the first electrode layer can be arbitrarily selected.

In addition, since the source electrode layer or the drain electrode layer 644 and the first electrode layer 650 are electrically connected to each other on the second conductive layer 657, disconnection is not concerned and contact resistance is lowered. As a result, contact resistance of the source electrode layer or the drain electrode layer 644 and the first electrode layer 650 is also lowered. In addition to the above advantageous effect, the first conductive layer 655 and the second conductive layer 657, which have a function of electrically connecting the source electrode layer or the drain electrode layer that is electrically connected to the source region or the drain region of the semiconductor layer and the first electrode layer, are formed by using the same material and through the same step as the first gate electrode layer 654 and the second gate electrode layer 656, respectively. Further, an opening that reaches the second conductive layer 657 is formed in the insulating layer at the same time as a step of forming an opening that reaches the source region or the drain region of the semiconductor layer, and thus, manufacturing steps are not increased. A layout of a structure of a display device can be more freely designed without complicated steps. Therefore, a more highly-reliable display device can be manufactured with high yield.

Embodiment Mode 4

A display device of the present embodiment mode will be described with reference to FIG. 5.

Figure 5:
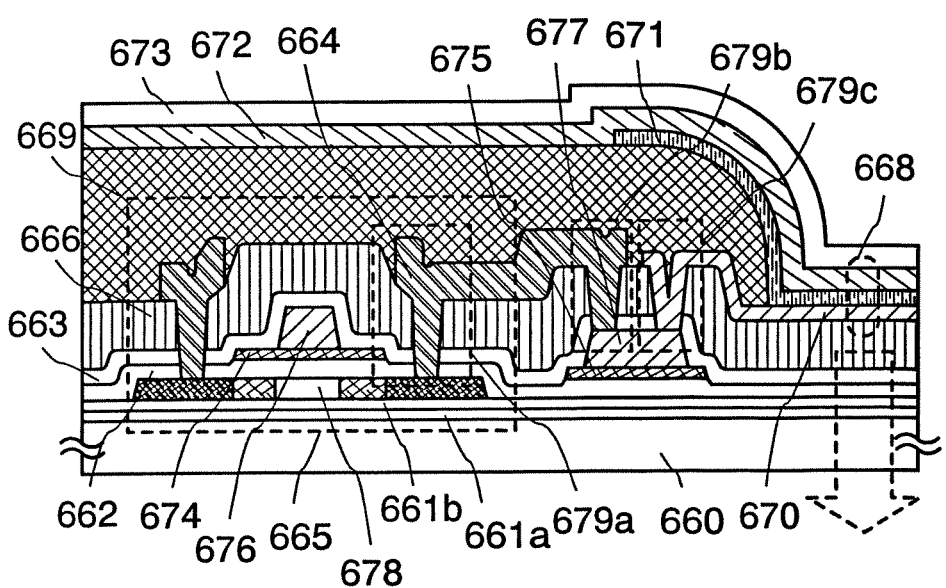
FIG. 5 is a view showing a display device according to the present invention.

As shown in FIG. 5, a display device of the present embodiment mode is a bottom emission display device in which light from a light-emitting element 668 is extracted through a substrate having a thin film transistor. The present embodiment mode describes an example in which a structure of a source electrode layer or a drain electrode layer of a thin film transistor, a first conductive layer, a second conductive layer, and a first electrode layer is different from the one of Embodiment Mode 1. Therefore, explanations of the same portions or portions having the same functions will be omitted.

In a display device in FIG. 5, over a substrate 660, base films 661*a* and 661*b*, a thin film transistor 665, a gate insulating layer 662, insulating layers 663 and 666, an insulating layer 669 functioning as a partition wall, a first electrode layer 670, an electroluminescent layer 671, a second electrode layer 672, and a protective film 673 are provided. The thin film transistor 665 includes a semiconductor layer 678, which has impurity regions functioning as a source region and a drain region, the gate insulating layer 662, a first gate electrode layer 674 and a second gate electrode layer 676, which form a stacked structure of two layers, and a source electrode layer and a drain electrode layer 664. The source electrode layer or the drain electrode layer 664 is in contact with the impurity region of the semiconductor layer 678 and a second conductive layer 657. Thus, the source electrode layer or the drain electrode layer 664, the impurity region of the semiconductor layer 678, a first conductive layer 675, and the second conductive layer 677 are electrically connected to each other. The first conductive layer 675 and the second conductive layer 677 are manufactured by using the same material and through the same step as the first gate electrode layer 674 and the second gate electrode layer 676, respectively. Since the second conductive layer 677 is in contact with and electrically connected to the first electrode layer 670, the semiconductor layer 678 and the source electrode layer or the drain electrode layer 664 are electrically connected to the first electrode layer 670 with the first conductive layer 675 and the second conductive layer 677 interposed therebetween. In addition, different from the display device in FIG. 1 and similarly to Embodiment Mode 3, since the first conductive layer 675 and the second conductive layer 677 are not formed over the semiconductor layer 678, the first conductive layer 675 and the second conductive layer 677 do not serve as masks when impurity elements are added into the semiconductor layer. Therefore, in the display device of the present embodiment mode in FIG. 5, a channel formation region, low-concentration impurity regions, and high-concentration impurity regions are formed in a self-alignment manner by the first gate electrode layer 674 and the second gate electrode layer 676.

In the present embodiment mode, three openings are provided in the insulating layers. In the present embodiment mode, the impurity region of the semiconductor layer 678 and the source electrode layer or the drain electrode layer 664 are electrically connected to each other in an opening 679a provided in the gate insulating layer 662 and the insulating layers 663 and 666; the source electrode layer or the drain electrode layer 664 and the second conductive layer 677 are electrically connected to each other in an opening 679b provided in the insulating layers 663 and 666; and the second conductive layer 677 and the first electrode layer 670 are electrically connected to each other in an opening 679c provided in the insulating layers 663 and 666, respectively.

The impurity region of the semiconductor layer 678 and the source electrode layer or the drain electrode layer 664 are electrically connected to the first electrode layer 670 with the first conductive layer 675 and the second conductive layer 677 interposed therebetween. As described here, the source electrode layer or the drain electrode layer 664 connected to the impurity region of the semiconductor layer may be led out over the insulating layer 666 and connected to the first conductive layer 675 and the second conductive layer 677 in another opening 679b in which a stack of the first conductive layer 675 and the second conductive layer 677 is exposed. Then, the first conductive layer 675 and the second conductive layer 677 may be connected to the first electrode layer 670 in another opening 679c in which a stack of the first conductive layer 675 and the second conductive layer 677 is exposed.

In the display device according to the present invention, the source electrode layer or the drain electrode layer 664 of the thin film transistor and the first electrode layer 670 of the light-emitting element, which is a pixel electrode layer, are not directly stacked to be electrically connected, but the source electrode layer or the drain electrode layer 664 and the first electrode layer 670 are electrically connected to each other with the first conductive layer 675 and the second conductive layer 677 interposed therebetween. In such a structure, materials by which the source electrode layer or the drain electrode layer and the first electrode layer are not easily electrically connected to each other when the both electrode layers are directly in contact with each other (conductivity in the both electrode layers is low and an electric contact is not easily made) or materials by which deterioration such as electric erosion is caused when the both electrode layers are in contact with each other can also be used since a conductive layers are interposed between the both electrode layers. Therefore, a range of a choice for materials that can be used for the source electrode layer or the drain electrode layer and the first electrode layer can be wide.

Resistance of the source electrode layer or the drain electrode layer that is used as a wiring is required to be lowered so that an electric signal or power is supplied. Further, the first electrode layer that is used as a pixel electrode is required to have a light-transmitting property so that light emitted from the light-emitting element is transmitted. The source electrode layer or the drain electrode layer and the first electrode layer are each required to have the property as described above. In the structure of the present invention, a problem, which arises when the source electrode layer or the drain electrode layer and the first electrode layer are stacked, is not required to be concerned, and thus, a material having a property that is required for each of the source electrode layer or the drain electrode layer and the first electrode layer can be arbitrarily selected.

In addition, since the source electrode layer or the drain electrode layer 664 and the first electrode layer 670 are electrically connected to each other on the second conductive layer 677, disconnection is not concerned and contact resistance is lowered. As a result, contact resistance of the source electrode layer or the drain electrode layer 664 and the first electrode layer 670 is also lowered. In addition to the above advantageous effect, the first conductive layer 675 and the second conductive layer 677, which have a function of electrically connecting the source electrode layer or the drain electrode layer that is electrically connected to the source region or the drain region of the semiconductor layer and the first electrode layer, are formed by using the same material and through the same step as the first gate electrode layer 674 and the second gate electrode layer 676, respectively. Further, openings that reach the second conductive layer 677 are formed in the insulating layers at the same time as a step of forming an opening that reaches the source region or the drain region of the semiconductor layer, and thus, manufacturing steps are not increased. A layout of a structure of a display device can be more freely designed without complicated steps. Therefore, a more highly-reliable display device can be manufactured with high yield.

Embodiment Mode 5

A method for manufacturing a display device of the present embodiment mode will be described in detail with reference to FIGS. 6A to 6D, 7A to 7C, 8A to 8C, 9A and 9B, 10A and 10B, 16A to 16C, and 17A and 17B.

Figure 16A:
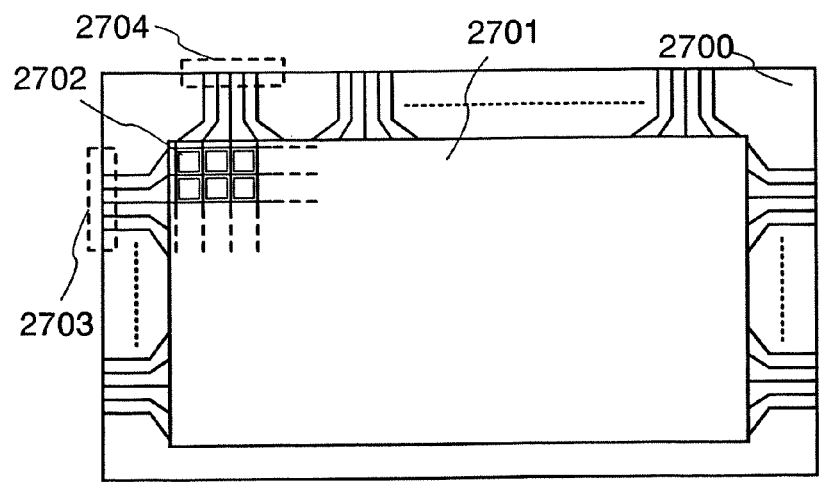
FIGS. 16A to 16C are top views of display devices according to the present invention.

FIG. 16A is a top view showing a structure of a display panel in accordance with the present invention, which includes a pixel portion 2701 in which pixels 2702 are arranged in matrix, a scan line input terminal 2703, and a signal line input terminal 2704 over a substrate 2700 having an insulated surface. The number of pixels may be set depending on various standards, for example, 1024×768×3 (RGB) in a case of XGA, 1600×1200×3 (RGB) in a case of UXGA, and 1920×1080×3 (RGB) in a case of the use for a full spec high vision display.

The pixels 2702 are arranged in matrix by intersecting a scan line extending from the scan line input terminal 2703 and a signal line extending from the signal line input terminal 2704. Each pixel 2702 is provided with a switching element and a pixel electrode layer connected thereto. A typical example of the switching element is a TFT. A gate electrode layer side of the TFT is connected to the scan line, and a source or drain side of the TFT is connected to the signal line, thereby each pixel can be controlled independently by a signal input from the outside.

A TFT has a semiconductor layer, a gate insulating layer and a gate electrode layer as its major components. Wiring layers connected to a source region and a drain region formed in the semiconductor layer are further provided. Typically known are a top gate structure in which a semiconductor layer, a gate insulating layer, and a gate electrode layer are provided in this order from a substrate side, a bottom gate structure in which a gate electrode layer, a gate insulating layer, and a semiconductor layer are provided in this order from a substrate side, and the like, and the present invention may employ any of these structures.

Figure 17A:
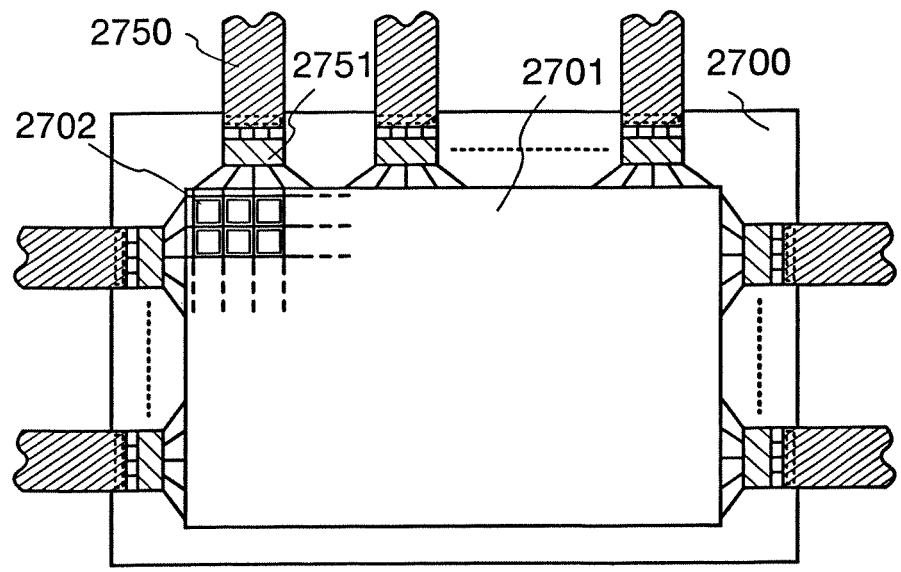
FIGS. 17A and 17B are top views of display devices according to the present invention.
Figure 17B:
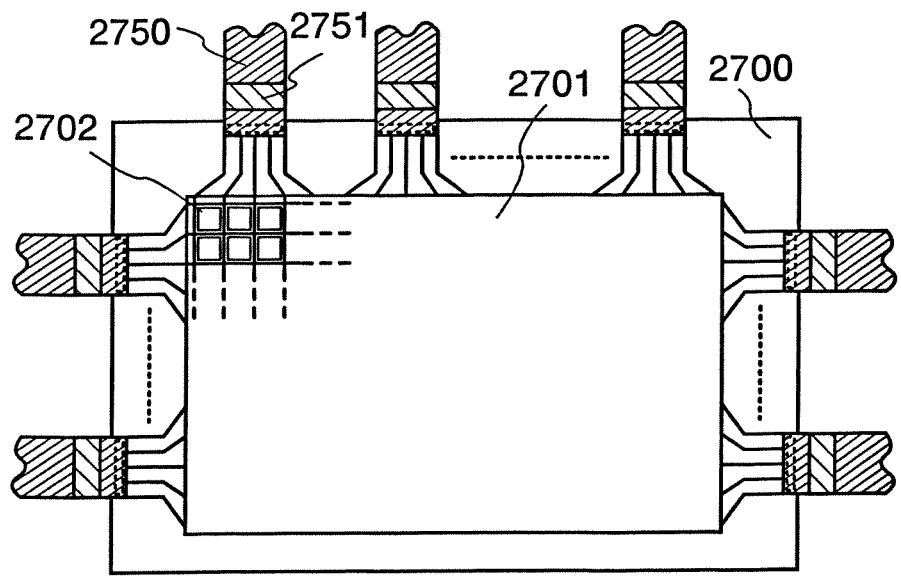

FIG. 16A shows a structure of a display panel in which a signal to be input to the scan line and the signal line is controlled by an external driver circuit; however, a driver IC 2751 may be mounted over the substrate 2700 by a COG (Chip On Glass) method as shown in FIG. 17A. Further, as another mode, a TAB (Tape Automated Bonding) method as shown in FIG. 17B may also be employed. A driver IC may be formed over a single crystal semiconductor substrate or a glass substrate by using a TFT. In FIGS. 17A and 17B, the driver IC 2751 is connected to an FPC (Flexible Printed Circuit) 2750.

Figure 16B:
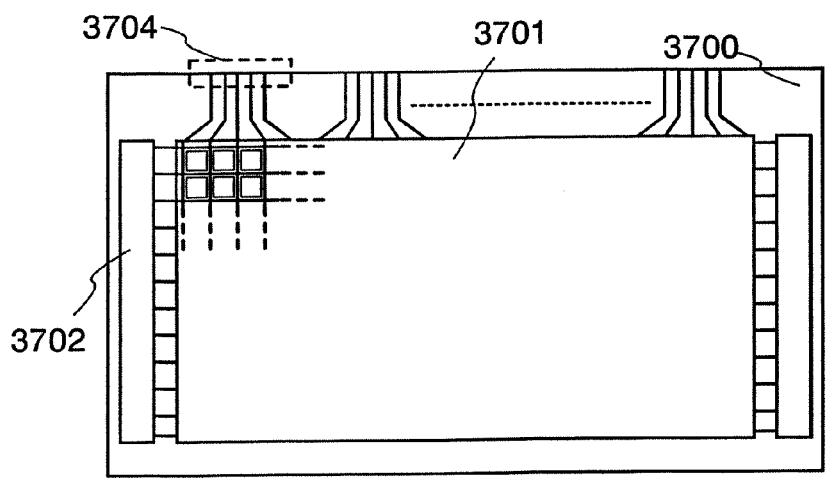
Figure 16C:
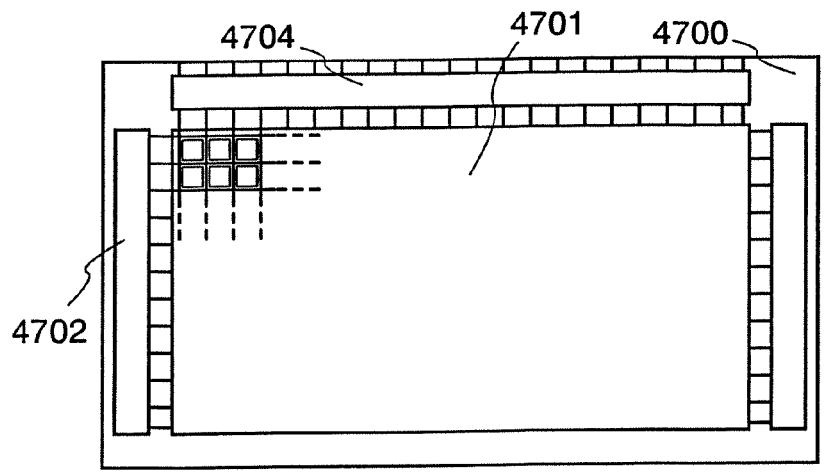

Further, in a case of forming a TFT provided in a pixel by using a crystalline semiconductor, a scan line driver circuit 3702 may be formed over a substrate 3700 as shown in FIG. 16B. In FIG. 16B, a pixel portion 3701 is controlled by an external driver circuit, to which a signal line input terminal 3704 is connected, similarly to FIG. 16A. In a case of forming a TFT provided in a pixel by using a polycrystalline (microcrystalline) semiconductor, a single crystal semiconductor and the like with high mobility, a pixel portion 4701, a scan line driver circuit 4702, and a signal line driver circuit 4704 can be formed to be integrated over a substrate 4700 as shown in FIG. 16C.

As shown in FIG. 6A, over a substrate 100 having an insulated surface, as a base film, a base film 101a is formed by using a silicon nitride oxide (SiNO) film to be 10 to 200 nm thick (preferably 50 to 100 nm thick) by a sputtering method, a PVD (Physical Vapor Deposition) method, or a CVD (Chemical Vapor Deposition) method such as a low pressure CVD method (LPCVD method) or a plasma CVD method, and a base film 101b is stacked thereover by using a silicon oxynitride (SiON) film to be 50 to 200 nm thick (preferably 100 to 150 nm thick). Alternatively, acrylic acid, methacrylic acid, or a derivative thereof, a heat-resistant high-molecular material such as polyimide, aromatic polyamide, or polybenzimidazole, or a siloxane resin material may be used. Further, the following resin material may also be used: a vinyl resin such as poly(vinyl alcohol) or poly(vinyl butyral), an epoxy resin, a phenol resin, a novolac resin, an acrylic resin, a melamine resin, an urethane resin, or the like. In addition, an organic material such as benzocyclobutene, parylene, or polyimide; a composite material containing a water-soluble homopolymer and a water-soluble copolymer; or the like may be used. As a method, a droplet-discharge method, a printing method (a method for forming a pattern, such as screen printing or offset printing), a coating method such as spin coating, a dip method, or the like may also be used. In the present embodiment mode, base films 101a and 101b are formed by a plasma CVD method. The substrate 100 may be a glass substrate, a quartz substrate, a silicon substrate, a metal substrate, or a stainless substrate having a surface covered with an insulating film. Further, a plastic substrate having heat resistance or a flexible substrate such as a film which can resist a processing temperature of the present embodiment mode may also be used. As a plastic substrate, a substrate formed of PET (polyethylene terephthalate), PEN (polyethylene naphthalate), or PES (polyether sulfone) may be used, and as a flexible substrate, a synthetic resin such as acrylic can be used. Since the display device manufactured in the present embodiment mode has a structure in which light from the light-emitting element is emitted through the substrate 100, the substrate 100 is required to have a light-transmitting property.

As the base film, silicon oxide, silicon nitride, silicon oxynitride, silicon nitride oxide and the like may be used in a single layer structure or a stacked structure of two or three layers. It is to be noted that silicon oxynitride is a substance in which the composition ratio of oxygen is higher than that of nitrogen and can also be referred to as silicon oxide containing nitrogen. Similarly, silicon nitride oxide is a substance in which the composition ratio of nitrogen is higher than that of oxygen and can also be referred to as silicon nitride containing oxygen. In the present embodiment mode, a silicon nitride oxide film is formed to be 50 nm thick using $SiH_4$, $NH_3$, $N_2O$, $N_2$, and $H_2$ as a reaction gas, and a silicon oxynitride film is formed to be 100 nm thick using $SiH_4$, and $N_2O$ as a reaction gas. Further, a silicon nitride oxide film may be formed to be 140 nm thick and a silicon oxynitride film to be stacked may be formed to be 100 nm thick.

Subsequently, a semiconductor film is formed over the base film. The semiconductor film may be formed by any method (a sputtering method, an LPCVD method, a plasma CVD method or the like) to be 25 to 200 nm thick (preferably 30 to 150 nm thick). In the present embodiment mode, it is preferable to use a crystalline semiconductor film formed by crystallizing an amorphous semiconductor film by laser irradiation.

A material for forming the semiconductor film can be an amorphous semiconductor (hereinafter also referred to as "AS") formed by a vapor phase growth method or a sputtering method by using a semiconductor material gas typified by silane or germane, a polycrystalline semiconductor formed by crystallizing the amorphous semiconductor by using light energy or heat energy, a semi-amorphous semiconductor (also referred to as microcrystal and hereinafter also referred to as "SAS"), or the like.

A SAS is a semiconductor having an intermediate structure between amorphous and crystalline (including single crystal and polycrystalline) structures and having a third state which is stable in free energy. Moreover, a SAS includes a crystalline region with a short distance order and lattice distortion, and a grain having a diameter of 0.5 to 20 nm can be observed at least in a portion of a film. In a case of containing silicon as a main component, Raman spectrum due to L-O phonon is shifted to the wave number side lower than 520 cm$^{-1}$. The diffraction peaks of (111) and (220), which are believed to be derived from silicon crystal lattice, are observed by X-ray diffraction. A SAS contains hydrogen or halogen by at least 1 atomic % or more for terminating dangling bonds. A SAS is formed by glow discharge decomposition (plasma CVD) of a gas containing silicon. The gas containing silicon is typically $SiH_4$, as well as $Si_2H_6$, $SiH_2Cl_2$, $SiHCl_3$, $SiCl_4$, $SiF_4$ and the like. Further, $F_2$ and $GeF_4$ may be mixed. The gas containing silicon may be diluted with $H_2$, or $H_2$ and one or a plurality of rare gas elements such as He, Ar, Kr, and Ne. The dilution factor is 2- to 1000-fold, pressure is approximately 0.1 to 133 Pa, and power supply frequency is 1 to 120 MHz, more preferably 13 to 60 MHz. A temperature for heating the substrate is preferably 300° C. or lower, and a SAS can also be formed at 100 to 200° C. It is preferable that a concentration of impurities of atmospheric components such as oxygen, nitrogen, and carbon as impurity elements in the film be $1 \times 10^{20}$ atoms/cm$^3$ or lower. In particular, an oxygen concentration is preferably $5 \times 10^{19}$ atoms/cm$^3$ or lower, and more preferably, $1 \times 10^{19}$ atoms/cm$^3$ or lower. Further, when a rare gas element such as helium, argon, krypton, or neon is contained to further increase the lattice distortion, stability is enhanced, and a favorable SAS is obtained. Further, as the semiconductor film, a SAS layer formed by using a gas containing silicon and hydrogen may be stacked over a SAS layer formed by using a gas containing silicon and fluorine.

As an amorphous semiconductor, hydrogenated amorphous silicon may be typically used while polysilicon and the like may be typically used as a crystalline semiconductor. Polysilicon (polycrystalline silicon) includes so-called high temperature polysilicon formed by using polysilicon as a main material, which is formed at a processing temperature of 800° C. or higher, so-called low temperature polysilicon formed by using polysilicon as a main material, which is formed at a processing temperature of 600° C. or lower, polysilicon crystallized by adding an element which promotes crystallization, and the like. It is needless to say that a semi-amorphous semiconductor or a semiconductor containing a crystal phase in a portion of a semiconductor film may also be used as described above.

In a case of using a crystalline semiconductor film for the semiconductor film, the crystalline semiconductor film may be formed by a laser crystallization method, a thermal crystallization method, a thermal crystallization method using an element such as nickel which promotes crystallization, and the like. Further, a microcrystalline semiconductor that is a SAS may be crystallized by laser irradiation to enhance crystallinity. In a case where an element which promotes crystallization is not used, the amorphous semiconductor film is heated for one hour in a nitrogen atmosphere at 500° C. to let out hydrogen so that a hydrogen concentration becomes $1 \times 10^{20}$ atoms/cm$^3$ or lower before irradiating the amorphous semiconductor film with laser light. This is because, if the amorphous semiconductor film contains a lot of hydrogen, the amorphous semiconductor film may be broken by laser light irradiation. Heat treatment for crystallization may be performed using a heating furnace, laser irradiation, irradiation of light emitted from a lamp (also referred to as a lamp annealing), or the like. As a heating method, an RTA method such as a GRTA (Gas Rapid Thermal Anneal) method, an LRTA (Lamp Rapid Thermal Anneal) method or the like may be used.

A method for introducing a metal element into the amorphous semiconductor film is not particularly limited as long as it is a method for forming the metal element over a surface of or inside the amorphous semiconductor film. For example, a sputtering method, a CVD method, plasma treatment (including a plasma CVD method), an absorption method, or a method of coating a solution of metal salt can be used. Among these, a method of using a solution is easy and advantageous in that the concentration of the metal element can be easily controlled. It is desirable to form an oxide film by UV light irradiation in an oxygen atmosphere, a thermal oxidation method, treatment with ozone water containing hydroxyl radical or hydrogen peroxide, or the like to improve wettability of a surface of the amorphous semiconductor film to diffuse an aqueous solution over the entire surface of the amorphous semiconductor film.

In order to obtain crystals of large grain size, a second to fourth harmonic of the fundamental wave of a continuous wave solid state laser is preferably used. Typically, a second (532 nm) or third (355 nm) harmonic of an Nd:YVO$_4$ laser (fundamental wave is 1064 nm) is desirably used. Specifically, laser light of the continuous wave YVO$_4$ laser is converted into a harmonic by using a non-linear optical element, thereby obtaining laser light having output of several Wattage or more. It is preferable to form laser light into a rectangular or elliptical shape on an irradiated surface by an optical system for irradiating the semiconductor film. An energy density at this time is required to be about 0.001 to 100 MW/cm$^2$ (preferably, 0.1 to 10 MW/cm$^2$). The semiconductor film is irradiated with the laser light at a scan rate of about 0.5 to 2000 cm/sec (preferably 10 to 200 cm/sec).

It is preferable that a shape of a laser beam be linear. Accordingly, throughput can be improved. Further, the semiconductor film may be irradiated with laser at an incident angle θ (0<θ<90°) with respect to the surface of the semiconductor film, thereby preventing an interference of the laser.

By scanning such laser and a semiconductor film relatively, laser irradiation can be performed. Further, in the laser irradiation, a marker may be formed to overlap beams at high precision and control positions for starting and finishing laser irradiation. The marker may be formed over a substrate at the same time as an amorphous semiconductor film is formed.

It is to be noted that a laser may be a continuous wave or pulsed gas laser, solid state laser, copper vapor laser, gold vapor laser, or the like. The gas laser includes an excimer laser, an Ar laser, a Kr laser, a He—Cd laser, and the like while the solid state laser includes a YAG laser, a YVO$_4$ laser, a YLF laser, a YAlO$_3$ laser, a Y$_2$O$_3$ laser, a glass laser, a ruby laser, an alexandrite laser, a Ti: sapphire laser, and the like.

The laser crystallization may be performed by a pulsed laser at a repetition rate of 0.5 MHz or higher, which is a drastically higher range of repetition rates than a generally used range of repetition rates of several ten to several hundred Hz. It is said that the time between irradiation of laser light and complete solidification of the semiconductor film is several ten to several hundred nsec in a pulsed laser. Hence, the semiconductor film can be irradiated with the following pulsed laser light during the period from melting of the semiconductor film by laser light to solidification of the semiconductor film by using the foregoing range of a repetition rate. Since a solid-liquid interface can be continuously moved in the semiconductor film, a semiconductor film having crystal grains that have grown continuously in the scanning direction is formed. Specifically, an aggregate of crystal grains having widths of 10 to 30 μm in the scanning direction and widths of about 1 to 5 μm in the direction perpendicular to the scanning direction can be formed. By forming crystal grains of a single crystal extended long along the scanning direction, a semiconductor film which has almost no crystal boundary at least in a channel direction of a thin film transistor can be formed.

The semiconductor film may be irradiated with laser light in an inert gas atmosphere such as a rare gas or nitrogen. Accordingly, roughness of a surface of the semiconductor film can be prevented by laser irradiation, and variation of a threshold voltage due to variation of interface state densities can be prevented.

An amorphous semiconductor film may be crystallized by a combination of heat treatment and laser light irradiation, or one of heat treatment and laser light irradiation may be performed plural times.

In the present embodiment mode, a crystalline semiconductor film is formed by forming an amorphous semiconductor film over the base film 101*b* and crystallizing the amorphous semiconductor film. As the amorphous semiconductor film, amorphous silicon formed by using a reaction gas of SiH$_4$ and H$_2$ is used. In the present embodiment mode, the base films 101*a* and 101*b*, and the amorphous semiconductor film are continuously formed by changing a reaction gas without breaking vacuum in the same chamber at the same temperature of 330° C.

After removing an oxide film formed over the amorphous semiconductor film, an oxide film is formed to be 1 to 5 nm thick by UV light irradiation in an oxygen atmosphere, a thermal oxidization method, treatment with ozone water containing hydroxyl radical or hydrogen peroxide solution, or the like. In the present embodiment mode, Ni is used as an element for promoting crystallization. An aqueous solution containing 10 ppm of Ni acetate is coated by a spin coating method.

In the present embodiment mode, after performing heat treatment by an RTA method at 750° C. for three minutes, the oxide film formed over the semiconductor film is removed and laser irradiation is performed. The amorphous semiconductor film is crystallized by the aforementioned crystallization treatment to form a crystalline semiconductor film.

In a case of performing crystallization using a metal element, a gettering step is performed to reduce or remove the metal element. In the present embodiment mode, the metal element is captured by using an amorphous semiconductor film as a gettering sink. First, an oxide film is formed over the crystalline semiconductor film by UV light irradiation in an oxygen atmosphere, thermal oxidation, treatment with ozone water containing hydroxyl radical or hydrogen peroxide, or the like. The oxide film is preferably made thick by heat treatment. Then, an amorphous semiconductor film is formed to be 50 nm thick by a plasma CVD method (a condition of the present embodiment mode: 350 W and 35 Pa).

Thereafter, heat treatment is performed at 744° C. for three minutes by an RTA method to reduce or remove the metal element. The heat treatment may also be performed in a nitrogen atmosphere. Then, the amorphous semiconductor film as a gettering sink and the oxide film formed over the amorphous semiconductor film are removed by hydrofluoric acid and the like, thereby obtaining a crystalline semiconductor film 102 in which the metal element is reduced or removed (see FIG. 6A). In the present embodiment mode, the amorphous semiconductor film as a gettering sink is removed by using TMAH (Tetramethyl Ammonium Hydroxide).

The semiconductor film formed as described above may be doped with a slight amount of impurity elements (boron or phosphorus) for controlling a threshold voltage of a thin film transistor. This doping of impurity elements may be performed to the amorphous semiconductor film before crystallization. When the amorphous semiconductor film is doped with impurity elements, the impurities can be activated by heat treatment for crystallization later. Further, a defect and the like generated by doping can be improved as well.

Subsequently, the crystalline semiconductor film 102 is patterned into a desired shape by using a mask. In the present embodiment mode, after removing the oxide film formed over the crystalline semiconductor film 102, another oxide film is formed. Then, a photo mask is formed, and semiconductor layers 103, 104, 105, and 106 are formed by processing with a photolithography method.

An etching process may be either plasma etching (dry etching) or wet etching. In a case of processing a large area substrate, plasma etching is more suitable. As an etching gas, a gas containing fluorine or a gas containing chlorine such as $CF_4$, $NF_3$, $Cl_2$, or $BCl_3$ is used, to which an inert gas such as He or Ar may be appropriately added. In a case of employing an etching process by atmospheric pressure discharge, local electric discharge can also be realized, which does not require a mask layer to be formed over an entire surface of the substrate.

In the present invention, a conductive layer for forming a wiring layer or an electrode layer, a mask layer for forming a predetermined pattern, or the like may be formed by a method capable of selectively forming a pattern, such as a droplet-discharge method. In the droplet-discharge (eject) method (also referred to as an inkjet method in accordance with the method thereof), a predetermined component (a conductive layer, an insulating layer, or the like) can be formed by selectively discharging (ejecting) liquid of a composition prepared for a specific purpose. At that time, a process for controlling wettability and adhesion may be performed in a region to be formed. Additionally, a method for transferring or describing a pattern, for example, a printing method (a method for forming a pattern such as screen printing or offset printing) or the like can also be used.

In the present embodiment mode, a resin material such as an epoxy resin, an acrylic resin, a phenol resin, a novolac resin, a melamine resin, or an urethane resin is used as a mask. Alternatively, an organic material such as benzocyclobutene, parylene, or polyimide having a light transmitting property; a compound material formed by polymerization of siloxane-based polymers or the like; a composition material containing a water-soluble homopolymer and a water-soluble copolymer; and the like can also be used. In addition, a commercially available resist material including a photosensitive agent may also be used. For example, it is possible to use a typical positive resist, namely, a novolac resin and a naphthoquinonediazide compound that is a photosensitive agent; or a negative resist, namely, a base resin, diphenylsilanediol, and an acid generating agent. The surface tension and the viscosity of a material are appropriately adjusted by controlling the solvent concentration, adding a surfactant, or the like, when a droplet-discharge method is used.

The oxide film over the semiconductor film is removed, and a gate insulating layer 107 covering the semiconductor layers 103, 104, 105, and 106 is formed. The gate insulating layer 107 is formed of an insulating film containing silicon with a thickness of 10 to 150 nm by a plasma CVD method or a sputtering method. The gate insulating layer 107 may be formed by using a material such as an oxide material or nitride material of silicon, typified by silicon nitride, silicon oxide, silicon oxynitride, and silicon nitride oxide, and may have a stacked layer structure or a single layer structure. Further, the insulating layer may be a stacked layer of three layers including a silicon nitride film, a silicon oxide film, and a silicon nitride film. A single layer or a stacked layer of two layers of a silicon oxynitride film may be employed as well. Preferably, a silicon nitride film with a dense film quality is used. A thin silicon oxide film may be formed between the semiconductor layer and the gate insulating layer with a thickness of 1 to 100 nm, preferably 1 to 10 nm, and more preferably 2 to 5 nm. As a method for forming a thin silicon oxide film, the surface of the semiconductor region is oxidized by a GRTA method, an LRTA method, or the like to form a thermal oxide film, thereby forming a silicon oxide film with a thin thickness. It is to be noted that a rare gas element such as argon may be added to a reaction gas and be mixed into an insulating film to be formed in order to form a dense insulating film having little gate leak current at a low film formation temperature. In the present embodiment mode, a silicon oxynitride film is formed to be 115 nm thick as the gate insulating layer 107.

Subsequently, a first conductive film 108 having a thickness of 20 to 100 nm and a second conductive film 109 having a thickness of 100 to 400 nm, each of which serves as a gate electrode layer, are stacked over the gate insulating layer 107 (FIG. 6B). The first conductive film 108 and the second conductive film 109 can be formed by a sputtering method, an evaporation method, a CVD method or the like. The first conductive film 108 and the second conductive film 109 may be formed of an element selected from tantalum (Ta), tungsten (W), titanium (Ti), molybdenum (Mo), aluminum (Al), copper (Cu), chromium (Cr), and neodymium (Nd), or an alloy material or compound material having the aforementioned element as a main component. A semiconductor film typified by a polycrystalline silicon film that is doped with an impurity element such as phosphorus or an AgPdCu alloy may also be used as the first conductive film 108 and the second conductive film 109. The conductive film is not limited to the two-layer structure, and, for example, may have a three-layer structure in which a tungsten film with a thickness of 50 nm as a first conductive film, an alloy film of aluminum and silicon (Al—Si) with a thickness of 500 nm as a second film, and a titanium nitride film with a thickness of 30 nm as a third conductive film are sequentially stacked. In a case of the three-layer structure, tungsten nitride may be used instead of tungsten as the first conductive film; an alloy film of aluminum and titanium (Al—Ti) may be used instead of an alloy film of aluminum and silicon (Al—Si) as the second conductive film; or a titanium film may be used instead of a titanium nitride film as the third conductive film as well. Further, a single-layer structure may also be used. In the present embodiment mode, tantalum nitride (TaN) with a thickness of 30 nm is formed as the first conductive film 108 and tungsten (W) with a thickness of 370 nm is formed as the second conductive film 109.

Then, masks 110a, 110b, 110c, 110d, 110e, 110f, and 110g using a resist are formed by a photolithography method, and the first conductive film 108 and the second conductive film 109 are patterned into a desired shape to form first gate electrode layers 121, 122, 124, 125 and 126, and conductive layers 157, 111, 112, 114, 115, 116 and 156 (see FIG. 6C). The first gate electrode layers 121, 122, 124, 125, and 126, the first conductive layer 157, and the conductive layers 111, 112, 114, 115, 116, and 156 can be etched to have a desired taper shape by appropriately adjusting an etching condition (the amount of electric power applied to a coil-shaped electrode layer, the amount of electric power applied to an electrode layer on a substrate side, electrode temperature on a substrate side, or the like) by an ICP (Inductively Coupled Plasma) etching method. Further, an angle and the like of the taper shape can be controlled by the shapes of the masks 110a, 110b, 110d, 110e, 110f and 110g. As an etching gas, a gas containing chlorine typified by $Cl_2$, $BCl_3$, $SiCl_4$, $CCl_4$, or the like, a gas containing fluorine typified by $CF_4$, $CF_5$, $SF_6$, $NF_3$, or the like, or $O_2$ can be appropriately used. In the present embodiment mode, the second conductive film 109 is etched using an etching gas containing $CF_5$, $Cl_2$, and $O_2$, and then, the first conductive film 108 is continuously etched using an etching gas containing $CF_5$ and $Cl_2$.

Subsequently, the conductive layers 111, 112, 114, 115, 116, and 156 are patterned into a desired shape using the masks 110a, 110b, 110d, 110f, and 110g. At this time, the conductive layers are etched with an etching condition of high selection ratio of the first conductive film 108 which forms the first gate electrode layers with respect to the second conductive film 109 which forms the conductive layers. By this etching, the conductive layers 111, 112, 114, 115, 116 and 156 are etched to form second gate electrode layers 131, 132, 134, 135, and 136, and a second conductive layer 158. In the present embodiment mode, the second gate electrode layers 131, 132, 134, 135, and 136, and the second conductive layer 158 have also a taper shape, in which a taper angle is larger than that of the first gate electrode layers 121, 122, 124, 125, and 126, and the first conductive layer 157. It is to be noted that the taper angle is an angle of a side surface with respect to the surfaces of the first gate electrode layer, the second gate electrode layer, and the conductive layer. Accordingly, when the taper angle is increased to 90°, the conductive layer has a perpendicular side surface. The angle of the side surface may be a shape that is almost perpendicular. In the present embodiment mode, the second gate electrode is formed by using an etching gas of $Cl_2$, $SF_6$, and $O_2$.

In the present embodiment mode, each of the first gate electrode layers, the conductive layers, and the second gate electrode layers is formed to have a taper shape, and thus, both of the two gate electrode layers have taper shapes. However, the present invention is not limited thereto, and one of the gate electrode layers may have a taper shape while the other has a perpendicular side surface by anisotropic etching. As described in the present embodiment mode, the taper angles may be different or the same between the stacked gate electrode layers. With a taper shape, coverage of a film to be stacked thereover is improved and a defect is reduced, and thus, reliability is improved.

The gate electrode layer can have various structures in accordance with a layout and a shape thereof. Therefore, a display device that is manufactured also has various structures. When an impurity region in a semiconductor layer is formed in a self-alignment manner using a gate electrode layer as a mask, a structure or a concentration distribution of the impurity region is changed depending on the structure of the gate electrode layer. By choosing a design considering the above described matter, a thin film transistor having a desired function can be manufactured.

Through the aforementioned steps, a gate electrode layer 117 formed of the first gate electrode layer 121 and the second gate electrode layer 131, and a gate electrode layer 118 formed of the first gate electrode layer 122 and the second gate electrode layer 132 can be formed in a peripheral driver circuit region 204; and a gate electrode layer 127 formed of the first gate electrode layer 124 and the second gate electrode layer 134, a gate electrode layer 128 formed of the first gate electrode layer 125 and the second gate electrode layer 135, a gate electrode layer 129 formed of the first gate electrode layer 126 and the second gate electrode layer 136, and a conductive layer 130 formed of the first conductive layer 157 and the second conductive layer 158 can be formed in a pixel region 206 (see FIG. 6D). In the present embodiment mode, the gate electrode layers are formed by dry etching; however, wet etching may also be employed.

The gate insulating layer 107 may be etched to some extent and reduced in thickness by an etching step for forming the gate electrode layers.

By forming a width of the gate electrode layer to be narrow, a thin film transistor capable of high speed operation can be formed. Two methods for forming a width of the gate electrode layer in a channel direction to be narrow will be described below.

A first method is to form a mask for a gate electrode layer, slim the mask in a width direction by etching, ashing and the like, and then form a mask with a narrower width. By using the mask formed with a narrower width in advance, the gate electrode layer can also be formed in a shape with a narrower width.

A second method is to form a normal mask and then form a gate electrode layer using the mask. Then, the obtained gate electrode layer is side-etched in a width direction to be narrowed. Accordingly, a gate electrode layer with a narrower width can be finally formed. Through the aforementioned steps, a thin film transistor with a short channel length can be formed, which can realize a circuit with a thin film transistor capable of high speed operation.

Next, an impurity element 151 which imparts n-type conductivity is added using the gate electrode layers 117, 118, 127, 128, and 129, and the conductive layer 130 as masks to form first n-type impurity regions 140a, 140b, 141a, 141b, 142a, 142b, 142c, 143a, and 143b (see FIG. 7A). In the present embodiment mode, doping is performed by using phosphine ($PH_3$) (the composition ratio of P is 5%) as a doping gas containing an impurity element at a gas flow rate of 80 sccm, a beam current of 54 μA/cm, an acceleration voltage of 50 kV, and a dose amount of $7.0\times10^{13}$ ions/cm$^2$. Here, doping is performed so that the impurity element which imparts n-type conductivity is contained in a concentration of about $1\times10^{17}$ to $5\times10^{18}$ atoms/cm$^3$ in the first n-type impurity regions 140a, 140b, 141a, 141b, 142a, 142b, 142c, 143a, and 143b. In the present embodiment mode, phosphorus (P) is used as the impurity element which imparts n-type conductivity.

In the present embodiment mode, regions of the impurity regions, which overlap with the gate electrode layers with the gate insulating layer interposed therebetween, are denoted as Lov regions. Further, regions of the impurity regions, which do not overlap with the gate electrode layers with the gate insulating layer interposed therebetween, are denoted as Loff regions. In FIGS. 7A to 7C, the impurity regions are shown by hatching spaces. This does not mean that the blank spaces are not doped with impurity elements, but makes it easy to understand that the concentration distribution of the impurity element in these regions reflects the mask and the doping condition. It is to be noted that this is the same in other drawings of the present specification.

Subsequently, masks 153a, 153b, 153c, and 153d which cover the semiconductor layer 103, a part of the semiconductor layer 105, and the semiconductor layer 106 are formed. By using the masks 153a, 153b, 153c, and 153d, and the second gate electrode layer 132 as masks, an impurity element 152 which imparts n-type conductivity is added to form second n-type impurity regions 144a and 144b, third n-type impurity regions 145a and 145b, second n-type impurity regions 147a, 147b and 147c (see FIG. 7B). In the present embodiment mode, doping is performed by using $PH_3$ (the composition ratio of P is 5%) as a doping gas containing an impurity element at a gas flow rate of 80 sccm, a beam current of 540 μA/cm, an acceleration voltage of 70 kV, and a dose amount of $5.0\times10^{15}$ ions/cm$^2$. Here, doping is performed so that each of the second n-type impurity regions 144a and 144b contains the impurity element which imparts n-type conductivity in a concentration of about $5\times10^{19}$ to $5\times10^{20}$ atoms/cm$^3$. The third n-type impurity regions 145a and 145b are formed to contain the impurity element which imparts n-type conductivity in almost the same concentration as the third n-type impurity regions 148a, 148b, 148c, and 148d or a little higher concentration. Further, a channel formation region 146 is formed in the semiconductor layer 104, and a channel formation regions 149a and 149b are formed in the semiconductor layer 105.

The second n-type impurity regions 144a, 144b, 147a, 147b, and 147c are high concentration n-type impurity regions which function as source and drain regions. On the other hand, the third n-type impurity regions 145a, 145b, 148a, 148b, 148c, and 148d are low concentration impurity regions which function as LDD (Lightly Doped Drain) regions. The n-type impurity regions 145a and 145b overlapped with the first gate electrode layer 122 with the gate insulating layer 107 interposed therebetween are Lov regions which can relieve an electric field around a drain region and suppress deterioration of an on current due to a hot carrier. As a result, a thin film transistor capable of high speed operation can be formed. On the other hand, the third n-type impurity regions 148a, 148b, 148c, and 148d are formed in Loff regions which are not overlapped with the gate electrode layers 127 and 128, and can relieve an electric field around a drain and suppress deterioration due to hot carrier injection as well as reduce an off current. As a result, a semiconductor device with high reliability and low power consumption can be manufactured.

Subsequently, the masks 153a, 153b, 153c, and 153d are removed, and masks 155a and 155b which cover the semiconductor layers 103 and 105 are formed. By adding an impurity element 154 which imparts p-type conductivity using the masks 155a and 155b, the gate electrode layers 117 and 129, and the conductive layer 130 as masks, first p-type impurity regions 160a, 160b, 163a and 163b, second p-type impurity regions 161a, 161b, 164a, 164b, and 164c are formed (see FIG. 7C). In the present embodiment mode, boron (B) is used as an impurity element; therefore, doping is performed using diborane ($B_2H_6$) (the composition ratio of B is 15%) as a doping gas containing an impurity element at a gas flow rate of 70 sccm, a beam current of 180 μA/cm, an acceleration voltage of 80 kV, and a dose amount of $2.0\times10^{15}$ ions/cm$^2$. Here, doping is performed so that the first p-type impurity regions 160a, 160b, 163a and 163b, the second p-type impurity regions 161a, 161b, 164a, and 164b contain the impurity element which imparts p-type conductivity in a concentration of about $1\times10^{20}$ to $5\times10^{21}$ atoms/cm$^3$. In the present embodiment mode, the second p-type impurity regions 161a, 161b, 164a, and 164b are formed in a self-alignment manner by reflecting the shapes of the gate electrode layers 117 and 129 to contain an impurity element in a lower concentration than that of the first p-type impurity regions 160a, 160b, 163a, and 163b. Further, a channel formation region 162 is formed in the semiconductor layer 103 and a channel formation region 165 is formed in the semiconductor layer 106. A part of the conductive layer 130 also overlaps with the semiconductor layer 106 in addition to the gate electrode layer 129. Therefore, similarly to the display device in Embodiment Mode 1, the conductive layer 130 also serves as a mask when the impurity element 154 which imparts p-type conductivity is added. Thus, a region of the semiconductor layer 106, which overlaps with the second conductive layer 158, is not doped with the impurity element which imparts p-type conductivity and becomes a region 159, and a region of the semiconductor layer 106, which overlaps only with the first conductive layer 157, becomes the second p-type impurity region 164c.

The first p-type impurity regions 160a, 160b, 163a, and 163b are high-concentration p-type impurity regions and serve as source and drain regions. On the other hand, the second p-type impurity regions 161a, 161b, 164a, and 164b are low-concentration impurity regions which function as LDD (Lightly Doped Drain) regions. The second p-type impurity regions 161a, 161b, 164a, and 164b overlapped with the first gate electrode layers 121 and 126 with the gate insulating layer 107 interposed therebetween are Lov regions which can relieve an electric field around a drain and suppress deterioration of an on current due to a hot carrier.

The masks 155a and 155b are removed by $O_2$ ashing or using a resist removing solution, and the oxide film is also removed. After that, an insulating film, namely, so-called sidewall may be formed so as to cover side surfaces of the gate electrode layers. The sidewalls can be formed of an insulating film containing silicon by a plasma CVD method or a low pressure CVD (LPCVD) method.

In order to activate the impurity element, heat treatment, strong light irradiation, or laser light irradiation may be performed. At the same time as the activation, plasma damage to the gate insulating layer and to an interface between the gate insulating layer and the semiconductor layer can be recovered.

Subsequently, an interlayer insulating layer which covers the gate electrode layers and the gate insulating layers is formed. In the present embodiment mode, a stacked-layer structure of insulating films 167 and 168 is employed (see FIG. 8A). A silicon nitride oxide film is formed as the insulating film 167 to be 100 nm thick, and an silicon oxynitride film is formed as the insulating film 168 to be 900 nm thick to form a stacked-layer structure. Further, a stacked-layer structure of three layers may be employed by forming a silicon oxynitride film to be 30 nm thick, a silicon nitride oxide film to be 140 nm thick, and a silicon oxynitride film to be 800 nm thick to cover the gate electrode layers and the gate insulating layer. In the present embodiment mode, the insulating films 167 and 168 are continuously formed by a plasma CVD method similarly to the base film. The insulating films 167 and 168 are not limited to the above materials and may be a silicon nitride film, a silicon nitride oxide film, a silicon oxynitride film, and a silicon oxide film formed by a sputtering method or a plasma CVD method. Alternatively, a single layer structure or a stacked-layer structure of three or more layers of other insulating films containing other silicon may also be employed.

Further, heat treatment is performed in a nitrogen atmosphere at 300 to 550° C. for 1 to 12 hours, and the semiconductor layer is hydrogenated. Preferably, this step is performed at 400 to 500° C. Through this step, dangling bonds in the semiconductor layer can be terminated by hydrogen contained in the insulating film 167 that is an interlayer insulating layer. In the present embodiment mode, heat treatment is performed at 410° C. for one hour.

In addition, the insulating films 167 and 168 can also be formed of a material selected from substances such as aluminum nitride (AlN), aluminum oxynitride (AlON), aluminum nitride oxide containing more nitrogen than oxygen (AlNO), aluminum oxide, diamond-like carbon (DLC), a nitrogen-containing carbon film (CN), polysilazane and other substance containing an inorganic insulating material. A siloxane resin may also be used. Further, an organic insulating material such as polyimide, acrylic, polyamide, polyimide amide, resist, or benzocyclobutene may be used. A coated film with a favorable planarity formed by a coating method may also be used.

Figure 8A:
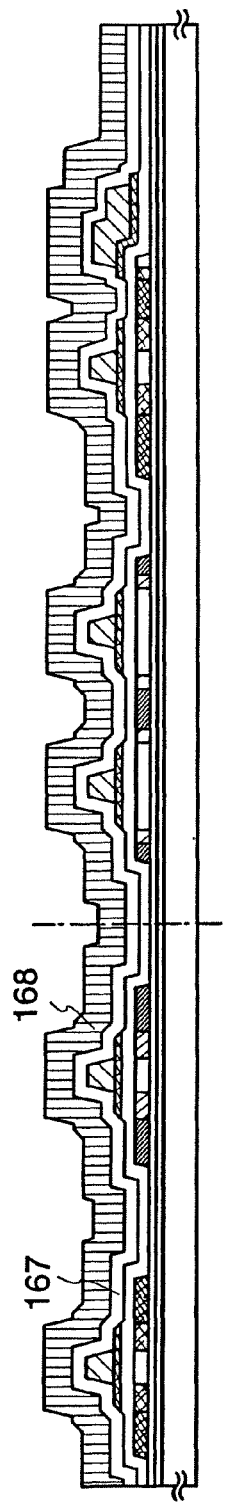
FIGS. 8A to 8C are views showing a manufacturing method of the display device according to the present invention.
Figure 8B:
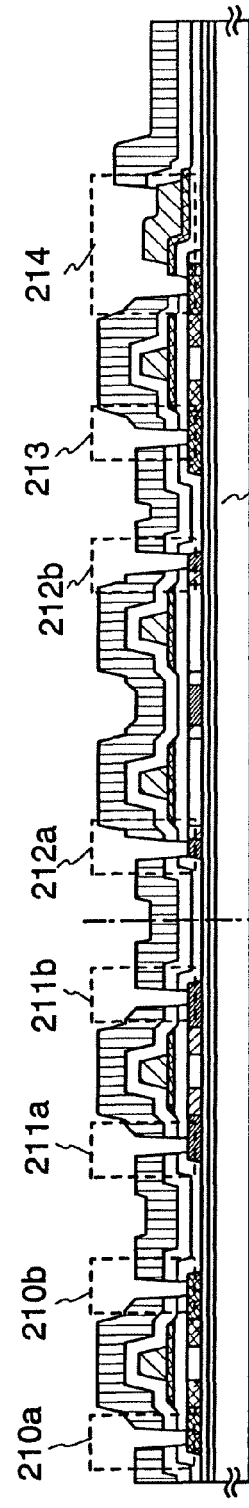

Subsequently, openings (contact holes) 210a, 210b, 211a, 211b, 212a, 212b, 213 and 214, which reach the semiconductor layer, are formed in the insulating films 167 and 168, and the gate insulating layer 107 using a mask made of a resist (see FIG. 8B). Etching may be performed once or plural times in accordance with a selection ratio of a material to be used. In the present embodiment mode, first etching is performed with a condition that the insulating film 167 that is a silicon nitride oxide film and the gate insulating layer 107 have a selection ratio to the insulating film 168 that is a silicon oxynitride film, and the insulating film 168 is removed. Then, the insulating film 167 and the gate insulating layer 107 are removed by second etching to form the openings, which reach the first p-type impurity regions 160a, 160b, 163a and 163b and the second n-type impurity regions 144a, 144b, 147a and 147b as source regions or drain regions, the first conductive layer 157 and the second conductive layer 158. In the present embodiment mode, the first etching is performed by wet etching whereas the second etching is performed by dry etching. A hydrofluoric acid-based solution such as a mixed solution of ammonium hydrogen fluoride and ammonium fluoride may be used as an etchant of wet etching. As an etching gas, a chlorine-based gas typified by $Cl_2$, $BCl_3$, $SiCl_4$, $CCl_4$, or the like, a fluorine-based gas typified by $CF_4$, $SF_6$, $HF_3$, or the like, or $O_2$ can be appropriately used. Further, an inert gas may be added to an etching gas to be used. As an inert element to be added, one or a plurality of elements selected from He, Ne, Ar, Kr, and Xe can be used.

A conductive film is formed so as to cover the openings, and the conductive film is etched to form source electrode layers or drain electrode layers 169a, 169b, 170a, 170b, 171a, 171b, 172a, and 172b, which are electrically connected to a part of each source region or drain region. The source electrode layer or the drain electrode layer 172b is formed in the opening 214 so as to be in contact with and electrically connected to the first p-type impurity region 163b, the first conductive layer 157, and the second conductive layer 158.

The source electrode layer or the drain electrode layer can be formed by forming a conductive film by a PVD method, a CVD method, an evaporation method or the like, and then etching the conductive film into desired shapes. Further, a conductive layer can be selectively formed in a predetermined position by a droplet-discharge method, a printing method, an electrolytic plating method or the like. Further, a reflow method or a damascene method may also be used. The source electrode layer or the drain electrode layer is formed of a metal such as Ag, Au, Cu, Ni, Pt, Pd, Ir, Rh, W, Al, Ta, Mo, Cd, Zn, Fe, Ti, Zr, or Ba, or an alloy of the metals or the metal and Si and Ge, or a metal nitride of the metal. Further, a stacked-layer structure thereof may also be used. In the present embodiment mode, titanium (Ti) is formed to be 100 nm thick, an alloy of aluminum and silicon (Al—Si) is formed to be 700 nm thick, and titanium (Ti) is formed to be 200 nm thick, and then patterned into a desired shape.

Figure 8C:
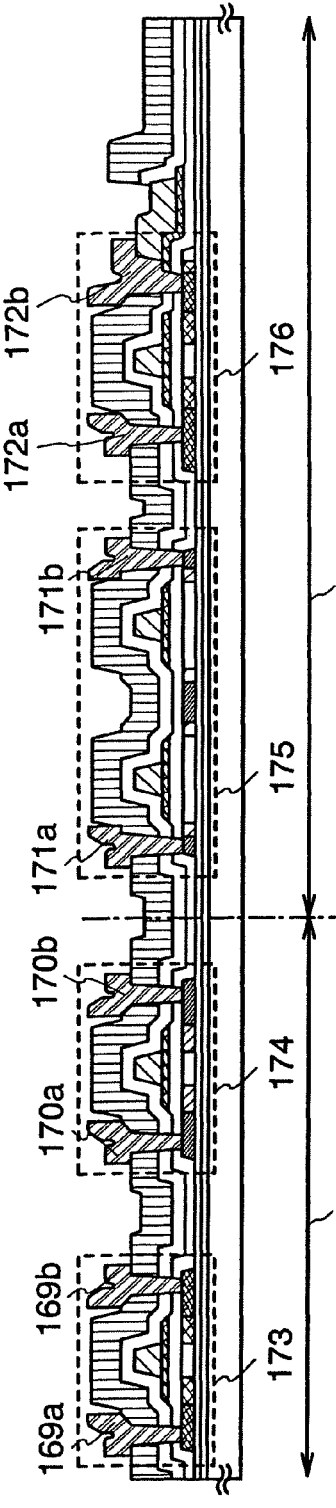

Through the above steps, an active matrix substrate can be formed, in which a p-channel thin film transistor 173 having a p-type impurity region in a Lov region and an n-channel thin film transistor 174 having an n-type impurity region in a Lov region are provided in the peripheral driver circuit region 204; and a multi-channel type n-channel thin film transistor 175 having an n-type impurity region in a Loff region and a p-channel thin film transistor 176 having a p-type impurity region in a Lov region are provided in the pixel region 206 (see FIG. 8C).

The active matrix substrate can be used for a light-emitting display device having a self-light-emitting element, a liquid crystal display device having a liquid crystal element, and other display devices.

FIGS. 9A and 9B show manufacturing steps of the display device, in which a separation region 201 for separation by scribing, an external terminal connection region 202 that is a portion where an FPC is attached, a wiring region 203 that is a lead wiring region for the peripheral region, the peripheral driver circuit region 204, and the pixel region 206 are provided. Wirings 179a and 179b are provided in the wiring region 203, and a terminal electrode layer 178 connected to an external terminal is provided in the external terminal connection region 202.

Then, a first electrode layer 185 (also referred to as a pixel electrode layer) is formed to be in contact with the second conductive layer 158 (see FIG. 9A). Since the second conductive layer 158 is electrically connected to the source electrode layer or the drain electrode layer 172b, the first electrode layer 185 and the source electrode layer or the drain electrode layer 172b are electrically connected to each other with the first conductive layer 157 and the second conductive layer 158 interposed therebetween.

In the present embodiment mode, a light-emitting element is used as a display element, and the first electrode layer 185 has a light-transmitting property since light from the light-emitting element is extracted from the first electrode layer 185 side. The first electrode layer 185 is formed by using a light-transmitting conductive material.

In the present invention, the first electrode layer 185 that is a light-transmitting electrode layer may be specifically formed by using a transparent conductive film formed of a light-transmitting conductive material, and indium oxide containing tungsten oxide, indium zinc oxide containing tungsten oxide, indium oxide containing titanium oxide, indium tin oxide containing titanium oxide, and the like can be used. Indium tin oxide (ITO), indium zinc oxide (IZO), indium tin oxide doped with silicon oxide (ITSO), and the like can also be used as a matter of course.

An example of a composition ratio of each light-transmitting conductive material is described. In indium oxide containing tungsten oxide, the composition ratio of tungsten oxide may be 1.0 wt % and indium oxide may be 99.0 wt %. In indium zinc oxide containing tungsten oxide, tungsten oxide may be 1.0 wt %, zinc oxide may be 0.5 wt %, and indium oxide may be 98.5 wt %. In indium oxide containing titanium oxide, titanium oxide may be 1.0 to 5.0 wt % and indium oxide may be 99.0 to 95.0 wt %. In indium tin oxide (ITO), tin oxide may be 10.0 wt % and indium oxide may be 90.0 wt %. In indium zinc oxide (IZO), zinc oxide may be 10.7 wt % and indium oxide may be 89.3 wt %. Further, in indium tin oxide containing titanium oxide, titanium oxide may be 5.0 wt %, tin oxide may be 10.0 wt %, and indium oxide may be 85.0 wt %. The composition ratios as described above are just examples, and a composition ratio may be set appropriately.

In addition, even in a case of a non-light-transmitting material such as a metal film is used, when the thickness is made thin (for example, about 5 to 30 nm) so as to be able to transmit light, light can be emitted from the first electrode layer 185. As a metal thin film that can be used for the first electrode layer 185, titanium, tungsten, nickel, gold, platinum, silver, aluminum, magnesium, calcium, lithium and a conductive film composed of an alloy thereof can be given.

The first electrode layer 185 can be formed by an evaporation method, a sputtering method, a CVD method, a printing method, a droplet-discharge method or the like. In the present embodiment mode, the first electrode layer 185 is manufactured by using indium zinc oxide containing tungsten oxide by sputtering. The first electrode layer 185 is preferably used in a total thickness of 100 to 800 nm, and in the present embodiment mode, 185 nm.

The first electrode layer 185 may be cleaned or polished by a CMP method or by using a porous material such as poly(vinyl alcohol) so that the surface thereof is planarized. In addition, after polishing using a CMP method, ultraviolet ray irradiation, oxygen plasma treatment, or the like may be performed on the surface of the first electrode layer 185.

Heat treatment may be performed after forming the first electrode layer 185. By the heat treatment, moisture included in the first electrode layer 185 is released. Accordingly, degasification or the like is not caused by the first electrode layer 185. Even when a light-emitting material which is easily deteriorated by moisture is formed over the first electrode layer, the light-emitting material is not deteriorated; therefore, a highly reliable display device can be manufactured. In the present embodiment mode, an indium zinc oxide film containing tungsten oxide is used for the first electrode layer 185 so that it is hardly crystallized even when baking is performed, and an amorphous state is kept. Hence, the first electrode layer 185 has high planarity, and short-circuit with the second electrode layer is hardly caused even when a layer containing an organic compound is thin.

Next, an insulating layer 186 (also referred to as a partition wall or a barrier) is formed to cover an end portion of the first electrode layer 185 and the source electrode layers or the drain electrode layers (see FIG. 9B). In addition, in the same step, insulating layers 187a and 187b are formed in the external terminal connection region 202. In the present embodiment mode, photosensitive polyimide is used for the insulating layer 186.

When a selection ratio of the first electrode layer 185 to the insulating layer 186 is high, the first electrode layer 185 can function as an etching stopper when etching is performed to form the insulating layer 186 functioning as a partition wall which covers a part of the first electrode layer 185.

The insulating layer 186 may be formed by using silicon oxide, silicon nitride, silicon oxynitride, aluminum oxide, aluminum nitride, aluminum oxynitride, or other inorganic insulating material; acrylic acid, methacrylic acid, or a derivative thereof; a heat-resistant high-molecular material such as polyimide, aromatic polyamide, or polybenzimidazole; or a siloxane resin. Alternatively, the insulating layer 186 may be formed by using a photosensitive or non-photosensitive material such as acrylic or polyimide. The insulating layer 186 preferably has a shape where a radius of curvature continuously changes. Accordingly, coverage of an electroluminescent layer 188 and a second electrode layer 189 formed thereover is improved.

Figure 10A:
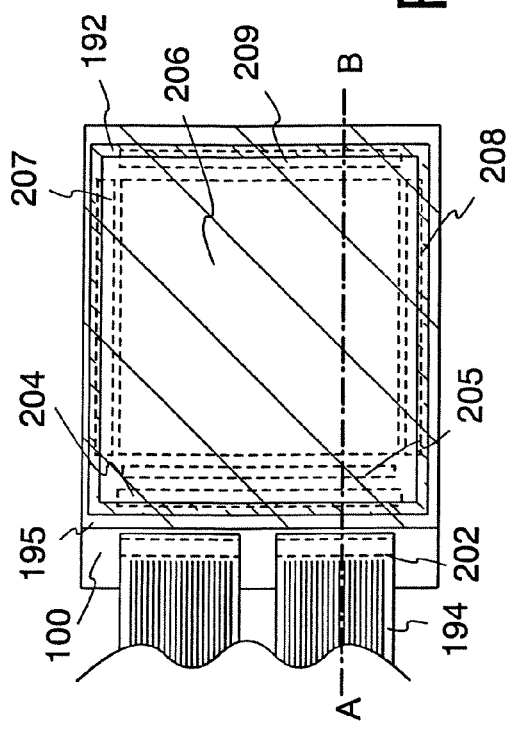
FIGS. 10A and 10B are views showing a display device according to the present invention.

As shown in FIG. 10A, in a connection region 205, a wiring layer formed by the same material and through the same step as the second electrode layer is electrically connected to a wiring layer formed by the same material and through the same step as the gate electrode layer. For this connection, an opening is formed to expose the wiring layer formed by the same material and through the same step as the gate electrode layer, but a step around the opening is covered with the insulating layer 186 to be gently sloping, and thus, the coverage of the second electrode layer 189 to be stacked thereover can be improved.

Further, in order to further improve the reliability, it is preferable to perform degasification of the substrate by vacuum heating before forming the electroluminescent layer 188. For example, it is desirable to perform heat treatment for removing a gas contained in the substrate in a reduced pressure atmosphere or an inert gas atmosphere at 200 to 400° C., or preferably 250 to 350° C., before performing evaporation of an organic compound material. Further, it is preferable to form the electroluminescent layer 188 by a vacuum evaporation method or a droplet-discharge method under a reduced pressure without exposing the substrate to air. By this heat treatment, moisture contained in or attached to a conductive film to be the first electrode layer or an insulating layer (partition wall) can be discharged. This heat treatment can be combined with a prior heating step as long as the substrate can be transferred in a vacuum chamber without breaking the vacuum, and only the prior heat treatment may be required to be performed once after forming an insulating layer (partition wall). Here, by forming the interlayer insulating film and the insulating layer (partition wall) using a highly heat resistant substance, a heat treatment step for improving the reliability can be sufficiently performed.

Figure 10B:
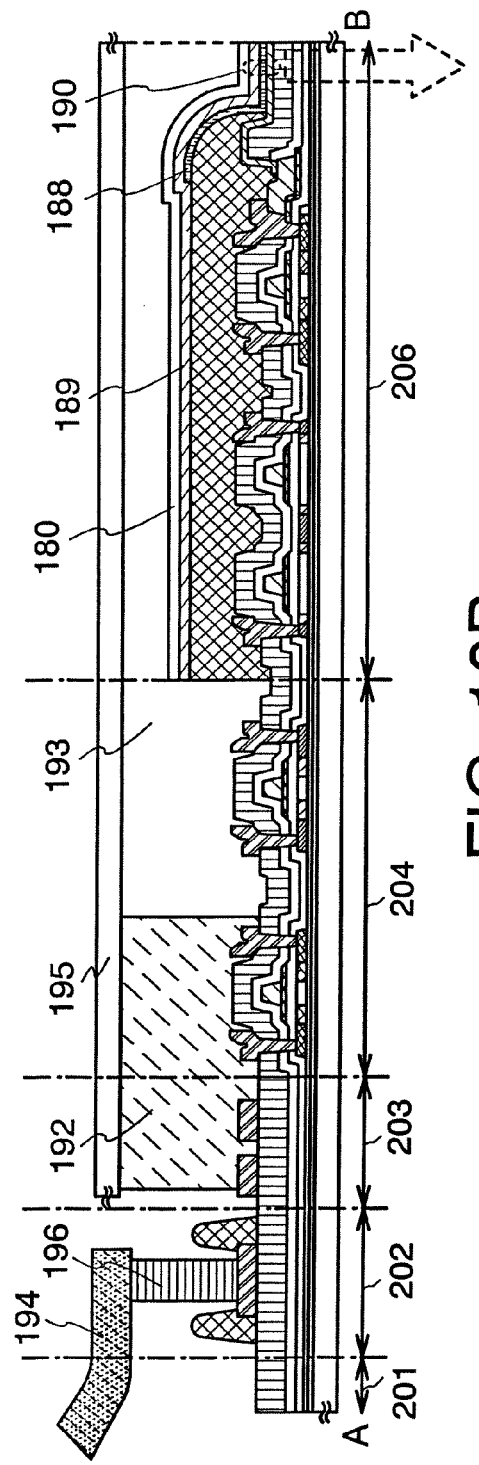

The electroluminescent layer 188 is formed over the first electrode layer 185. Although only one pixel is shown in FIG. 10B, electroluminescent layers corresponding to each color of R (red), G (green) and B (blue) are formed in the present embodiment mode. The electroluminescent layer 188 may be manufactured as described in Embodiment Mode 1. Both an organic compound and an inorganic compound are mixed, and layers having functions of a high carrier injecting property and a high carrier transporting property, which can not be obtained when only one kind of the compounds is used, is provided over the first electrode layer 185.

The materials (a low-molecular material, high-molecular material, or the like), which show light-emission of red (R), green (G), and blue (B), can also be formed by a droplet-discharge method.

Subsequently, the second electrode layer 189 formed of a conductive film is provided over the electroluminescent layer 188. As the second electrode layer 189, a material having a low work function (Al, Ag, Li, Ca, or an alloy thereof such as MgAg, MgIn, AlLi, or $CaF_2$ or calcium nitride) may be used. In this manner, a light-emitting element 190 formed of the first electrode layer 185, the electroluminescent layer 188, and the second electrode layer 189 is formed (see FIG. 10B).

In the display device of the present embodiment mode shown in FIGS. 10A and 10B, light emitted from the light-emitting element 190 is emitted from the first electrode layer 185 side to be transmitted in a direction indicated by an arrow in FIG. 10B.

In the present embodiment mode, an insulating layer 180 is provided as a passivation film (a protective film) over the second electrode layer 189. It is effective to provide a passivation film so as to cover the second electrode layer 189. The insulating layer 180 may be formed by using an insulating film including silicon nitride, silicon oxide, silicon oxynitride (SiON), silicon nitride oxide (SiNO), aluminum nitride (AlN), aluminum oxynitride (AlON), aluminum nitride oxide (AlNO) containing more nitrogen than oxygen, aluminum oxide, diamond-like carbon (DLC), or a nitrogen-containing carbon film (CN), and a single layer or a stacked layer of the insulating films can be used. Moreover, a siloxane resin may also be used.

At this time, it is preferable to form the insulating layer 180 by using a film with favorable coverage, for which a carbon film, particularly a DLC film is preferably used. A DLC film can be formed in the temperature range from a room temperature to 100° C. or lower; therefore, it can be easily formed above the electroluminescent layer 188 with low heat resistance. A DLC film can be formed by a plasma CVD method (typically, an RF plasma CVD method, a microwave CVD method, an electron cyclotron resonance (ECR) CVD method, a heat filament CVD method and the like), a combustion method, a sputtering method, an ion beam evaporation method, a laser evaporation method or the like. As a reaction gas for film formation, a hydrogen gas and a carbon hydride-based gas (for example, $CH_4$, $C_2H_2$, $C_6H_6$ and the like) are used to be ionized by glow discharge, and the ions are accelerated to impact against a cathode to which a negative self-bias voltage is applied. Further, a CN film may be formed by using a $C_2H_2$ gas and a $N_2$ gas as a reaction gas. A DLC film has high blocking effect with respect to oxygen, thereby oxidization of the electroluminescent layer 188 can be suppressed. Therefore, a problem that the electroluminescent layer 188 is oxidized during a subsequent sealing step can be prevented.

Figure 26:
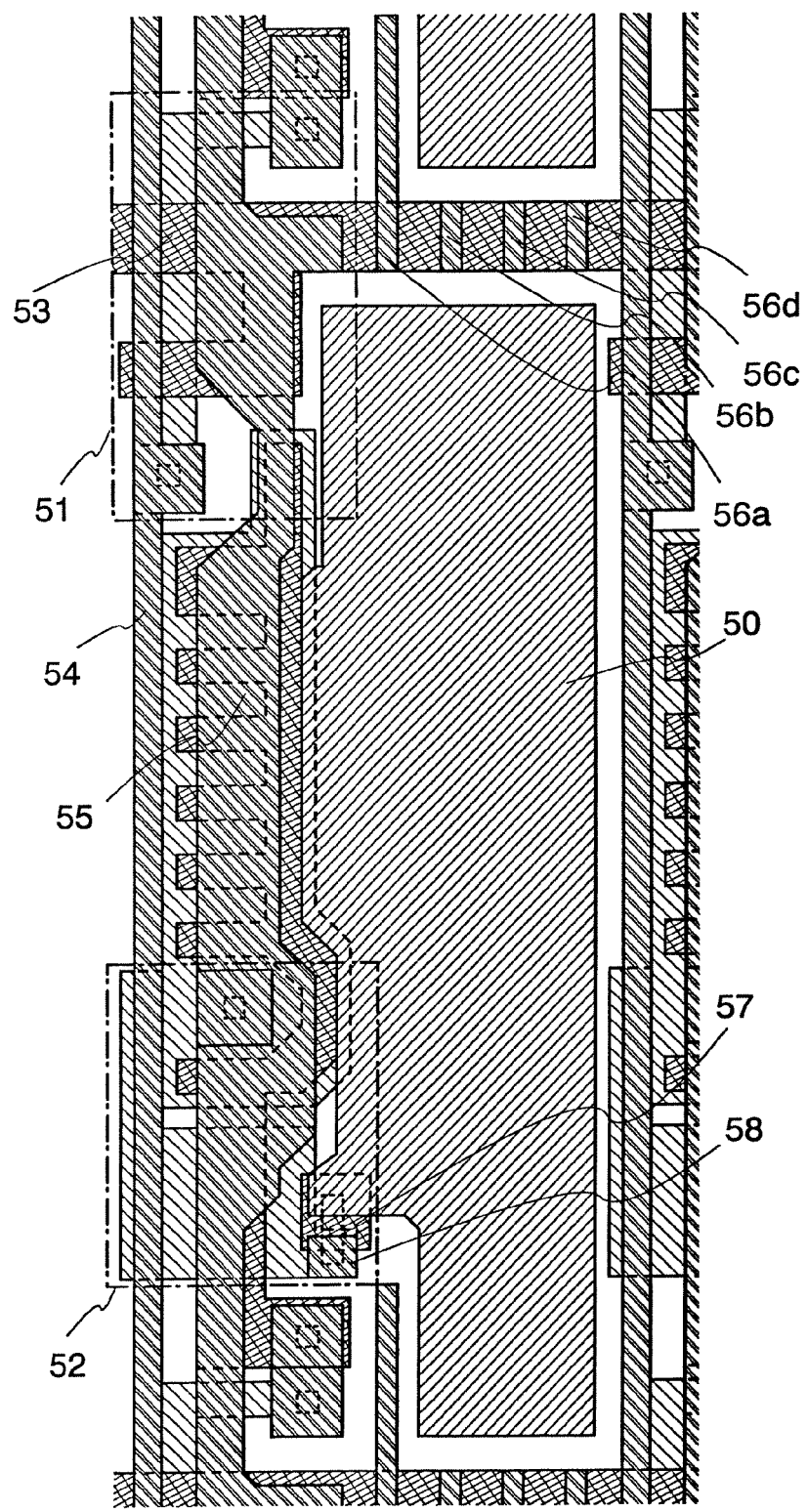
FIG. 26 is a top view of a display device according to the present invention.

FIG. 26 shows a top view of a pixel of the pixel region in the display device manufactured in the present embodiment mode. In FIG. 26, a pixel includes thin film transistors 51 and 52, a first electrode layer 50, a gate wiring layer 53, a source wiring layer or a drain wiring layer 54, a power supply line 55, conductive layers 56a, 56b, 56c, and 56d. A source electrode layer or a drain electrode layer 58 of the thin film transistor 52 is electrically connected to the first electrode layer 50 with the conductive layer 57, which is manufactured by using the same material and through the same step as the gate wiring layer 53, interposed therebetween. The conductive layers 56a, 56b, 56c and 56d will be described in detail in Embodiment Mode 8, but are formed by using the same material and through the same step as the source wiring layer or the drain wiring layer 54 and the power supply line 55 to relieve a drastic change in a thickness, which is caused by stacking the wirings. The conductive layers 56a, 56b, 56c and 56d are electrically insulated from other wirings. In a region where the gate wiring layer 53 and the source wiring layer or the drain wiring layer 54 or the power supply line 55 are intersected, wiring layers are stacked, and the thickness becomes drastically thick. However, by providing the conductive layers 56a, 56b, 56c and 56d in the periphery, the coverage of an insulating layer functioning as a partition wall, which is formed over the conductive layers, is improved, thereby preventing a defect in formation, which is caused by unevenness in the thickness. Accordingly, productivity is improved, and a highly-reliable display device can be manufactured with high yield.

By firmly fixing the substrate 100 over which the light-emitting element 190 is formed as described above and a sealing substrate 195, the light-emitting element is sealed with a sealing material 192 (see FIG. 10B). In the display device of the present invention, the sealing material 192 and the insulating layer 186 are formed apart so as not to contact with each other. By forming the sealing material 192 and the insulating layer 186 apart from each other, even when an insulating material using an organic material having a high moisture absorbing property is used for the insulating layer 186, moisture does not easily enter, thereby preventing deterioration of the light-emitting element and improving the reliability of the display device. As the sealing material 192, typically, a visible light curable resin, an ultraviolet ray curable resin, or a thermosetting resin is preferably used. For example, a bisphenol-A liquid resin, a bisphenol-A solid resin, a bromine-containing epoxy resin, a bisphenol-F resin, a bisphenol-AD resin, a phenol resin, a cresol resin, a novolac resin, a cycloaliphatic epoxy resin, an Epi-Bis type epoxy resin, a glycidyl ester resin, a glycidyl amine-based resin, a heterocyclic epoxy resin, or a modified epoxy resin can be used. It is to be noted that a region surrounded by a sealing material may be filled with a filler 193, and nitrogen or the like may be charged by sealing in a nitrogen atmosphere. Since a bottom emission type is employed in the present embodiment mode, the filler 193 is not required to transmit light. However, in a case of extracting light through the filler 193, the filler is required to transmit light. Typically, a visible light curable, ultraviolet ray curable, or thermosetting epoxy resin may be used. By the aforementioned steps, a display device having a display function using a light-emitting element of the present embodiment mode is completed. Further, the filler may be dropped in a liquid state to be filled in the display device.

Figure 24:
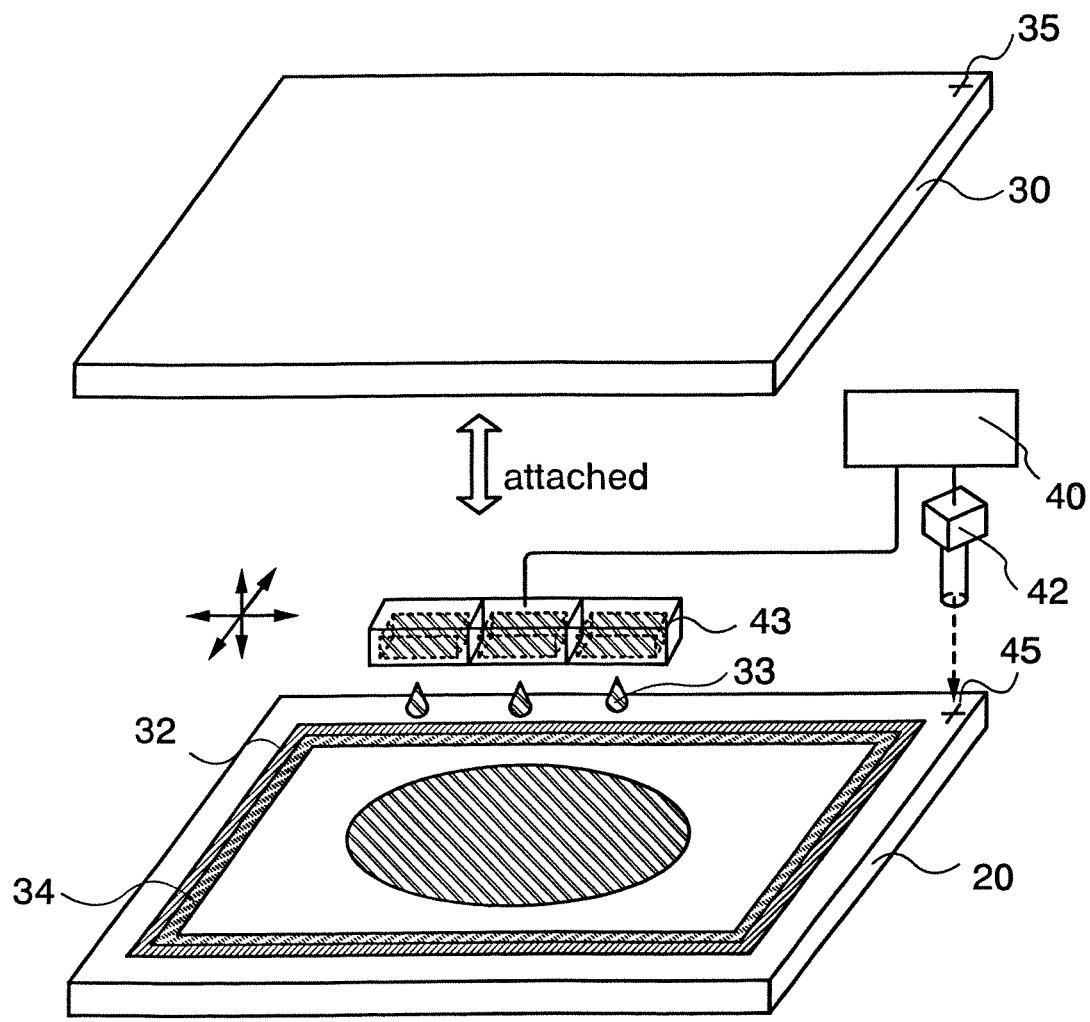
FIG. 24 is a view showing a droplet-discharge method which can be used to the present invention.

A droplet-discharge method using a dispenser method is described with reference to FIG. 24. The droplet-discharge method shown in FIG. 24 uses a control device 40, an imaging means 42, a head 43, a filler 33, a marker 35, a marker 45, a barrier layer 34, a sealing material 32, a TFT substrate 30, and a counter substrate 20. The filler 33 is dropped once or plural times from the head 43 in a closed loop formed by the sealing material 32. In a case where the filler has high viscosity, the filler is continuously discharged and attached to a formation region in a connected state. In a case where the filler has low viscosity, the filler is intermittently discharged and dropped as shown in FIG. 24. At this time, the barrier layer 34 may be provided to prevent that the sealing material 32 reacts with the filler 33. Subsequently, the substrates are attached to each other in vacuum and then cured by ultraviolet ray to make a state filled with the filler. When a substance having a moisture absorbing property such as a drying agent is used as the filler, much higher moisture absorbing effect can be obtained, thereby preventing deterioration of the element.

A drying agent is provided in an EL display panel to prevent deterioration due to moisture in the element. In the present embodiment mode, a drying agent is provided in a depression portion that is formed so as to surround the pixel region in the sealing substrate so as not to hinder a thin design. Further, a drying agent is also formed in a region corresponding to a gate wiring layer so that a moisture absorbing area becomes wide, and thus, moisture can be effectively absorbed. In addition, a drying agent is formed over a gate wiring layer which does not emit light from itself, therefore, light extraction efficiency is not decreased, either.

A light-emitting element is sealed by a glass substrate in the present embodiment mode. It is to be noted that sealing treatment is treatment for protecting a light-emitting element from moisture, and any of a method for mechanically sealing the light-emitting element by a cover material, a method for sealing the light-emitting element with a thermosetting resin or an ultraviolet ray curable resin, and a method for sealing the light-emitting element by a thin film having a high barrier property such as metal oxide or metal nitride is used. As the cover material, a glass, ceramics, a plastic, or metal can be used, but a material which transmits light is required to be used in a case where light is emitted to a cover material side. The cover material and the substrate over which the light-emitting element is formed are attached to each other with a sealing material such as a thermosetting resin or an ultraviolet ray curable resin, and a sealed space is formed by curing the resin using heat treatment or ultraviolet ray irradiation treatment. It is also effective to provide a moisture absorbing material typified by barium oxide in this sealed space. This moisture absorbing material may be provided in contact with the sealing material, or over or in the periphery of the partition wall so as not to shield light from the light-emitting element. Further, the space between the cover material and the substrate over which the light-emitting element is formed can be filled with a thermosetting resin or an ultraviolet ray curable resin. In this case, it is effective to add a moisture absorbing material typified by barium oxide in the thermosetting resin or the ultraviolet ray curable resin.

In the present embodiment mode, the terminal electrode layer 178 is connected to an FPC 194 through an anisotropic conductive layer 196 in the external terminal connection region 202, and electrically connected to the outside. In addition, as shown in FIG. 10A that is a top view of the display device, the display device manufactured in the present embodiment mode includes a peripheral driver circuit region 207 and a peripheral driver circuit region 208 having a scan line driver circuit in addition to a peripheral driver circuit region 204 and a peripheral driver circuit region 209 having a signal line driver circuit.

A structure of the thin film transistor is not limited to the present embodiment mode, and a single gate structure in which one channel formation region is formed, a double gate structure in which two channel formation regions are formed, or a triple gate structure in which three channel formation regions are formed may be employed. Further, the thin film transistor in the peripheral driver circuit region may also employ a single gate structure, a double gate structure, or a triple gate structure.

The above method is not limited to be used for manufacturing the thin film transistor shown in the present embodiment mode, and it may also be employed for a top gate type (a forward planar type, and a forward staggered type), a bottom gate type (a reverse planar type and a reverse staggered type), or a dual gate type having two gate electrode layers which are disposed above and below a channel forming region with the gate insulating film interposed therebetween, or other structure.

Figure 27:
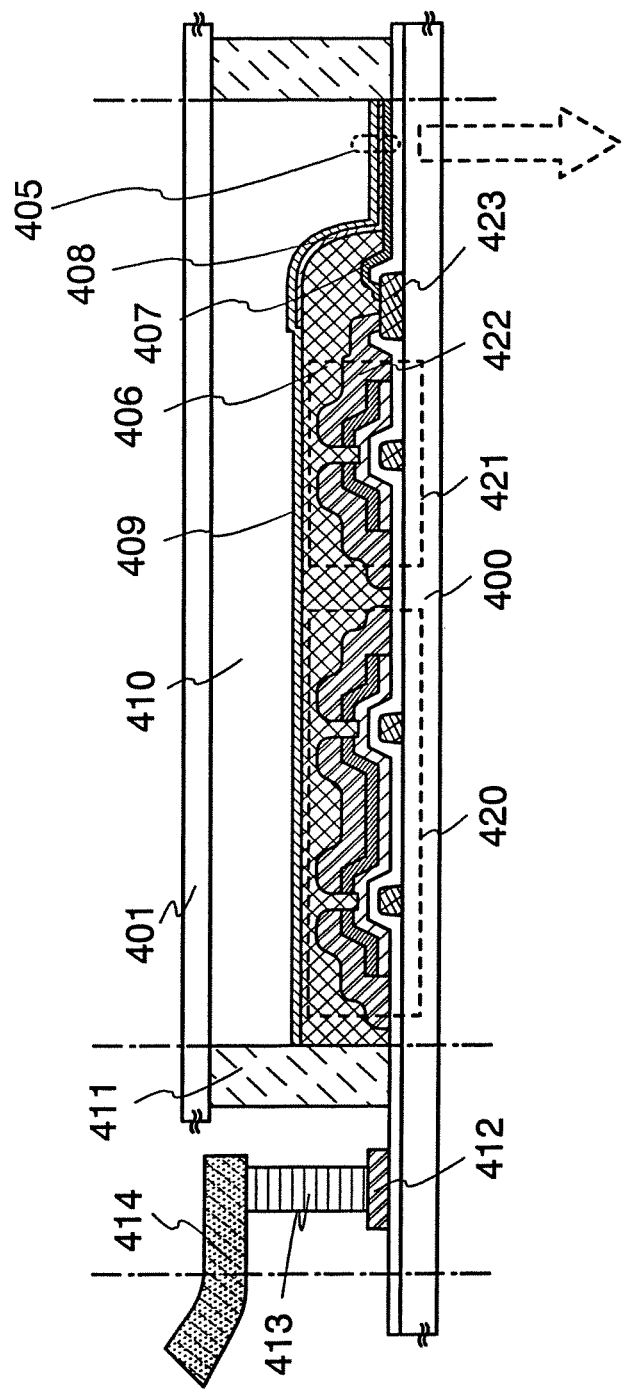
FIG. 27 is a view showing a display device according/to the present invention.

FIG. 27 shows an example in which reverse staggered thin film transistors are used as the thin film transistors. A display device in FIG. 27 includes, over a substrate 400, thin film transistors 420 and 421, an insulating layer 406, a first electrode layer 407 which is a pixel electrode layer, an electroluminescent layer 408, a second electrode layer 409, a filler 410, a sealing material 411, a sealing substrate 401, a terminal electrode layer 412, an anisotropic conductive layer 413, and an FPC 414. Light from a light-emitting element 405 is emitted in a direction indicated by an arrow through the first electrode layer 407 having a light-transmitting property to the outside. Similarly to the display device shown in FIG. 27, an interlayer insulating layer is not required to be formed and the first electrode layer 407 may be formed over the gate insulating layer. In this case, there is advantageous effect that light-extraction efficiency is improved since light emitted from the light-emitting element 405 does not pass through the interlayer insulating layer.

In the display device in FIG. 27, a source electrode layer or a drain electrode layer 422 of the thin film transistor 421 is electrically connected to the first electrode layer 407 with a conductive layer 423 interposed therebetween. The conductive layer 423 is formed by using the same material and through the same step as the gate electrode layer of the thin film transistor 421.

The circuits as described above are formed in the present embodiment mode; however, the present invention is not limited thereto. An IC chip may be mounted by the aforementioned COG method or TAB method as the peripheral driver circuit. Further, each of the gate line driver circuit and the source line driver circuit may be provided in a single number or a plurality of numbers.

In the display device of the present invention, a driving method for image display is not particularly limited, and for example, a dot sequential driving method, a line sequential driving method, an area sequential driving method and the like may be used. Typically, the line sequential driving method may be used, and a time division gray scale driving method and an area gray scale driving method may also be appropriately used. Further, a video signal input to the source line of the display device may be an analog signal or a digital signal. The driver circuit and the like may be appropriately designed in accordance with the video signal.

Further, in a display device using a digital video signal, a video signal that is input into a pixel has a constant voltage (CV) or has a constant current (CC). As for a video signal with a constant voltage (CV), a voltage that is applied to a light-emitting element is constant (CVCV), or a current that is applied to a light-emitting element is constant (CVCC). In addition, as for a video signal with a constant current (CC), a voltage that is applied to a light-emitting element is constant (CCCV), or a current that is applied to a light-emitting element is constant (CCCC).

The present embodiment mode can be used in combination with each of Embodiment Modes 1 to 4.

By applying the present invention, a highly reliable display device can be manufactured. Therefore, a high-definition and high-image quality display device can be manufactured with high yield.

Embodiment Mode 6

In the present embodiment mode, an example of a dual emission display device will be described with reference to FIG. 23.

Figure 23:
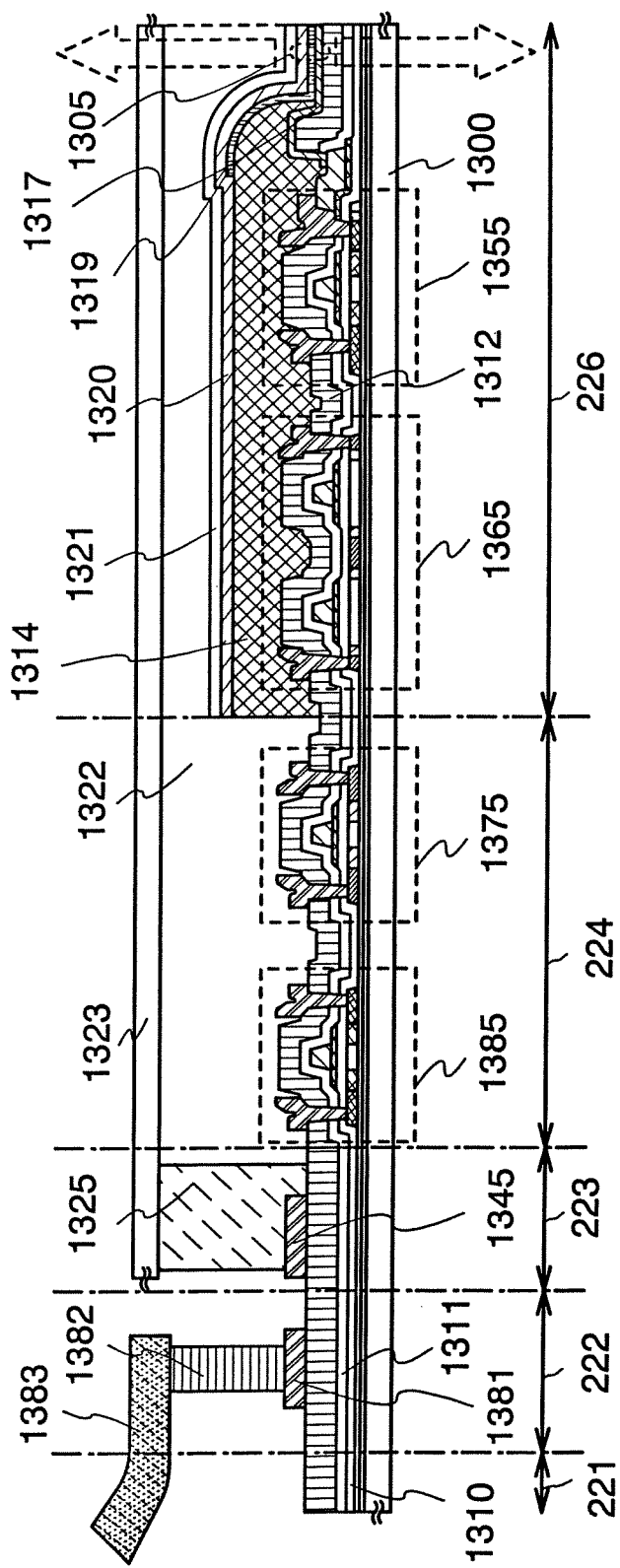
FIG. 23 is a view showing a display device according to the present invention.

FIG. 23 shows a display device, which includes an element substrate 1300, thin film transistors 1355, 1365, 1375 and 1385, a first electrode layer 1317, an electroluminescent layer 1319, a second electrode layer 1320, a protective layer 1321, a filler 1322, a sealing material 1325, a gate insulating layer 1310, insulating layers 1311, 1312 and 1314, a sealing substrate 1323, a wiring layer 1345, a terminal electrode layer 1381, an anisotropic conductive layer 1382, and an FPC 1383. The display device also includes a separation region 221, an external terminal connection region 222, a wiring region 223, a peripheral driver circuit region 224, and a pixel region 226. The filler 1322 can be formed by a dropping method by being made into a liquid composition as in the dropping method in FIG. 24. The element substrate 1300 in which the filler is formed by a dropping method and the sealing substrate 1323 are attached to each other to seal the display device.

The display device in FIG. 23 is a dual emission type, in which light is emitted from both the element substrate 1300 side and the sealing substrate 1323 side in directions indicated by arrows. Therefore, a light-transmitting electrode layer is used for both the first electrode layer 1317 and the second electrode layer 1320.

In the present invention, the first electrode layer 1317 and the second electrode layer 1320 each of which is a light-transmitting electrode layer may be specifically formed by using a transparent conductive film formed of a light-transmitting conductive material, and indium oxide containing tungsten oxide, indium zinc oxide containing tungsten oxide, indium oxide containing titanium oxide, and indium tin oxide containing titanium oxide can be used. Indium tin oxide (ITO), indium zinc oxide (IZO), and indium tin oxide doped with silicon oxide (ITSO) can also be used as a matter of course.

An example of a composition ratio of each light-transmitting conductive material is described. In indium oxide containing tungsten oxide, the composition ratio of tungsten oxide may be 1.0 wt % and indium oxide may be 99.0 wt %. In indium zinc oxide containing tungsten oxide, tungsten oxide may be 1.0 wt %, zinc oxide may be 0.5 wt %, and indium oxide may be 98.5 wt %. In indium oxide containing titanium oxide, titanium oxide may be 1.0 to 5.0 wt % and indium oxide may be 99.0 to 95.0 wt %. In indium tin oxide (ITO), tin oxide may be 10.0 wt % and indium oxide may be 90.0 wt %. In indium zinc oxide (IZO), zinc oxide may be 10.7 wt % and indium oxide may be 89.3 wt %. Further, in indium tin oxide containing titanium oxide, titanium oxide may be 5.0 wt %, tin oxide may be 10.0 wt %, and indium oxide may be 85.0 wt %. The composition ratios as described above are just examples, and a composition ratio may be set appropriately.

In addition, even in a case of a non-light-transmitting material such as a metal film is used, when the thickness is made thin (for example, about 5 to 30 nm) so as to be able to transmit light, light can be emitted from the first electrode layer 1317 and the second electrode layer 1320. As a metal thin film that can be used for the first electrode layer 1317 and the second electrode layer 1320, titanium, tungsten, nickel, gold, platinum, silver, aluminum, magnesium, calcium, lithium and a conductive film composed of an alloy thereof can be given.

As described above, in the display device in FIG. 23, light emitted from the light-emitting element 1305 passes through both the first electrode layer 1317 and the second electrode layer 1320 to have a structure where light is emitted from both sides.

The present embodiment mode can be used in combination with each of Embodiment Modes 1 to 4.

In the display device according to the present invention, the source electrode layer or the drain electrode layer of the thin film transistor and the first electrode layer of the light-emitting element, which is a pixel electrode layer, are not directly stacked to be electrically connected, but the source electrode layer or the drain electrode layer and the first electrode layer are electrically connected to each other with the conductive layer interposed therebetween. In such a structure, materials by which the source electrode layer or the drain electrode layer and the first electrode layer are not easily electrically connected to each other when the both electrode layers are directly in contact with each other, or materials by which deterioration such as electric erosion is caused when the both electrode layers are in contact with each other can also be used since a conductive layer is interposed between the both electrode layers. Therefore, a range of a choice for materials that can be used for the source electrode layer or the drain electrode layer and the first electrode layer can be wide. Since it is not necessary to consider a problem which arises when the source electrode layer or the drain electrode layer and the first electrode layer are stacked, a material provided with a property required for each of the source electrode layer or the drain electrode layer and the first electrode layer can be freely selected. Therefore, a higher-functional and reliable display device can be manufactured with high yield.

Embodiment Mode 7

The present embodiment mode will be described with reference to FIGS. 11A and 11B, 12A and 12B, and 13A to 13B. An example of an active matrix display device using the present invention will be described in the present embodiment mode and explanations of the same portions or portions having the same functions will be omitted.

FIGS. 11A and 11B, and 12A and 12B are drawings of a pixel region in which pixels are arranged in stripe. In a display device of FIGS. 11A and 11B, components up to a first electrode layer 315 which is a pixel electrode layer are formed. In a display device in FIGS. 12A and 12B, an insulating layer 314 functioning as a partition wall is formed in the display device of FIGS. 11A and 11B.

Figure 11A:
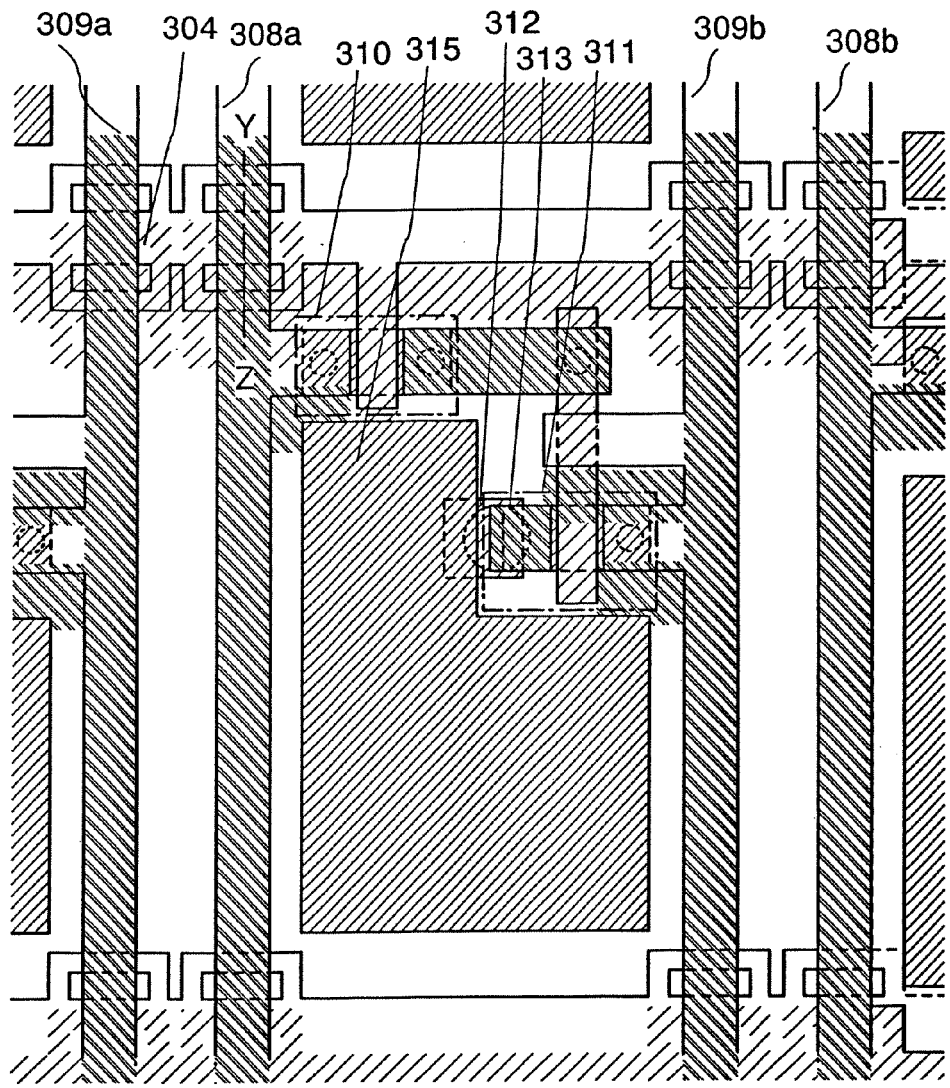
FIGS. 11A and 11B are views showing a display device according to the present invention.
Figure 11B:
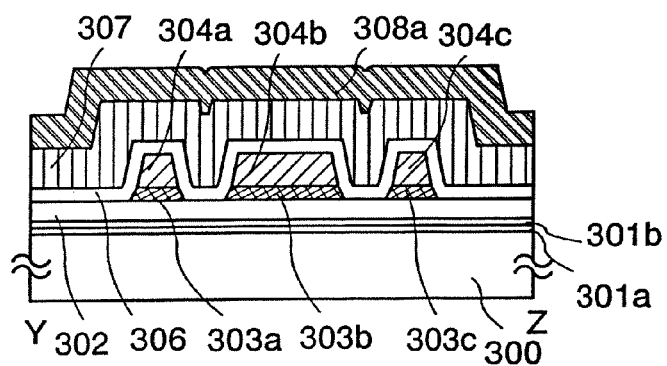

In the display device in FIGS. 11A and 11B, over a substrate 300, base films 301a and 301b, thin film transistors 310 and 311, a gate electrode layer 304, source electrode layers or drain electrode layers 308a and 308b, power supply lines 309a and 309b, a first electrode layer 315, a conductive layer 312, a gate insulating layer 302, and insulating layers 306 and 307 are provided. The first electrode layer 315 is electrically connected to the thin film transistor 311, and the source electrode layer or the drain electrode layer of the thin film transistor 311 is electrically connected to the first electrode layer 315 in an opening 313 with the conductive layer 312 interposed therebetween.

In the display device in FIGS. 11A and 11B, the gate electrode layer 304 is provided to intersect with the source electrode layer or the drain electrode layers 308a and 308b, and the power supply lines 309a and 309b in lattice. Accordingly, in the intersecting region, the gate electrode layer and the source electrode layer or the drain electrode layer are stacked with the insulating layer interposed therebetween, and thus, a total thickness is drastically increased compared with the peripheral portion. An insulating layer 314 functioning as a partition wall, which is formed thereover, cannot sufficiently cover a region with such a thick thickness having uneven projections and depressions, and there may be a defect in some cases. This is because, when the insulating layer 314 is formed by coating a liquid composition containing an insulating material, the composition including an insulating material having liquidity may be flown from a region with a thick thickness to a region with a thin thickness. When the insulating layer 314 cannot sufficiently cover the source electrode layer or the drain electrode layer 308a and the power supply line 309a, a defect in electric characteristics, such as short-circuit with an electrode layer formed over the insulating layer, is caused.

Figure 12A:
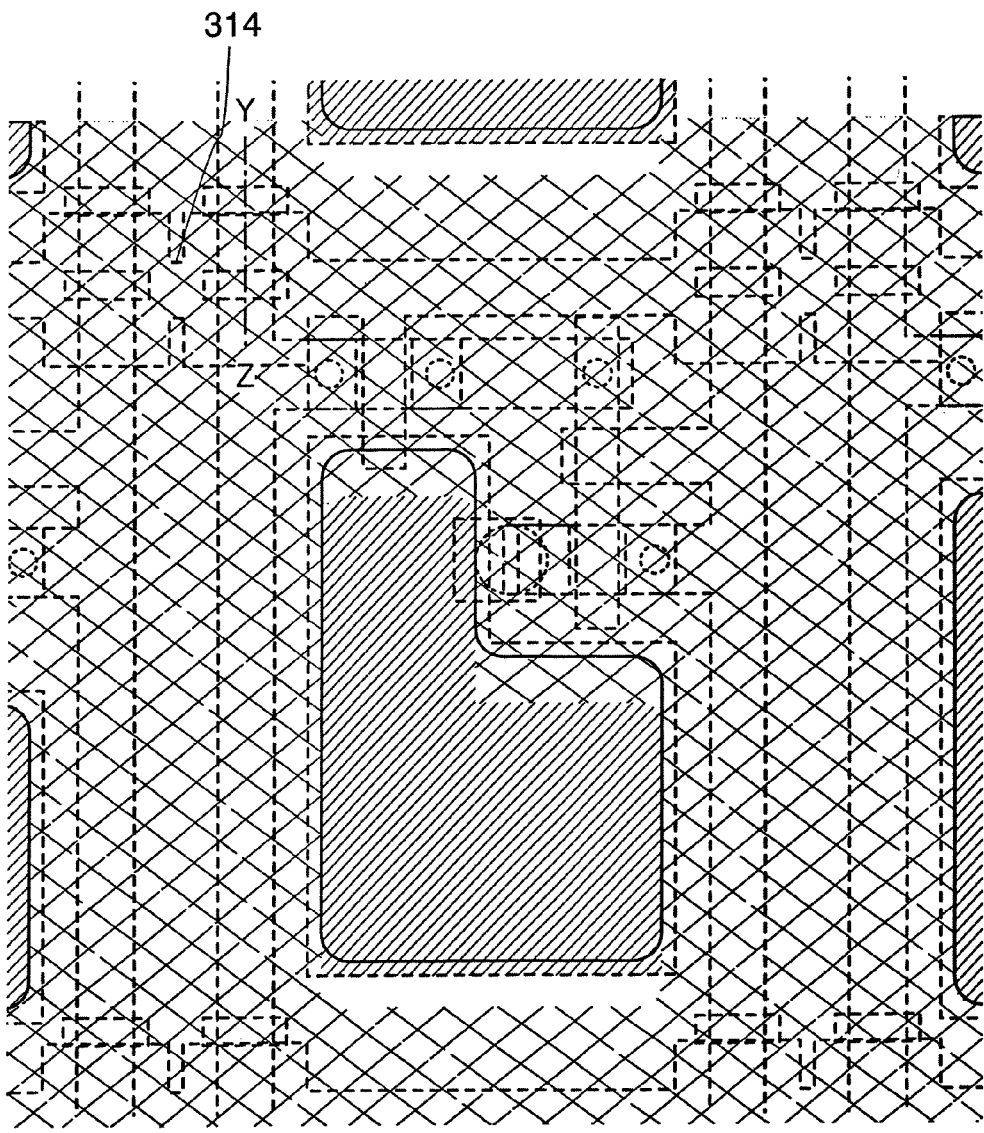
FIGS. 12A and 12B are views showing a display device according to the present invention.
Figure 12B:
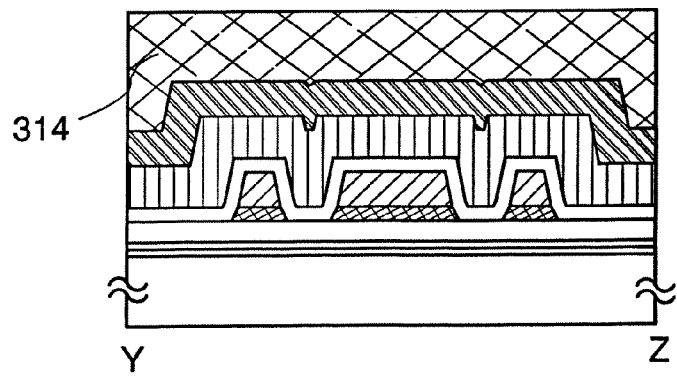

Therefore, as shown in the top view of FIG. 11A, the gate electrode layer 304 is intersected with the source electrode layers or the drain electrode layers 308a and 308b, and the power supply lines 309a and 309b at plural points. FIG. 11B is a cross-sectional view of FIG. 11A along Y-Z. In conventional cases, only a first gate electrode layer 303b and a second gate electrode layer 304b are formed below the source electrode layer or the drain electrode layer 308a; however, in the present embodiment mode, the gate electrode layer 304 is divided into plural branches and intersected. Accordingly, below the source electrode layer or the drain electrode layer 308a, a stacked layer of a first gate electrode layer 303a and a second gate electrode layer 304a and a stacked layer of a first gate electrode layer 303c and a second gate electrode layer 304c are formed on the both sides of the first gate electrode layer 303b and the second gate electrode layer 304b. Since there are a plurality of stacked layers of the gate electrode layer and the source electrode layer or the drain electrode layer in the periphery, a change in the thickness due to the stacked layer of the source electrode layer or the drain electrode layer 308a, the first gate electrode layer 303b, and the second gate electrode layer 304b is relieved, and the composition containing an insulating material can be prevented from flowing. Therefore, the coverage of the insulating layer 314 is improved as shown in FIGS. 12A and 12B, and a defect in formation is not caused.

Figure 13A:
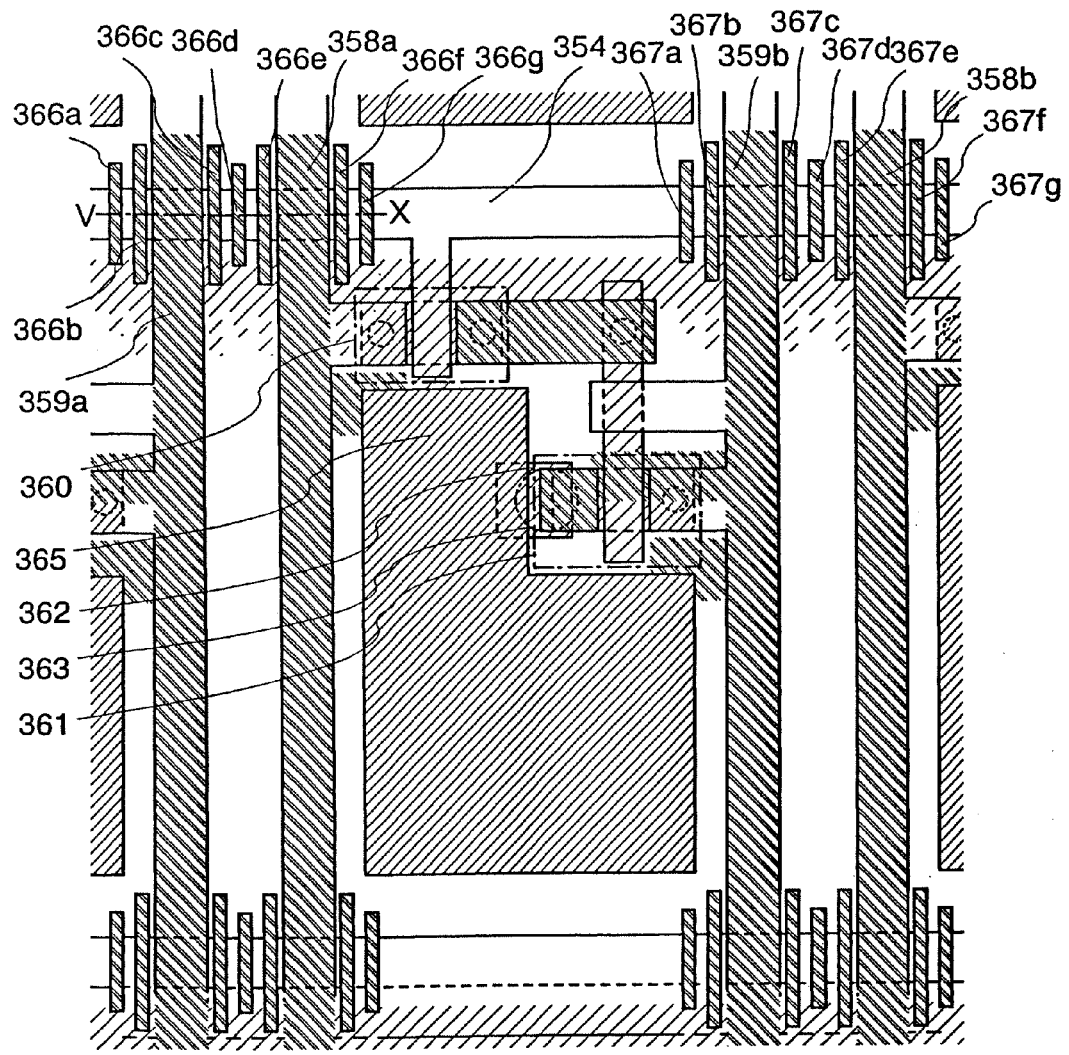
FIGS. 13A and 13B are views showing a display device according to the present invention.
Figure 13B:
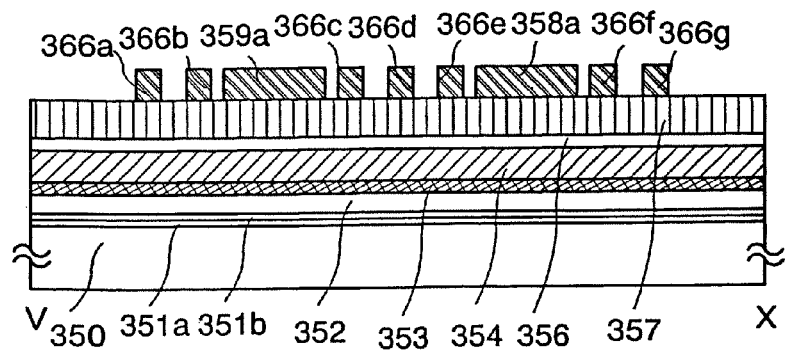

FIGS. 13A and 13B show another structure for improving the coverage of an insulating layer due to a drastic thickness change by a stacked layer. Similarly to FIGS. 12A and 12B, FIG. 13A is a top view and FIG. 13B is a cross-sectional view of a display device in which the steps up to a step for forming a first electrode layer 365 is completed. FIG. 13 B is a cross-sectional view of FIG. 13A along V-X.

In the display device of FIGS. 13A and 13B, over a substrate 350, base films 351a and 351b, thin film transistors 360 and 361, gate electrode layers 353 and 354, source electrode layers or drain electrode layers 358a and 358b, power supply lines 359a and 359b, a first electrode layer 365, a conductive layer 362, a gate insulating layer 352, and insulating layers 356 and 357 are provided. The first electrode layer 365 is electrically connected to the thin film transistor 361, and the source electrode layer or the drain electrode layer of the thin film transistor 361 and the first electrode layer 365 are electrically connected to each other in an opening 363 with the conductive layer 362 interposed therebetween.

In the periphery of intersecting regions of the gate electrode layers 353 and 354 to each of the source electrode layers or the drain electrode layers 358a and 358b, and the power supply lines 359a and 359b, conductive layers 366a, 366b, 366c, 366d, 366e, 366f, 366g, 367a, 367b, 367c, 367d, 367e, 367f, and 367g are formed, which are formed by the same material and through the same step as the source electrode layers or the drain electrode layers and not electrically connected to other wirings.

Since there are the conductive layers 366a, 366b, 366c, 366d, 366e, 366f, 366g, 367a, 367b, 367c, 367d, 367e, 367f, and 367g in the periphery of the source electrode layers or the drain electrode layers 358a and 358b, and the power supply lines 359a and 359b, a change in a thickness due to a stacked layer of the gate electrode layers 353 and 354, the source electrode layers or the drain electrode layers 358a and 358b, and the power supply lines 359a and 359b is relieved. Therefore, the coverage of an insulating layer that is formed thereover as a partition wall is improved, and a defect in formation is not caused.

As described above, in a region where wirings are intersect with each other, a similar stacked structure is formed to equalize and relieve a change in a thickness, and thus, the coverage of an insulating layer that is formed thereover is improved. Therefore, a defect due to a defect in formation can be prevented, and a highly reliable display device can be manufactured.

The present embodiment mode can be used in combination with each of Embodiment Modes 1 to 6.

Embodiment Mode 8

Figure 15:
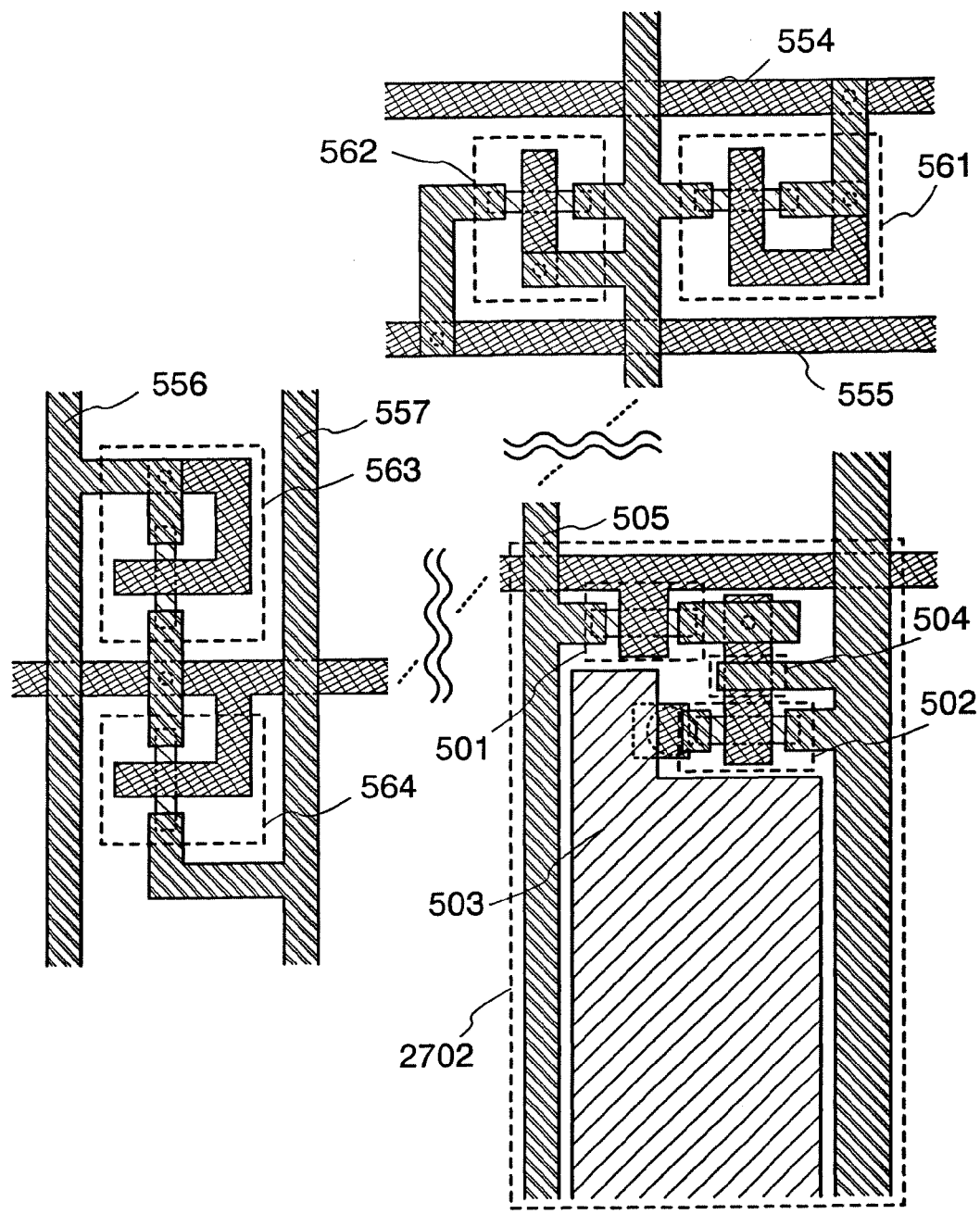
FIG. 15 is top view showing a display device according to the present invention.

An example of providing protective diodes for a scan line input terminal portion and a signal line input terminal portion will be described with reference to FIG. 15. In FIG. 15, a pixel 2702 is provided with TFTs 501 and 502, a capacitor element 504, and a light-emitting element 503. These TFTs have similar structures to those of Embodiment Mode 1.

Figure 14:
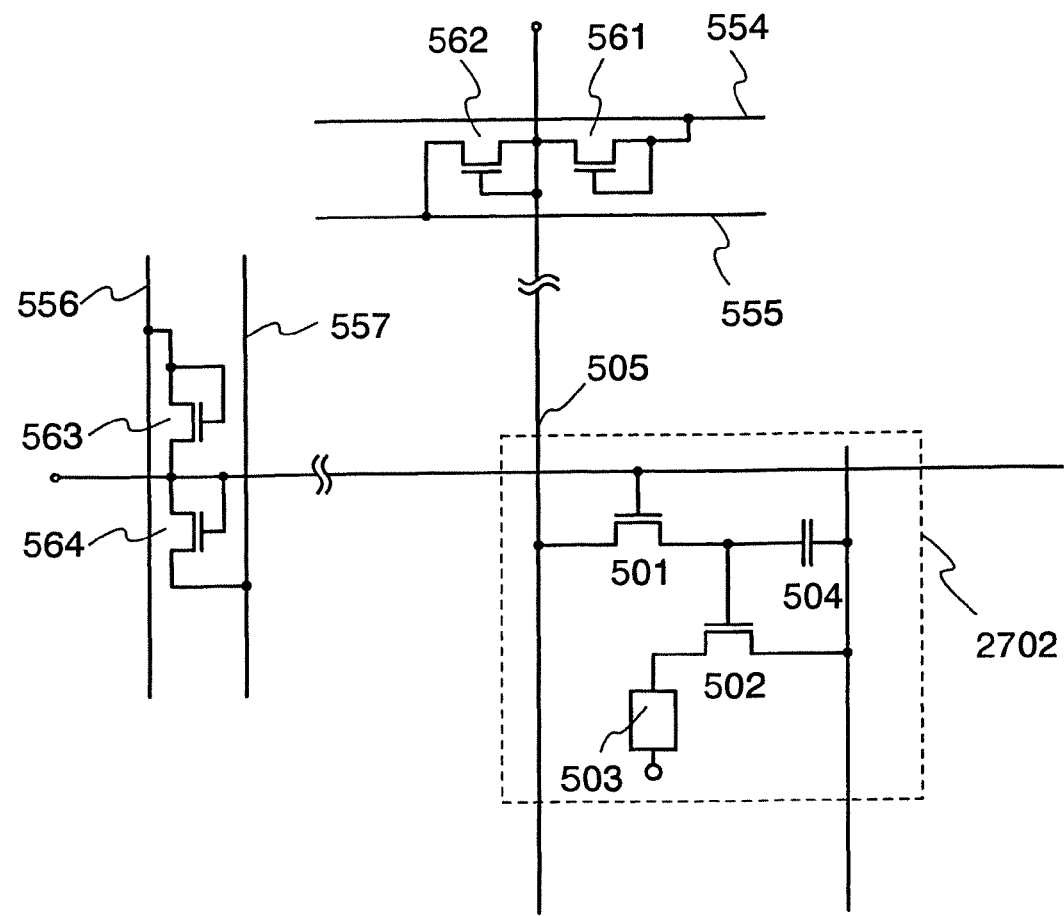
FIG. 14 is an equivalent circuit diagram of a display device that will be described in FIG. 15.

Protective diodes 561 and 562 are provided in the signal line input terminal portion. These protective diodes are manufactured through similar steps to the TFTs 501 and 502, and a gate is connected to one of a drain and a source to operate as a diode. FIG. 14 shows an equivalent circuit diagram of a top view of FIG. 15.

The protective diode 561 includes a gate electrode layer, a semiconductor layer, and a wiring layer. The protective diode 562 has a similar structure. Common potential lines 554 and 555 connected to these protective diodes are formed of the same layer as the gate electrode layer. Accordingly, a contact hole is required to be formed in an insulating layer so that the common potential line is electrically connected to the wiring layer.

A contact hole in the insulating layer may be formed by forming a mask layer and performing etching. In this case, by performing etching of atmospheric pressure discharge, local electric discharge can be performed, and a mask layer is not required to be formed over the entire surface of the substrate.

A signal wiring layer is formed of the same layer as a source and drain wiring layer 505 in the TFT 501, and the signal wiring layer connected to the source and drain wiring layer 505 and the source or drain side are connected to each other.

An input terminal portion on the scan signal line side also has a similar structure. A protective diode 563 includes a gate electrode layer, a semiconductor layer, and a wiring layer. A protective diode 564 has a similar structure. Common potential lines 556 and 557 connected to these protective diodes are formed of the same layer as the source electrode layer or the drain electrode layer. The protective diodes provided in the input stage can be formed at the same time. It is to be noted that the protective diode is not limited to be disposed at a position shown in the present embodiment mode, but may also be disposed between a driver circuit and a pixel.

The present embodiment mode can be used in combination with each of Embodiment Modes 1 to 7.

Embodiment Mode 9

Figure 25:
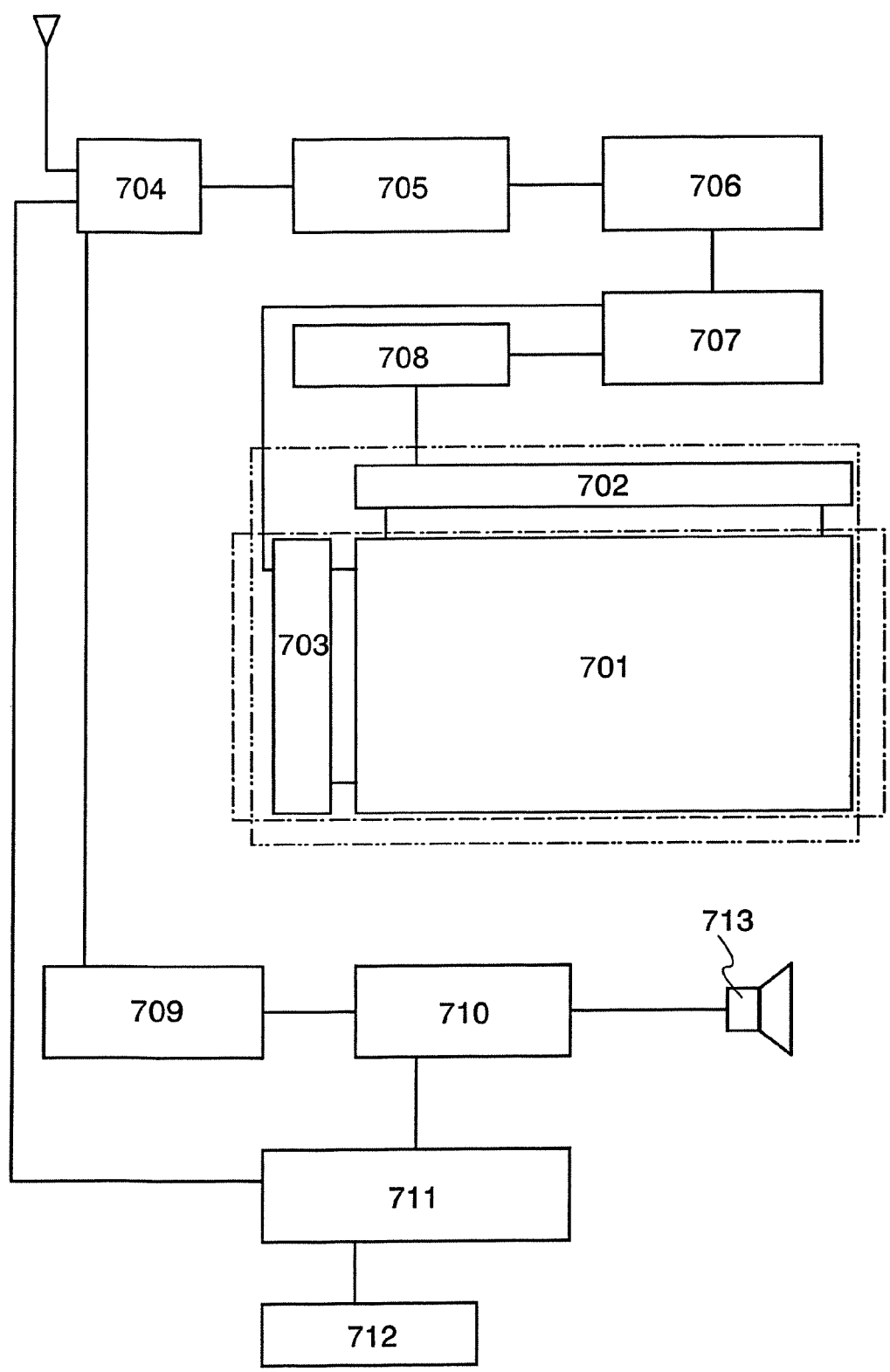
FIG. 25 is a block diagram showing a main structure of an electronic device to which the present invention is applied.

A television device can be completed by a display device formed in accordance with the present invention. FIG. 25 is a block diagram showing a main structure of the television device (EL television device in the present embodiment mode). A display panel can be formed in any manner as follows: as the structure shown in FIG. 16A, only a pixel portion 701 is formed, and a scan line driver circuit 703 and a signal line driver circuit 702 are mounted by a TAB method as shown in FIG. 17B or by a COG method as shown in FIG. 17A; a TFT is formed, and a pixel portion 701 and a scan line driver circuit 703 are formed to be integrated over a substrate, and a signal line driver circuit 702 is separately mounted as a driver IC as shown in FIG. 16B; a pixel portion 701, a signal line driver circuit 702, and a scan line driver circuit 703 are formed to be integrated over the substrate as shown in FIG. 16C; or the like.

Another structure of an external circuit includes, on the input side of the video signal, a video signal amplifier circuit 705 which amplifies a video signal among signals received by a tuner 704; a video signal processing circuit 706 which converts the signal output into a chrominance signal corresponding to each color of red, green, and blue; a control circuit 707 which converts the video signal into an input specification of a driver IC; and the like. The control circuit 707 outputs the signal into the scan line side and the signal line side, respectively. In a case of digital driving, a signal dividing circuit 708 may be provided on the signal line side so that an input digital signal is provided by dividing into m-pieces.

Among signals received by the tuner 704, an audio signal is transmitted to an audio signal amplifier circuit 709, and the output thereof is supplied to a speaker 713 through an audio signal processing circuit 710. The control circuit 711 receives control information on a receiving station (a receiving frequency) or sound volume from an input portion 712 and transmits the signal to the tuner 704 or the audio signal processing circuit 710.

Figure 20A:
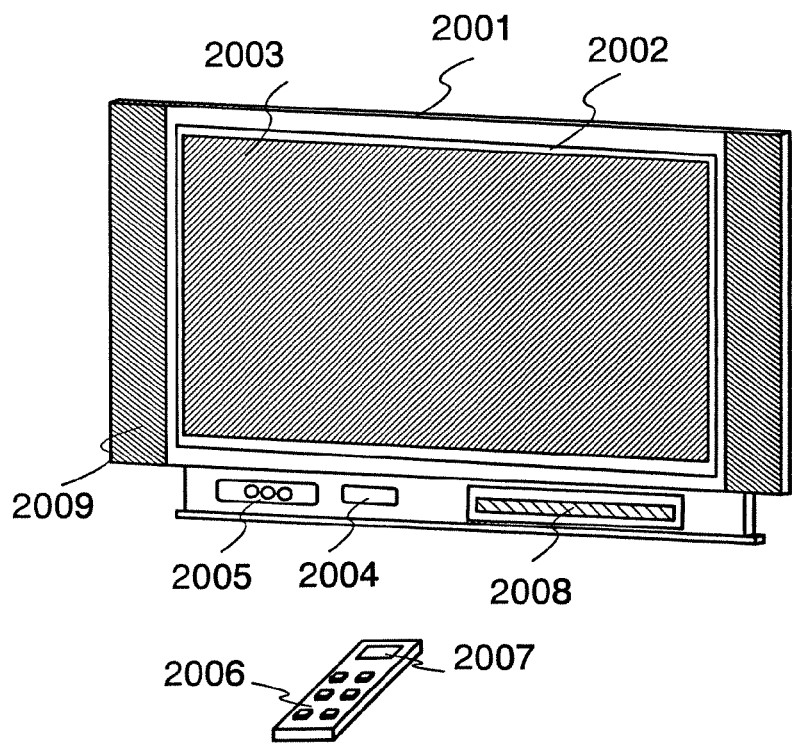
FIGS. 20A and 20B are views showing electronic devices to which the present invention is applied.
Figure 20B:
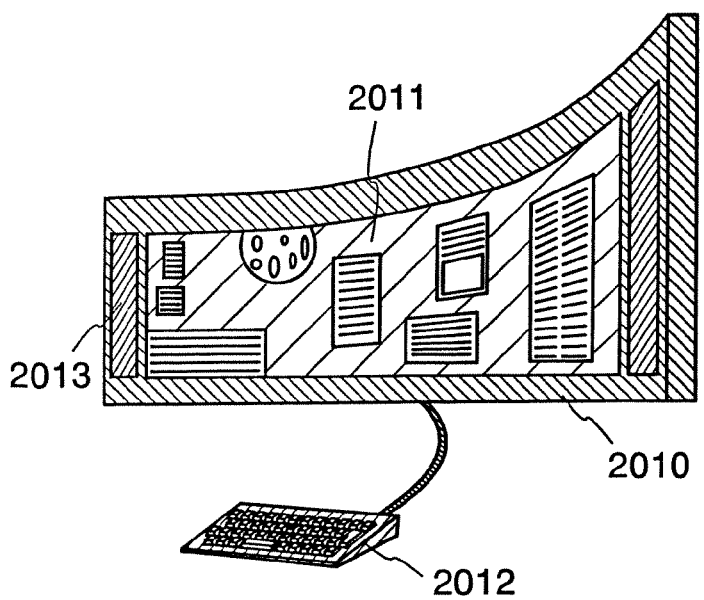

As shown in FIGS. 20A and 20B, a television device can be completed by incorporating a display module into a chassis. The display panel in which components up to an FPC are attached as shown in FIGS. 10A and 10B is generally called an EL display module. An EL television device can be completed when the EL display module as in FIGS. 10A and 10B is used. A main screen 2003 is formed by using the display module, and a speaker unit 2009, operation switches, and the like are provided as other attached equipments. In such a manner, the television device can be completed in accordance with the present invention.

In addition, reflected light of light entered from the outside may be shielded by using a wave plate and a polarizing plate. Further, by a droplet-discharge method, different materials may be discharged on the same region plural times to form a partition wall. λ/4 and λ/2 plates may be used as wave plates and may be designed to be able to control light. As a structure, a TFT element substrate, a light-emitting element, a sealing substrate (sealing material), wave plates (λ/4 and λ/2 plates), a polarizing plate are stacked in this order, in which light emitted from the light-emitting element is emitted outside from the polarizing plate side through the above components. The wave plates or polarizing plate may be provided on a side to which light is emitted or may be provided on the both sides in a case of a dual emission type display device in which light is emitted to both sides. In addition, an anti-reflective film may be provided on the outer side of the polarizing plate. Consequently, a high definition and accurate image can be displayed.

As shown in FIG. 20A, a display panel 2002 using a display element is incorporated into a chassis 2001. By using a receiver 2005, in addition to reception of general TV broadcast, information communication can also be carried out in one direction (from a transmitter to a receiver) or in both directions (between a transmitter and a receiver or between receivers) by connecting to a communication network by a fixed line or wirelessly through a modem 2004. The operation of the television device can be carried out by switches incorporated into the chassis or by a remote control device 2006, which is separated from the main body. A display portion 2007 that displays information to be output may also be provided in this remote control device.

In addition, in the television device, a structure for displaying a channel, sound volume, or the like may be additionally provided by forming a sub-screen 2008 as a second display panel in addition to the main screen 2003. In this structure, the main screen 2003 may be formed of an EL display panel superior in a viewing angle, and the sub-screen may be formed of a liquid crystal display panel capable of display with low power consumption. In order to prioritize low power consumption, a structure in which the main screen 2003 is formed of a liquid crystal display panel, the sub-screen is formed of an EL display panel, and the sub-screen is able to flash on and off may also be applied. Obviously, both of the main-screen and the sub-screen may be formed by using an EL display panel in accordance with the present invention. By the present invention, a highly reliable display device can be manufactured even by using such a large substrate with many TFTs and electronic parts.

FIG. 20B shows a television device having a large display portion of, for example, 20 to 80 inches, which includes a chassis 2010, a keyboard 2012 which is an operation portion, a display portion 2011, a speaker unit 2013, and the like. The present invention is applied to a manufacturing of the display portion 2011. FIG. 20B shows a television device having a curved display portion because a bendable material is used for the display portion. The shape of the display portion can be freely designed in this manner, and thus, a television device having a desired shape can be manufactured.

In accordance with the present invention, a display device can be manufactured through a simplified process and thus the manufacturing cost can be reduced. Hence, even a television device with a large screen display portion can be formed with low cost by applying the present invention. Accordingly, a high-performance and highly reliable television device can be manufactured with high yield.

The present invention is not limited to the television device and is also applicable to various usages such as display mediums having a large area, for example, a monitor of a personal computer, an information display board at a station, an airport, or the like, or an advertisement display board on the street.

Embodiment Mode 10

The present embodiment mode will be described with reference to FIGS. 21A and 21B. The present embodiment mode shows an example of a module to which a panel having a display device manufactured in Embodiment Modes 1 to 9 is applied.

Figure 21A:
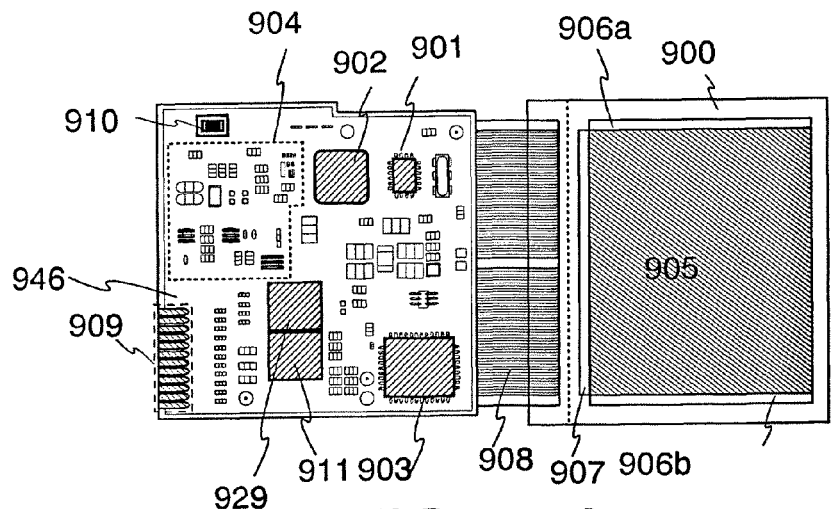
FIGS. 21A and 21B are views showing an electronic device to which the present invention is applied.

An information terminal module shown in FIG. 21A includes a printed wiring board 946 over which a controller 901, a central processing unit (CPU) 902, a memory 911, a power source circuit 903, an audio processing circuit 929, a transmission/reception circuit 904, and other elements such as a resistor, a buffer, and a capacitor element are mounted. Further, a panel 900 is connected to the printed wiring board 946 through a flexible printed circuit (FPC) 908.

The panel 900 includes a pixel portion 905 in which each pixel has a light-emitting element, a first scan line driver circuit 906a and a second scan line driver circuit 906b which select a pixel in the pixel portion 905, and a signal line driver circuit 907 which supplies a video signal to the selected pixel.

Various control signals are input and output through an interface (I/F) 909 provided over the printed wiring board 946. An antenna port 910 for transmitting and receiving signals with an antenna is provided over the printed wiring board 946.

It is to be noted that the printed wiring board 946 is connected to the panel 900 through the FPC 908 in the present embodiment mode; however, the present invention is not limited to this structure. The controller 901, the audio processing circuit 929, the memory 911, the CPU 902 or the power source circuit 903 may be directly mounted on the panel 900 by a COG (Chip On Glass) method. Further, various elements such as a capacitor element and a buffer are provided over the printed wiring board 946, thereby preventing a noise from occurring in the power source voltage and signals, and the signal rise time from becoming slow.

Figure 21B:
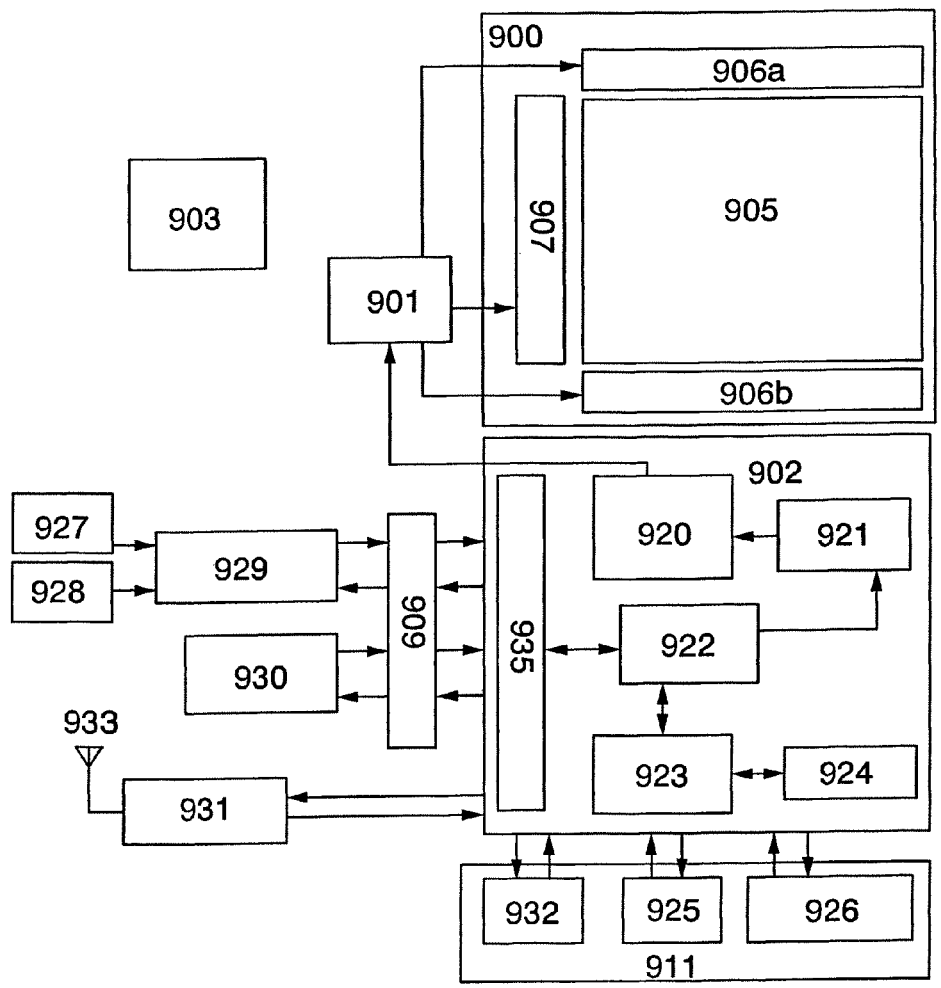

FIG. 21B is a block diagram of the module shown in FIG. 21A. This module includes a VRAM 932, a DRAM 925, a flash memory 926 and the like as the memory 911. The VRAM 932 stores data on the image to be displayed on a panel, the DRAM 925 stores image data or audio data, and the flash memory stores various programs.

The power source circuit 903 generates a power source voltage applied to the panel 900, the controller 901, the CPU 902, the audio processing circuit 929, the memory 911, and the transmission/reception circuit 931. There is a case where a current source is provided in the power source circuit 903 depending on the specifications of the panel.

The CPU 902 includes a control signal generating circuit 920, a decoder 921, a register 922, an arithmetic circuit 923, a RAM 924, an interface 935 for the CPU and the like. Various signals input to the CPU 902 through the interface 935 are held in the resister 922, and then input to the arithmetic circuit 923, the decoder 921 and the like. In the arithmetic circuit 923, an arithmetic operation is performed based on the input signal, and the address of various instructions is determined. Meanwhile, a signal input to the decoder 921 is decoded and input to the control signal generating circuit 920. The control signal generating circuit 920 generates a signal containing various instructions based on the input signal, and then transmits the signals to the address determined by the arithmetic circuit 923, specifically, the memory 911, the transmission/reception circuit 931, the audio processing circuit 929, the controller 901 or the like.

Each of the memory 911, the transmission/reception circuit 931, the audio processing circuit 929, and the controller 901 operates in accordance with the received instruction. The operation thereof is briefly described below.

A signal input from an input means 930 is transmitted to the CPU 902 which is mounted on the printed wiring board 946 through the interface 909. The control signal generating circuit 920 converts the image data stored in the VRAM 932 into a predetermined format based on the signal transmitted from the input means 930 such as a pointing device or a keyboard, and transmits the data to the controller 901.

The controller 901 processes the signals containing image data transmitted from the CPU 902 in accordance with the specifications of the panel, and then transmits the signals to the panel 900. Further, the controller 901 generates an Hsync signal, a Vsync signal, a clock signal CLK, an alternating current voltage (AC Cont), and a switching signal L/R based on the power source voltage input from the power source circuit 903 and the various signals input from the CPU 902, and supplies the signals to the panel 900.

The transmission/reception circuit 904 processes signals which are transmitted and received as electromagnetic waves by an antenna 933. Specifically, the transmission/reception circuit 904 includes high frequency circuits such as an isolator, a band pass filter, a VCO (Voltage Controlled Oscillator), an LPF (Low Pass Filter), a coupler, and a balun. A signal containing audio information among the signals transmitted and received by the transmission/reception circuit 904 is transmitted to the audio processing circuit 929 in accordance with the instruction of the CPU 902.

The signal containing audio information transmitted in accordance with the instruction of the CPU 902 is demodulated into an audio signal by the audio processing circuit 929 and transmitted to a speaker 928. An audio signal transmitted from a microphone 927 is modulated by the audio processing circuit 929 and transmitted to the transmission/reception circuit 904 in accordance with the instruction of the CPU 902.

The controller 901, the CPU 902, the power source circuit 903, the audio processing circuit 929, and the memory 911 can be mounted as a package of the present embodiment mode. The present embodiment mode can be applied to any circuits but a high frequency circuit such as an isolator, a band pass filter, a VCO (Voltage Controlled Oscillator), an LPF (Low Pass Filter), a coupler, or a balun.

Embodiment Mode 11

Figure 22:
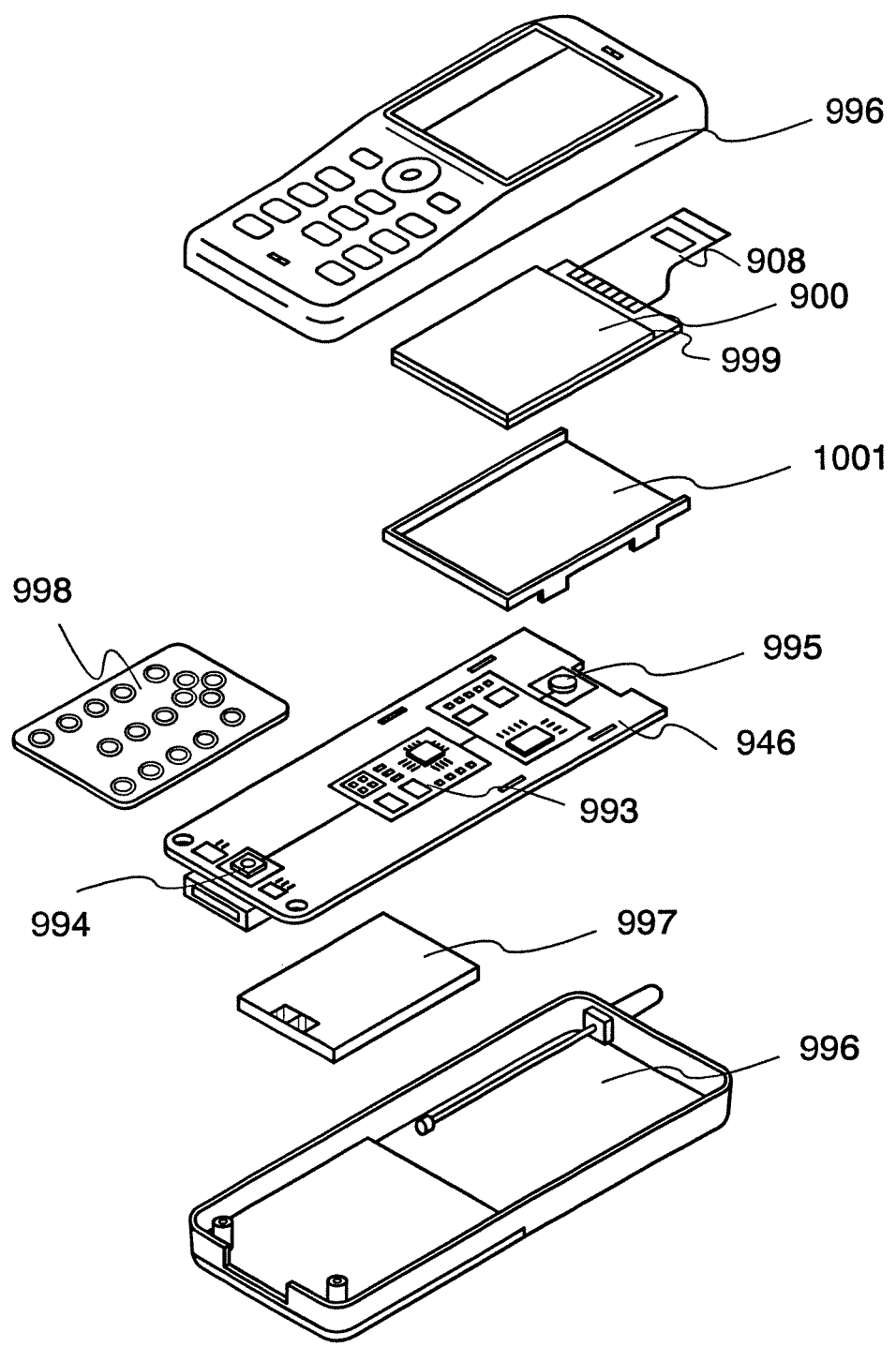
FIG. 22 is a view showing an electronic device to which the present invention is applied.

The present embodiment mode will be described with reference to FIGS. 21A and 21B, and 22. FIG. 22 shows an example of a wireless portable compact phone (cellular phone) including the module manufactured in accordance with Embodiment Mode 10. The panel 900 can be incorporated into a housing 1001 to be detachable. The shape and size of the housing 1001 can be appropriately changed in accordance with an electronic device into which the housing 1001 is incorporated.

The housing 1001 to which the panel 900 is fixed is mounted on a printed wiring board 946 and completed as a module. Over the printed wiring board 946, a controller, a CPU, a memory, a power source circuit, and other elements such as a resistor, a buffer, and a capacitor element are mounted. Further, an audio processing circuit including a microphone 994 and a speaker 995, and a signal processing circuit 993 such as a transmission/reception circuit are provided. The panel 900 is connected to the printed wiring board 946 through an FPC 908.

Such a module 999, an input means 998, and a buttery 997 are stored in a chassis 996. A pixel portion of the panel 900 is disposed to be seen from an opening window formed in the chassis 996.

The chassis 996 shown in FIG. 22 is an example of an external appearance of a phone. However, an electronic device in accordance with the present embodiment mode may be changed into various modes depending on the function and application. An example of the modes will be described in the following embodiment mode.

Embodiment Mode 12

Figure 19A:
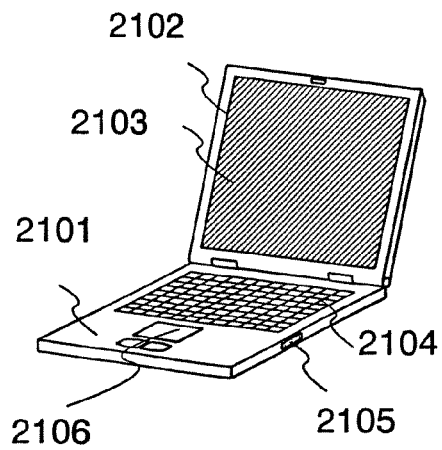
FIGS. 19A to 19D are views showing electronic devices to which the present invention is applied.

FIG. 19A shows a computer, which includes a main body 2101, a chassis 2102, a display portion 2103, a keyboard 2104, an external connection port 2105, a pointing mouse 2106 and the like. In the computer, the display portion 2103 includes a structure of Embodiment Mode 5. Accordingly, a defect prevented in the display portion 2103 of the computer, and power consumption is reduced, and thus, the computer can be used for a long period. Further, a computer, in which an image with high reliability and high quality can be displayed, can be provided.

Figure 19B:
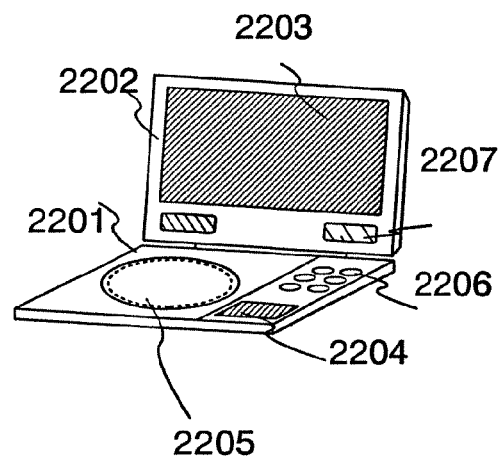

FIG. 19B shows an image reproducing device provided with a recording medium (specifically a DVD reproducing device), which includes a main body 2201, a chassis 2202, a display portion A 2203, a display portion B 2204, a recording medium (such as a DVD) reading portion 2205, operation keys 2206, a speaker portion 2207 and the like. The display portion A 2203 mainly displays image information and the display portion B 2204 mainly displays character information. In the image reproducing device provided with a recording medium, the display portion A 2203 and the display portion B 2204 include a structure of Embodiment Mode 5. Accordingly, a defect is prevented in the display portion A 2203 and the display portion B 2204 of the image reproducing device provided with a recording medium, and power consumption is reduced, and thus, the device can be used for a long period. Further, an image reproducing device provided with a recording medium, in which an image with high reliability and high quality can be displayed, can be provided.

Figure 19C:
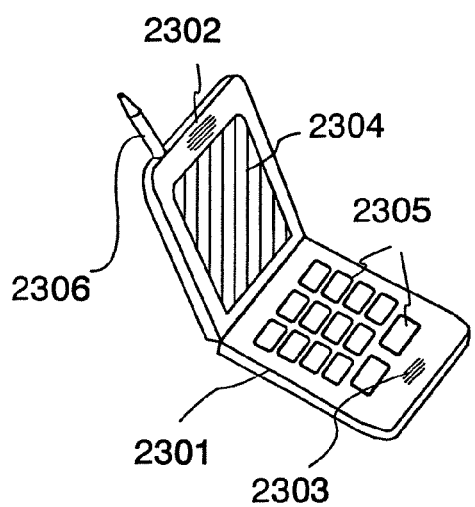

FIG. 19C shows a cellular phone, which includes a main body 2301, an audio output portion 2302, an audio input portion 2303, a display portion 2304, operation switches 2305, an antenna 2306, and the like. In the cellular phone, the display portion 2304 includes a structure of Embodiment Mode 5. Accordingly, a defect is prevented in the display portion 2304 in the cellular phone, and power consumption is reduced, and thus, the phone can be used for a long period. Further, a cellular phone, in which an image with high reliability and high quality can be displayed, can be provide.

Figure 19D:
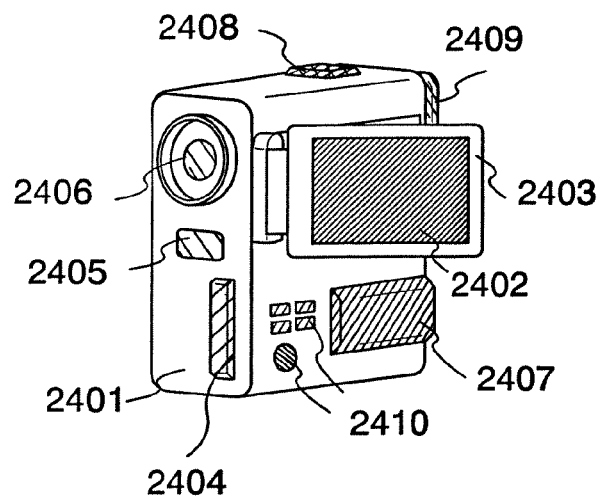

FIG. 19D shows a video camera, which includes a main body 2401, a display area 2402, a chassis 2403, an external connection port 2404, a remote control receiving portion 2405, an image receiving portion 2406, a battery 2407, an audio input portion 2408, an eyepiece 2409, operation keys 2410, and the like. In the video camera, the display portion 2402 includes a structure of Embodiment Mode 5. Accordingly, a defect is prevented in the display portion 2402 in the video camera, and power consumption is reduced, and thus, the camera can be used for a long period. Further, a video camera, in which an image with high reliability and high quality can be displayed, can be provided.

This application is based on Japanese Patent Application serial no. 2005-117723 filed on Apr. 15, 2005, in Japan Patent Office, the entire contents of which are hereby incorporated by reference.

What is claimed is:

1. A display device comprising:
a semiconductor layer;
a first insulating layer over the semiconductor layer, the first insulating layer comprising a first opening;
a first gate electrode over the first insulating layer;
a second insulating layer over the first gate electrode, the second insulating layer comprising a second opening;
a conductive layer over the first insulating layer;
a wiring over the first insulating layer, the wiring being in contact with the semiconductor layer through the first opening;
a first electrode over the second insulating layer, the first electrode being in contact with the conductive layer through the second opening;
an electroluminescent layer over the first electrode; and
a second electrode over the electroluminescent layer,
wherein the first gate electrode and the conductive layer comprise the same material, and
wherein the wiring is electrically connected to the first electrode via the conductive layer.

2. The display device according to claim 1, wherein the first electrode is indium oxide comprising tungsten oxide, indium zinc oxide comprising tungsten oxide, indium oxide comprising titanium oxide, or indium tin oxide comprising titanium oxide.

3. The display device according to claim 1, wherein the electroluminescent layer comprises a layer comprising an organic compound and an inorganic compound.

4. The display device according to claim 1, further comprising a second gate electrode under the semiconductor layer.

5. The display device according to claim 1, the wiring is over the conductive layer.

6. The display device according to claim 1, the semiconductor layer comprises silicon.

7. A module comprising the display device according to claim 1 and a flexible printed circuit connected to the display device.

8. An electronic device comprising the module according to claim 7 and at least one selected from the group of a battery, an antenna, an operation switch, an audio output portion and an audio input portion.

9. A display device comprising:
a semiconductor layer;
a first insulating layer over the semiconductor layer, the first insulating layer comprising a first opening;
a first gate electrode over the first insulating layer;
a second insulating layer over the first gate electrode, the second insulating layer comprising a second opening;
a conductive layer over the first insulating layer;
a wiring over the first insulating layer, the wiring being in contact with the semiconductor layer through the first opening; and
a light-emitting element comprising:
a first electrode over the second insulating layer, the first electrode being in contact with the conductive layer through the second opening;
an electroluminescent layer over the first electrode; and
a second electrode over the electroluminescent layer,
wherein the light-emitting element is configured to emit light and pass the light through the first electrode,
wherein the first gate electrode and the conductive layer comprise the same material, and
wherein the wiring is electrically connected to the first electrode via the conductive layer.

10. The display device according to claim 9, wherein the first electrode is indium oxide comprising tungsten oxide, indium zinc oxide comprising tungsten oxide, indium oxide comprising titanium oxide, or indium tin oxide comprising titanium oxide.

11. The display device according to claim 9, wherein the electroluminescent layer comprises a layer comprising an organic compound and an inorganic compound.

12. The display device according to claim 9, further comprising a second gate electrode under the semiconductor layer.

13. The display device according to claim 9, the wiring is over the conductive layer.

14. The display device according to claim 9, the semiconductor layer comprises silicon.

15. A module comprising the display device according to claim 9 and a flexible printed circuit connected to the display device.

16. An electronic device comprising the module according to claim 15 and at least one selected from the group of a battery, an antenna, an operation switch, an audio output portion and an audio input portion.

17. A display device comprising:
a gate electrode over a substrate;
a conductive layer over the substrate;
a gate insulating layer over the gate electrode and the conductive layer;
a semiconductor layer over the gate insulating layer;
a wiring over the semiconductor layer, the gate insulating layer and the conductive layer, the wiring being in contact with the conductive layer and the semiconductor layer;
a first electrode layer in contact with the conductive layer;
an electroluminescent layer over the first electrode layer; and
a second electrode layer over the electroluminescent layer,
wherein the wiring is electrically connected to the first electrode layer via the conductive layer.

18. The display device according to claim 17, wherein the first electrode layer is indium oxide comprising tungsten oxide, indium zinc oxide comprising tungsten oxide, indium oxide comprising titanium oxide, or indium tin oxide comprising titanium oxide.

19. The display device according to claim 17, wherein the electroluminescent layer comprises a layer comprising an organic compound and an inorganic compound.

20. A module comprising the display device according to claim 17 and a flexible printed circuit connected to the display device.

21. An electronic device comprising the module according to claim 20 and at least one selected from the group of a battery, an antenna, an operation switch, an audio output portion and an audio input portion.

* * * * *

UNITED STATES PATENT AND TRADEMARK OFFICE
CERTIFICATE OF CORRECTION

| | | |
|---|---|---|
| PATENT NO. | : 8,592,861 B2 | Page 1 of 2 |
| APPLICATION NO. | : 13/537408 | |
| DATED | : November 26, 2013 | |
| INVENTOR(S) | : Kengo Akimoto et al. | |

It is certified that error appears in the above-identified patent and that said Letters Patent is hereby corrected as shown below:

In the Specification:

Col. 2, line 51, "layer an the gate" should read --layer and the gate--

Col. 4, line 60, "device according/to the" should read --device according to the--

Col. 6, line 43, "Either dry etching, or wet" should read --Either dry etching or wet--

Col. 6, line 63, "A stacked, structure thereof" should read --A stacked structure thereof--

Col. 9, lines 21-22, "4,4'-bis(N-[4-di(m-tolyl)amino]phenyl-N-phenylamino)bipheny" should read --4,4'-bis(N-[4-di(m-tolyl)amino]phenyl-N-phenylamino)biphenyl--

Col. 9, line 34, "4 to of the periodic table" should read --4 to 12 of the periodic table--

Col. 10, lines 29-30, "3-(4-biphenylyl)-4-phenyl-5-(4-tertbutylphenyl)-1,2,4-tris zole" should read --3-(4-biphenylyl)-4-phenyl-5-(4-tertbutylphenyl)-1,2,4-triazole--

Col. 10, line 35, "typified by $Alg_3$," should read --typified by $Alq_3$--

Col. 11, line 25, "(abbreviation: $Ir(pPY)_2acac$))" should read --(abbreviation: $Ir(ppy)_2acac$))--

Col. 11, line 55, "compound may/also be" should read --compound may also be--

Col. 11, line 58, "TCTA, $Alg_3$, $Almq_3$," should read --TCTA, $Alq_3$, $Almq_3$,--

Col. 11, lines 62-63, "1,3,5-tris[4-(N-carbazolyl)phenylibenzene" should read --1,3,5-tris[4-(N-carbazolyl)phenyl]benzene--

Signed and Sealed this
First Day of April, 2014

Michelle K. Lee
*Deputy Director of the United States Patent and Trademark Office*

CERTIFICATE OF CORRECTION (continued)
U.S. Pat. No. 8,592,861 B2

In the Specification (cont.):

Col. 12, lines 39-40, "material, derivative of" should read --material, a derivative of--

Col. 24, line 16, "using $SiH_4$, and $N_2O$" should read --using $SiH_4$ and $N_2O$--

Col. 33, line 66, "$CF_4$, $SF_6$, $HF_3$," should read --$CF_4$, $SF_6$, $NF_3$,--

Col. 37, line 4, "material, high-molecular" should read --material, a high-molecular--

Col. 47, line 62, "controller 901 generates an ilsync" should read --controller 901 generates an Hsync--

Col. 48, line 66, "defect prevented in the" should read --defect is prevented in the--

Col. 49, line 31, "displayed, can be provide." should read --displayed, can be provided.--